United States Patent
Tsuchi

(10) Patent No.: US 7,508,259 B2
(45) Date of Patent: Mar. 24, 2009

(54) DIFFERENTIAL AMPLIFIER AND DATA DRIVER FOR DISPLAY

(75) Inventor: Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 240 days.

(21) Appl. No.: 11/410,242

(22) Filed: Apr. 25, 2006

(65) Prior Publication Data

US 2006/0238242 A1    Oct. 26, 2006

(30) Foreign Application Priority Data

Apr. 26, 2005    (JP) ............................. 2005-128057

(51) Int. Cl.
*H03F 1/14* (2006.01)
(52) U.S. Cl. .................... 330/51; 330/253; 330/260
(58) Field of Classification Search .................. 330/51, 330/253, 260
See application file for complete search history.

(56) References Cited

U.S. PATENT DOCUMENTS

| | | | | |
|---|---|---|---|---|
| 5,180,932 | A * | 1/1993 | Bengel | 327/362 |
| 5,396,245 | A   | 3/1995 | Rempfer | |
| 5,550,507 | A * | 8/1996 | Horl | 329/361 |
| 6,246,351 | B1  | 6/2001 | Yilmaz | |
| 6,535,189 | B1  | 3/2003 | Akiyama et al. | |
| 7,078,941 | B2 * | 7/2006 | Tsuchi | 327/108 |
| 7,283,082 | B1 * | 10/2007 | Kuyel | 341/155 |
| 2007/0200620 | A1 * | 8/2007 | Iriguchi | 330/9 |

FOREIGN PATENT DOCUMENTS

| | | | |
|---|---|---|---|
| JP | 11-249623 | A | 9/1999 |
| JP | 2001-34234 | A | 2/2001 |
| JP | 2001-343948 | A | 12/2001 |

* cited by examiner

Primary Examiner—Patricia Nguyen
(74) Attorney, Agent, or Firm—Sughrue Mion, PLLC

(57) ABSTRACT

Disclosed is a differential amplifier comprising first and second terminals for receiving signals; a third terminal for outputting a signal; first and second differential pairs, each having an input pair and an output pair, said first and second differential pairs being supplied with currents from current sources associated therewith, respectively; a load circuit connected to output pairs of said first and second differential pairs; an amplifier stage for receiving, as an input, a signal of at least one connection node of a connection node pair of said load circuit and output pairs of said first and second differential pairs, said amplifier stage having an output connected to said third terminal; and a connection switching circuit for controlling the switching between a first connection state in which first and second inputs of the input pair of said first differential pair are connected to said first terminal and said third terminal, respectively, and in which first and second inputs of the input pair of said second differential pair are connected to said second terminal and said third terminal, respectively, and a second connection state in which the first and second inputs of the input pair of said first differential pair are connected to said third terminal and said second terminal, respectively, and in which the first and second inputs of the input pair of said second differential pair are connected to said third terminal and said first terminal, respectively.

22 Claims, 47 Drawing Sheets

FIG.2

| | 1ST TIME PERIOD | 2ND TIME PERIOD |
|---|---|---|
| SWITCHES 121,123,151,153,155,157 | on | off |
| SWITCHES 122,124,152,154,156,158 | off | on |

FIG.4

| | 1ST TIME PERIOD | 2ND TIME PERIOD |
|---|---|---|
| SWITCHES 121,123,161,163,165,167 | on | off |
| SWITCHES 122,124,162,164,166,168 | off | on |

FIG.6

| | 1ST TIME PERIOD | 2ND TIME PERIOD |
|---|---|---|
| SWITCHES 121,123,131,133,135,137 | on | off |
| SWITCHES 122,124,132,134,136,138 | off | on |

FIG.8

| | 1ST TIME PERIOD | 2ND TIME PERIOD |
|---|---|---|
| SWITCHES 121,123,141,143,145,147 | on | off |
| SWITCHES 122,124,142,144,146,148 | off | on |

FIG.10

| OFFSET | +Vf1/2<br>1ST TIME PERIOD | -Vf1/2<br>2ND TIME PERIOD | +Vf2/2<br>3RD TIME PERIOD | -Vf2/2<br>4TH TIME PERIOD |
|---|---|---|---|---|
| SWITCHES 121,123,153,157 | on | off | on | off |
| SWITCHES 122,124,152,156 | off | on | off | on |
| SWITCHES 151,155 | on | off | off | off |
| SWITCHES 154,158 | off | on | off | off |
| SWITCHES 181,185 | off | off | on | off |
| SWITCHES 184,188 | off | off | off | on |

FIG.12

| OFFSET | +Vf1/2<br>1ST TIME PERIOD | -Vf1/2<br>2ND TIME PERIOD | +Vf2/2<br>3RD TIME PERIOD | -Vf2/2<br>4TH TIME PERIOD |
|---|---|---|---|---|
| SWITCHES<br>121,123,151,153,155,157 | on | off | on | off |
| SWITCHES<br>122,124,152,154,156,158 | off | on | off | on |
| SWITCHES<br>171,173 | on | | | off |
| SWITCHES<br>172,174 | off | | | on |

FIG.47

| | N'TH TIME PERIOD | (N+1)ST TIME PERIOD |
|---|---|---|
| DIFFERENTIAL AMPLIFIER OF GROUP 1 | N'TH TIME PERIOD | (N+1)ST TIME PERIOD |
| SWITCHES 121,123,151,153,155,157 | on | off |
| SWITCHES 122,124,152,154,156,158 | off | on |
| DIFFERENTIAL AMPLIFIER OF GROUP 2 | N'TH TIME PERIOD | (N+1)ST TIME PERIOD |
| SWITCHES 121,123,151,153,155,157 | off | on |
| SWITCHES 122,124,152,154,156,158 | on | off |

DIFFERENTIAL AMPLIFIER AND DATA DRIVER FOR DISPLAY

FIELD OF THE INVENTION

This invention relates to a differential amplifier, and a data driver for a display employing the differential amplifier.

BACKGROUND OF THE INVENTION

Liquid crystal display devices (LCDs) characterized by their thin design, light weight and low power consumption have come into widespread use in recent years and are utilized in the display units of mobile devices such as portable telephones (mobile telephones or cellular telephones), PDAs (Personal Digital Assistants) and laptop personal computers. Recently, however, liquid crystal display devices have come to be provided with large-size screens and techniques for dealing with moving pictures have become more advanced, thus making it possible to realize not only mobile applications but also stay-at-home large-screen display devices and large-screen liquid crystal televisions. Liquid crystal display devices that adopts an active matrix drive system and are capable of presenting a high-definition display are being utilized as these liquid crystal displays devices.

Referring first to FIGS. 34A and 34B, a typical configuration of a display of the active matrix driving system will be briefly described. Referring first to FIG. 34A, a display unit 960 of the display of the active matrix driving system comprises a semiconductor substrate on which pixel parts 950 are arranged in the form of a matrix and in which scan lines 961 and data lines 962 are arranged in the form of a grid. In the case of a color SXGA panel, for example, the matrix is composed of 1280×3 pixel columns and 1024 pixel rows. The scan lines 961 and the data lines 962 are connected to a gate driver 970 and to a data driver 980, respectively. The gate driver 970 sends a scan signal to a pixel 950 via a scan line 961, while the data driver 980 sends a gray scale voltage signal, matched to video data, to the pixel 950 via a data line 962. Further, the gate driver 970 and data driver 980 are controlled by a display controller not shown, a required clock CLK, control signals and power-supply voltage, etc., are supplied from the display controller, and video data is supplied from the display controller to the data driver 980. At the present time, video is principally digital data.

In FIG. 34B, the essential portions of the pixel part 950 (for one pixel) in a liquid crystal display are schematically shown by an equivalent circuit. Thus, the pixel part 950 includes a TFT (thin-film transistor) 951, a pixel electrode 952, a liquid crystal (capacitance) 953, and a common electrode 954. The TFT 951 is connected, as a switching device, between the data line 962 and the pixel electrode 952, and has its control end connected to the scan line 961. As for the liquid crystal (capacitance) 953, the liquid crystal, sandwiched between the pixel electrode 952 and the common electrode 954, operates as a capacitance element. The common electrode 954 is formed as a sole transparent electrode on an entire major surface of an opposing substrate, mounted facing the semiconductor substrate. The liquid crystal is sealed in a space between the semiconductor substrate and the opposing substrate.

The scheme for display is briefly as follows: The TFT 951, having the switching function, is on and off controlled by the scan signal. When the TFT 951 is turned on, a gray-scale voltage signal, corresponding to a video data signal, is supplied to the pixel electrode 952. The liquid crystal is varied in its light transmittance by the potential difference between the pixel electrode 952 and the common electrode 954. This potential difference is kept for a preset time period by the liquid crystal (capacitance) 953, to display the image, even after turning off the TFT 951. Meanwhile, a holding capacitor or the like may be provided between the pixel electrode 952 and the common electrode 954 for maintaining the potential in stability.

Rewriting of one screen of data is carried out over one frame (1/60 of a second), every pixel row (every line) is selected sequentially (TFT is sequentially turned on) by each scan line, and a grayscale signal voltage is supplied from each data line within the selection interval.

There is marked interconnection capacitance in the scan line 961 and the data line 962, due to the interconnection resistance proper to the lines, capacitance generated in the intersections, and to the capacitance of the liquid crystal sandwiched between the semiconductor substrate and the counter substrate. Hence, a high driving capability is required of the gate driver 970 and the data driver 980. It is noted that the larger the display size and/or the higher the resolution, the higher is the driving capability needed.

It is sufficient that the gate driver 970 supplies at least binary-scan signals. It is however required of the data driver 980 to drive the data line with a multi-valued gray scale voltage signal corresponding to the number of gray scale levels. Hence, the data driver 980 includes a decoder for converting video data into gray-scale voltage signal, and a digital-to-analog converter (DAC) for amplifying the gray-scale voltage signal and for outputting the so amplified voltage signal to the data line 962.

In color liquid crystal display devices, the number of gray scale levels to be displayed has increased in recent years. Specifically, there is a strong demand for at least 260 thousand colors, with use of six bit video data for each of R, G and B, and even for 26 million and 800 thousand colors, with use of eight bit video data for each of R, G and B.

For this reason, a data driver, outputting gray-scale voltage signal, corresponding to multi-bit video data, is required to output the voltage with extremely high accuracy. On the other hand, the number of devices of the circuit part, processing the video data, and hence the chip area of a data driver LSI, have increased, thus raising the cost.

The configuration in which the chip area of the data driver LSI is suppressed from increasing, despite the use of larger numbers of bits, is disclosed in Patent Document 1, recited below. FIG. 35 hereof corresponds to FIG. 16 of the Patent Document 1, and shows an exemplary configuration of a data driver proposed in the Patent Document 1. Referring to FIG. 35, this data driver includes a latch address selector 981, a latch 982, a gray-scale voltage generator 986, a decoder 987 and an amplifier circuit 988.

The latch address selector 981 decides on the data latching timing, based on a clock signal CLK.

The latch 982 latches digital video data, based on the timing, as determined by the latch address selector 981, and unanimously outputs data to the decoders 987, responsive to an STB signal (strobe signal).

The gray-scale voltage generator 986 generates gray-scale voltages, every two gray scale levels, thereby decreasing the total number of the gray-scale voltage lines of the decoder 987 to approximately one-half of that used conventionally, more specifically, used at the time of filing of the Patent Document 1, recited below.

The decoder 987 selects two gray-scale voltages, responsive to the video data, to output the so selected voltages to the amplifier circuit 988.

The amplifier circuit 988 is able to amplify and output two input gray-scale voltages and a gray-scale voltage which is intermediate between the two gray-scale voltages.

The configuration shown in the Patent Document 1, recited below, is provided with the amplifier circuit 988 which is supplied with two gray-scale voltages to amplify one of the two gray-scale voltages and the intermediate voltage. With this configuration, the number of the gray scale voltage lines of the decoder 987 may be halved to reduce the circuit size of the decoder 987, thereby saving the circuit area and reducing the cost. The result is that the chip area of the data driver LSI may be suppressed from increasing, in order to cope with increase in the number of bits in the video data signals.

As an amplifier, suited for use as an amplifier circuit 988, the configuration shown in FIG. 5(b) of Patent Document 1, recited below, has been proposed. The configuration of FIG. 5(b) of Patent Document 1, in which an output of the differential pair is an input end of a diode-connected current mirror, is thought not to be operating as a differential amplifier. According to analyses by the present inventor, the amplifier circuit 988 may be an amplifier shown at 85-1 of FIG. 15 of Patent Document 3, recited below, although the two differ as to polarity types of the transistors.

On the other hand, the Patent Document 2, recited below, discloses the configuration for realization of the output voltage of the data driver of high accuracy, in order to cope with increase in the number of bits in the video data. In this Patent Document 2, showing a method for driving a liquid crystal display, a video signal voltage plus an offset voltage, and a video signal voltage minus the offset voltage, are alternately output from an amplifier circuit, at preset cycles, to a video signal line (data line), thereby balancing out the increase and the decrease of the luminance of the liquid crystal display caused by such offset.

As an amplifier circuit for implementing the driving method, the Patent Document 2, recited below, discloses an embodiment of a voltage follower circuit. However, area saving cannot be achieved in the amplifier circuit of the voltage follower configuration.

There is proposed in Patent Document 3, recited below, a configuration for implementing the driving method of Patent Document 2 by an amplifier circuit, which receives two gray-scale voltages to output one of the two gray-scale voltages and an intermediate voltage, as proposed in Patent Document 1, recited below.

FIG. 36 shows the configuration of an amplifier circuit of an output unit of the data driver, as proposed in Patent Document 3, recited below. This configuration corresponds to the configuration shown in FIG. 15 of Patent Document 3, recited below. Referring to FIG. 36, this amplifier circuit includes an amplifier 85-1 and a switch circuit 42. In the amplifier 85-1, transistors Q14 and Q13, which constitutes a second differential pair, are connected in parallel with transistors Q11 and Q12, which have sources connected in common, and which constitutes a first differential pair. The first and second differential pairs are driven by a common current source Q1. A current mirror (Q3, Q4) is connected in common, as a load circuit, to output pairs of the first and second differential pairs. The point of common connection of an output end of the current mirror (Q3, Q4) (the drain of transistor Q4) and the transistors Q12 and Q13 is an output of the differential stage, which output is connected to the gate of a transistor amplifier Q5. The gates of the transistors Q12 and Q13 are non-inverting input ends, while the gates of the transistors Q11 and Q14 are inverting input ends. The gates of the transistors Q11 and Q14 of the amplifier 85-1 are connected to an output end OUT. When two gray-scale voltages are supplied to the gates of the transistors Q12 and Q13, an intermediate voltage between the two gray-scale voltages can be output at the output end OUT.

With the amplifier of the above configuration,
in case the two input gray-scale voltages are equal to each other, the output voltage is equal to the input gray-scale voltage and
in case the two input gray-scale voltages are different from each other, the output voltage is intermediate between the two input gray-scale voltages.

That is, the amplifier shown in FIG. 36 is desirable as amplifier circuit 988 of FIG. 33. The amplifier shown in FIG. 36 has also been proposed in FIG. 5 of Patent Document 4 (differential amplifier having two differential pairs), recited below.

With the Patent Document 3, recited below, the connection with regards to the differential input ends of the amplifier 85-1, input terminals IN1 and IN2, receiving the first and second gray-scale voltages, and the output end OUT, is controlled by the switch circuit 42, and a first state in which the gates of the transistors Q12 and Q13 are connected to IN1 and IN2, respectively, and the gates of the transistors Q11 and Q14 are connected to the output end OUT;

a second state in which the gates of the transistors Q12 and Q13 are connected to IN2 and IN1, respectively, and the gates of the transistors Q11 and Q14 are connected to the output end OUT;

a third state in which the gates of the transistors Q11 and Q14 are connected to IN1 and IN2, respectively, and the gates of the transistors Q12 and Q13 are connected to the output end OUT; and a fourth state in which the gates of the transistors Q11 and Q14 are connected to IN2 and IN1, respectively, and the gates of the transistors Q12 and Q13 are connected to the output end OUT;

are changed over at a predetermined terminal.

It is stated that, by periodically changing over between these four states, output offsets ascribable to the threshold variations of the transistors making up the amplifier 85-1 may be time-averaged and thereby canceled.

However, it may be surmised that, in the third and fourth states, no desired voltages can be output correctly, because two gray-scale voltages are supplied to the inverting input ends. It may be surmised that, in FIG. 36, the output offset may be canceled to a certain extent in case of switching between the first and second states.

There is also proposed in Patent Document 5, recited below, a configuration higher in performance than the amplifier 85-1 of FIG. 36. The configuration disclosed in this Patent Document 5 is an improvement over the configuration of Patent Document 4, in particular an improvement in the performance of output voltage accuracy.

FIG. 38 shows the configuration of an amplifier having plural differential pairs, as proposed in the Patent Document 5. In FIG. 38, the number of the differential pairs is selected to be two for comparison to the case of the amplifier 85-1.

Referring to FIG. 38, this amplifier includes transistors Q1A and Q1B, as a second differentia pair, connected in parallel with transistors Q0A and Q0B, forming a first differential pair. The first and second differential pairs are driven by separate current sources Q10 and Q11, respectively. Output pairs of the first and second differential pairs are connected to a current mirror (QL1, QL2) as a load circuit. A differential amplifier 209 is connected between an output pair of the current mirror (QL1, QL2) and an output terminal 3. The output pair of the current mirror (QL1, QL2) is connected to an inverting input end (−) and a non-inverting end (+) of the differential amplifier 209. An output end of the differential amplifier 209 is connected to the output terminal. The gates of the transistors Q0B and Q1B are connected to the output terminal 3. Two gray-scale voltages IN1 and IN2 are supplied to the gates of the transistors Q0A and Q1A, respectively.

Similarly to the amplifier 85-1 of FIG. 36, the amplifier of FIG. 38 is able to output a voltage intermediate between the two input gray-scale voltages IN1 and IN2. The amplifier of FIG. 38 differs appreciably from the amplifier 85-1 of FIG. 36 in such respects that current sources for driving the two differential pairs are discretized, whereby the amplifier of FIG. 38 may be improved appreciably in output voltage accuracy.

It is noted that, in the amplifiers of FIGS. 36 and 38, amplifier stage components (the amplifier transistor Q5 of the amplifier 85-1 of FIG. 36 and the differential amplifier 209 of FIG. 38) are among a number of variations of different configurations which may be interchanged with each other.

[Patent Document 1]
JP Patent Kokai Publication No. JP-P2001-34234A (FIGS. 5 and 16)

[Patent Document 2]
JP Patent Kokai Publication No. JP-A-11-249623A

[Patent Document 3]
JP Patent Kokai Publication No. JP-P2001-343948A (FIG. 15)

[Patent Document 4]
U.S. Pat. No. 5,396,425 (FIG. 5)

[Patent Document 5]
U.S. Pat. No. 6,246,351B1 (FIG. 2)

SUMMARY OF THE DISCLOSURE

It has been pointed out that the amplifier 85-1, shown in FIG. 36, suffers from the problem (first problem) that, if, in the first or second state, an intermediate voltage between the two input gray-scale voltages is output, and there is a marked voltage difference between the two input values, the output voltage is not an intermediate voltage, but is offset to one or the other of the two input voltages (see the description on page 13 of Patent Document 1, paragraph [0113]).

The present inventor has conducted researches regarding characteristics of the amplifier 85-1 of FIG. 36, disclosed e.g. in Patent Document 2, and the problem proper to the amplifier 85-1. The results of the researches conducted are described hereinbelow.

FIG. 37 is a graph showing the operation in which, in the aforementioned first or second state, the amplifier 85-1 of FIG. 36 outputs the intermediate voltage Vout which is intermediate between the two gray-scale voltages IN1 and IN2. In the following description, reference is to be made to FIGS. 36 and 37.

It is assumed that the transistors of the two differential pairs (Q11, Q12) and (Q13, Q14) of the amplifier 85-1 are of the same size. The currents at the transistors Q11, Q12, Q13 and Q14 are designated by I11, I12, I13 and I14, respectively. FIG. 37 shows a case where the values of the voltages IN1 and IN2 are related with each other by IN1<IN2. The graph of FIG. 37 shows the relationship between the absolute values of the drain-to-source current Ids (ordinate) and the gate voltage V of the transistors of the differential pairs (abscissa). Specifically, the figure shows a characteristic curve of the transistors Q11 to Q14 (|Ids|-Vg characteristics).

The two differential pairs have sources connected in common, with the respective transistors being of the same size. Consequently, the transistors of the two differential pairs have operation points on the common characteristic curve shown in FIG. 37.

Since the input and output currents of the current mirror (Q3, Q4) are equal to each other, the currents at the respective transistors of the two differential pairs satisfy the following equation:

$$I11+I14=I12+I13$$

Moreover, since the transistors Q11 and Q14 have sources and drains connected in common, while having gates connected in common and to the output end OUT, the currents flowing therethrough are equal.

Hence, we obtain the following equation:

$$I11=I14$$

From the above two equations, the currents I11 and I14 are each equal to bisection of the sum of the currents I12 and I13, with the corresponding voltage being Vout.

The characteristic curve of the transistor is approximately a quadratic curve. Thus, as may be seen from FIG. 37, the characteristic curve may be approximated to a straight line when the voltage difference between the voltages IN1 an IN2 is small. Hence, the voltage Vout is of a value bisecting the voltages IN1 an IN2 (intermediate voltage).

However, as the voltage difference between the voltages IN1 an IN2 are increased, the voltage Vout is shifted towards the low potential side voltage IN1.

Thus, with the amplifier 85-1 of FIG. 36, a high accuracy output of the intermediate voltage between the two gray-scale voltages can be obtained only when the voltage difference between the two input voltages is extremely small, even in the absence of variations in the transistor threshold values.

On the other hand, in a data driver for driving a liquid crystal display, the gray scale voltage is determined responsive to transmittance characteristics of the liquid crystal. It is well known that in general, the voltage difference between gray scale levels is larger in a low-order or high-order gray scale level, while becoming smaller near the intermediate gray scale level.

Hence, if the amplifier 85-1 of FIG. 36 is used as a data driver of FIG. 35, the number of the gray scale voltage lines of the decoder 987 can be reduced only near the intermediate tone, and hence the area saving effect is limited.

The present inventor also has conducted researches regarding characteristics and problems of the amplifier of FIG. 38, disclosed in e.g. the Patent Document 5. The results of the researches will now be described.

The graph of FIG. 39 illustrates the operation in case the amplifier of FIG. 38 outputs the intermediate voltage of two gray-scale voltages IN1 and IN2 as VOUT. Reference is now made to FIG. 39 for explanation. It is assumed that the transistors of the two differential pairs (Q0A, Q0B) and (Q1A, Q1B) are all of the same size and that the currents flowing through the current sources QI0 and QI1 are equal to each other.

Similarly to FIG. 37, FIG. 39 shows characteristic curves (|Ids|-Vg characteristics) of the transistors Q0A, Q0B, Q1A and Q1B. The transistors Q0A and Q0B are represented by a characteristic curve A and the transistors Q1A and Q1B are represented by a characteristic curve B. The operation points of the respective transistors are on the respective characteristic curves. Meanwhile, the two characteristic curves are simply shifted along the abscissa by the respective source potentials of the two differential pairs being changed independently of each other.

If the currents corresponding to the operation points P0A, P0B, P1A and P1B of the transistors Q0A, Q0B, Q1A and Q1B are designated by I0A, I0B, I1A and I1B, respectively, we obtain the following equations (1) and (2):

$$I0A+I0B=I1A+I1B \quad (1)$$

$$I0A+I1A=I0B+I1B \quad (2)$$

as the relationship for the currents of the respective transistors in FIG. 38.

It is noted that the equation (1) is derived from the fact that the currents flowing through the current sources QI0 and QI1 are equal to each other, and that the equation (2) is derived from the fact that the input currents and the output currents of the current mirror (QL1, QL2) are equal to each other.

Solving the above equations, the following equation (3) is derived.

$$I0A=I1B, I1A=I0B \quad (3)$$

From the equation (3), four operation points P0A, P0B, P1A and P1B are determined as shown in FIG. 39. The operation points P0B and P1B of the transistors Q0B and Q1B have Vout in common on the abscissa V of FIG. 39. Thus, a figure obtained on interconnecting these four operation points becomes a parallelogram, with a line segment P0A·P1B being equal to a line segment P0B·P1A. Hence, the output voltage Vout is intermediate between the voltages IN1 and IN2. Meanwhile, the operation shown in FIG. 39 persists even when the voltage difference between the two voltages IN1 and IN2 is increased, so that the output is higher in accuracy than with the amplifier 85-1 of FIG. 36.

However, if the amplifier of FIG. 38 has variations in the thresholds of transistors or in the inclination of the characteristic curves, there is presented a problem that the output offset is increased such that an output to high voltage accuracy cannot be obtained. In particular, there is also presented a problem that the larger the differential voltage of the two input voltages, the larger becomes the output offset, as ascertained by the researches by the present inventor.

Consequently, the amplifier of FIG. 38 cannot directly be applied to for example the amplifier circuit 988 of the data driver of FIG. 35.

Accordingly, it is an object of the present invention to provide a differential amplifier capable of outputting an output voltage with high accuracy even if there is a large voltage difference between two input voltages.

It is another object of the present invention to provide a differential amplifier for effectively canceling an output offset ascribable to variations in transistor characteristics, by time averaging.

It is a further object of the present invention to provide an area-saving data driver provided with the differential amplifier of the present invention and which is capable of reducing the number of circuit elements in the decoder even for low-order or high-order gray scale levels with a large voltage differential between the gray scale levels.

It is a further object of the present invention to provide a display which not only reduces cost but which enables the frame width to be reduced in mounting the data driver.

The above and other objects are attained by the present invention configured substantially as follows:

A differential amplifier according to the present invention comprises:

first and second terminals each receiving a signal;

a third terminal for outputting a signal;

first and second differential pairs, each having an input pair and an output pair, the first and second differential pairs being supplied with currents from current sources associated therewith, respectively;

a load circuit connected to the output pairs of the first and second differential pairs;

an amplifier stage receiving, as an input, a signal at least one connection node of a connection node pair of the load circuit and the output pairs of the first and second differential pairs, and having an output connected to the third terminal; and a connection switching circuit for controlling the switching between a first connection state and a second connection state, wherein the first connection state is such a state in which first and second inputs of the input pair of the first differential pair are connected to the first terminal and the third terminal, respectively, and in which first and second inputs of the input pair of the second differential pair are connected to the second terminal and the third terminal, respectively, while the second connection state is such a state in which the first and second inputs of the input pair of the first differential pair are connected to the third terminal and the second terminal, respectively, and in which the first and second inputs of the input pair of the second differential pair are connected to the third terminal and the first terminal, respectively.

A differential amplifier according to the present invention comprises:

first and second terminals each receiving a signal;

a third terminal for outputting a signal;

first and second differential pairs, each having an input pair and an output pair, the first and second differential pairs being supplied with currents from current sources associated therewith, respectively;

a load circuit connected to the output pairs of the first and second differential pairs;

an amplifier stage receiving, as an input, a signal at least one connection node of a connection node pair of the load circuit and the output pairs of the first and second differential pairs, and having an output connected to the third terminal; and a connection switching circuit for controlling the switching between a first connection state and a second connection state, wherein the first connection state is such a state in which first and second inputs of the input pair of the first differential pair are connected to the first terminal and the third terminal, respectively, and in which first and second inputs of the input pair of the second differential pair are connected to the second terminal and the third terminal, respectively, while the second connection state is such a state in which the first and second inputs of the input pair of the first differential pair are connected to the third terminal and the first terminal, respectively, and in which the first and second inputs of the input pair of the second differential pair are connected to the third terminal and the second terminal, respectively.

The present invention may comprise the following configuration. It is noted that reference numerals in parentheses are for clarifying the configuration of the invention and are not intended for limiting the invention.

A differential amplifier in accordance with a first aspect of the present invention (embodiments of FIGS. 1 and 3 where the second differential amplifier of FIG. 1 corresponds to the first differential pair of FIG. 3) comprises:

first and second terminals (T1, T2) each receiving a signal voltage;

a third terminal (3) for outputting an output signal;

first and second differential pairs, driven respectively by first and second current sources, having one ends connected to a first power supply, and a current to voltage converter, connected between output pairs of the first and second differential pairs and a second power supply to combine output currents of the first and second differential pairs to output a voltage corresponding to a combined current;

an amplifier circuit (109) connected between an output end of the current to voltage converter and the third terminal, outputting the output signal (Vout); and a connection switching circuit for alternately switching between a first connection state and a second connection state, wherein the first connection state is such a state in which first and second inputs of an input pair of the first differential pair are connected to the first terminal and the third terminal, respectively, and in which first and second inputs of an input pair of the second differential pair are connected to the second terminal and the third terminal, respectively, while the second connection state is such a state in which the first and second inputs of the input pair of the first differential pair are connected to the third terminal and the second terminal, respectively, and in which the first and second inputs of the input pair of the second differential pair are connected to the third terminal and the first terminal, respectively.

According to the present invention, the connection switching circuit includes:

first and second switches connected between the first input of the input pair of the first differential pair and the first terminal and between the first input and the third terminal, respectively;

third and fourth switches connected between the second input of the input pair of the first differential pair and the third terminal and between the second input and the second terminal, respectively;

fifth and sixth switches connected between the first input of the input pair of the second differential pair and the second terminal and between the first input and the third terminal, respectively; and seventh and eighth switches connected between the second input of the input pair of the second differential pair and the third terminal and between the second input and the first terminal, respectively.

Preferably, in the present invention, in the first connection state, the first, third, fifth and seventh switches are in an on state and the second, fourth, sixth and eighth switches are in an off state and in the second connection state, the first, third, fifth and seventh switches are in an off state and the second, fourth, sixth and eighth switches are in an on state.

A differential amplifier in accordance with a second aspect of the present invention (shown common in FIGS. 5 and 7, where the second differential pair of FIG. 5 corresponds to the first differential pair of FIG. 7) comprises:

first and second terminals (T1, T2) each receiving a signal voltage, a third terminal (3) outputting an output signal;

first and second differential pairs, driven respectively by first and second current sources, having one ends connected to a first power supply;

a current to voltage converter, connected between output pairs of the first and second differential pairs and a second power supply to combine output currents of the first and second differential pairs to output a voltage corresponding to the combined current;

an amplifier circuit (109) connected between an output end of the current to voltage converter and the third terminal; and a connection switching circuit for controlling the switching between a first connection state and a second connection state, wherein the first connection state is such a state in which first and second inputs of an input pair of the first differential pair are connected to the first terminal and to the third terminal, respectively, and in which first and second inputs of an input pair of the second differential pair are connected to the second terminal and the third terminal, respectively, while the second connection state is such a state in which the first and the second inputs of the input pair of the first differential pair are connected to the third terminal and to the first terminal, respectively, and in which the first and the second inputs of the input pair of the second differential pair are connected to the third terminal and the second terminal, respectively.

According to the present invention, the connection switching circuit includes:

first and second switches connected between the first input of the input pair of the first differential pair and the first terminal and between the first input and the third terminal, respectively;

third and fourth switches connected between the second input of the input pair of the first differential pair and the third terminal and between the second input and the first terminal, respectively;

fifth and sixth switches connected between the first input of the input pair of the second differential pair and the second terminal and between the first input and the third terminal, respectively; and seventh and eighth switches connected between the second input of the input pair of the second differential pair and the third terminal and between the second input and the second terminal, respectively.

Preferably, in the present invention, in the first connection state, the first, third, fifth and seventh switches are in an on state and the second, fourth, sixth and eighth switches are in an off state and, in the second connection state, the first, third, fifth and seventh switches are in an off state and the second, fourth, sixth and eighth switches are in an on state.

In accordance with a third aspect of the present invention, a differential amplifier (FIGS. 9 and 11) includes:

first and second terminals (T1, T2), each receiving a signal voltage;

a third terminal (3) outputting an output signal;

first and second differential pairs, driven respectively by first and second current sources, each having one end connected to a first power supply;

a current to voltage converter, connected between output pairs of the first and second differential pairs and a second power supply and adapted for combining output currents of the first and second differential pairs to issue a voltage corresponding to the so combined current;

an amplifier circuit (109) connected between an output end of the current to voltage converter and the third terminal (3) outputting the output signal (Vout); and a connection switching circuit for switching between first to fourth connection state, wherein the first connection state is such a state in which first and second inputs of an input pair of the first differential pair are connected to the first and third terminals, respectively, and in which first and the second inputs of an input pair of the second differential pair are connected to the second and third terminals, respectively, the second connection state is such a state in which the first and the second inputs of the input pair of the first differential pair are connected to the third and second terminals, respectively, and in which the first and the second inputs of the input pair of the second differential pair are connected to the third and first terminals, respectively, the third connection state is such a state in which the first and the second inputs of the input pair of the first differential pair are connected to the second and third terminals, respectively, and in which the first and the second inputs of the input pair of the second differential pair are connected to the first and third terminals, respectively, and the fourth connection state is such a state in which the first and the second inputs of the input pair of the first differential pair are connected to the third and first terminals, respectively, and in which the first and the second inputs of the input pair of the second differential pair are connected to the third and second terminals, respectively.

According to the present invention, the connection switching circuit includes:

first, second and third switches connected between the first input of the input pair of the first differential pair and the first terminal, between the first input and the second terminal and between the first input and the third terminal, respectively;

fourth, fifth and sixth switches connected between the second input of the input pair of the first differential pair and the first terminal, between the second input and the second terminal and between the second input and the third terminal, respectively;

seventh, eighth and ninth connected between the first input of the input pair of the second differential pair and the first terminal, between the first input and the second terminal and between the first input and the third terminal, respectively; and tenth, eleventh and twelfth switches connected between the second input of the input pair of the second differential pair and the first terminal, between the second input and the second terminal and between the second input and the third terminal, respectively.

Preferably, in the present invention, in the first connection state, the first, sixth, eighth and twelfth switches are in an on state, with the remaining switches being turned off;

in the second connection state, the third, fifth, ninth and tenth switches are in an on state, with the remaining switches being turned off;

in the third connection state, the second, sixth, seventh and twelfth switches are in an on state, with the remaining switches being turned off; and in the fourth connection state, the third, fourth, ninth and eleventh switches are in an on state, with the remaining switches being turned off.

The differential amplifier in a fourth aspect of the present invention (FIG. 11) may further comprise an input switching circuit (170) for switching between two signal voltages supplied to the first and second terminals of the differential amplifier.

The differential amplifier in the first or second aspect of the present invention may have the first and second current sources formed by a common current source.

A data driver in another aspect of the present invention, driving a data line based on an input digital data signal, is provided with the above-described differential amplifier.

According to the present invention, the data driver includes:

a plurality of said differential amplifiers driving a plurality of said data lines, and a connection switching signal for controlling each of the connection switching circuits of said differential amplifiers; wherein said differential amplifiers are divided into first and second groups; and wherein when the first group of said differential amplifiers is controlled to said first connection state, said connection switching signal controls the second group of said differential amplifiers to said second connection state; and wherein when the first group of said differential amplifiers is controlled to said second connection state, said connection switching signal controls the second group of said differential amplifiers to said first connection state.

A display in another aspect of the present invention includes a data driver provided with the above-described differential amplifier, and a display panel. The data lines of the display panel are driven by output signals of the data driver.

A display in accordance with another aspect of the present invention, includes:

a plurality of data lines extending parallel to one another in one direction;

a plurality of scan lines extending parallel to one another in a direction orthogonal to said one direction;

a plurality of pixel electrodes arranged in a matrix pattern at points of intersection of said data lines and said scan lines;

a plurality of transistors provided in a one-for-one relationship with respect to said plural pixel electrodes so that first ends of the drains and the sources of the transistors are connected to the pixel electrodes and second ends of the drains and the sources of the transistors are connected to said data lines associated therewith, with the gates of the transistors being connected to said scan lines;

a gate driver for supplying scan signals to said scan lines; and a data driver for supplying gray-scale signals, associated with input data, to said data lines. The data driver is the aforementioned data driver for the display.

In accordance with another aspect of the present invention, there is provided a differential amplifier including:

first and second signals, an output terminal outputting an output signal;

first and second differential pairs, each having an input pair and an output pair, said first and second differential pairs being supplied with currents from current sources associated therewith, respectively;

a load circuit connected to the output pairs of said first and second differential pairs;

an amplifier stage receiving, as an input, a signal at least a connection node of a connection node pair of the load circuit and the output pairs of the first and second differential pairs, and having an output connected to the output terminal; and a switching circuit controls the switching between a first state and a second state, wherein the first state is such a one in which the first signal and the output signal are coupled to first and second inputs of the input pair of the first differential pair and in which the second signal and the output signal are coupled to the first and second inputs of the input pair of the second differential pair, and wherein the second state is such a one in which the output signal and the second signal are coupled to the first and second inputs of the input pair of the first differential pair and in which the output signal and the first signal are coupled to the first and second inputs of the input pair of the second differential pair.

The first state may be such a one in which the first signal and the output signal are coupled to the first and second inputs of the input pair of the first differential pair and in which the second signal and the output signal are coupled to the first and second inputs of the input pair of the second differential pair and the second state may be such a one in which the output signal and the first signal are coupled to the first and second inputs of the input pair of the first differential pair and in which the output signal and the second signal are coupled to the first and second inputs of the input pair of the second differential pair.

The meritorious effects of the present invention are summarized as follows.

According to the present invention, an output voltage may be output with high accuracy even if the voltage difference between two input voltages has been enlarged.

According to the present invention, the output offset, ascribable to variations in transistor characteristics, may be effectively canceled out by time averaging.

Moreover, according to the present invention, employing differential amplifiers, the number of devices in a decoder may be reduced, even for a low gray scale level or a high gray scale level, where there is marked voltage difference between the gray scale levels, thereby providing an area-saving data driver.

Furthermore, according to the present invention, an area-saving inexpensive data driver may be used in a display to reduce not only the cost but also the display frame width in mounting the data driver.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2 is a diagram for illustrating a method for on/off control of switches for the differential amplifier of FIG. 1.

FIG. 4 is a diagram for illustrating a method for on/off control of switches for the differential amplifier of FIG. 3.

FIG. 6 is a diagram for illustrating a method for on/off control of switches for the differential amplifier of FIG. 5.

FIG. 8 is a diagram for illustrating a method for on/off control of switches for the differential amplifier of FIG. 7.

FIG. 10 is a diagram for illustrating a method for on/off control of switches for the differential amplifier of FIG. 9.

FIG. 12 is a diagram for illustrating a method for on/off control of switches for the differential amplifier of FIG. 11.

FIG. 47 is a diagram showing a method for on/off control of respective switches of the differential amplifier of FIG. 1 as applied to a data driver.

PREFERRED EMBODIMENTS OF THE INVENTION

Figure 1:
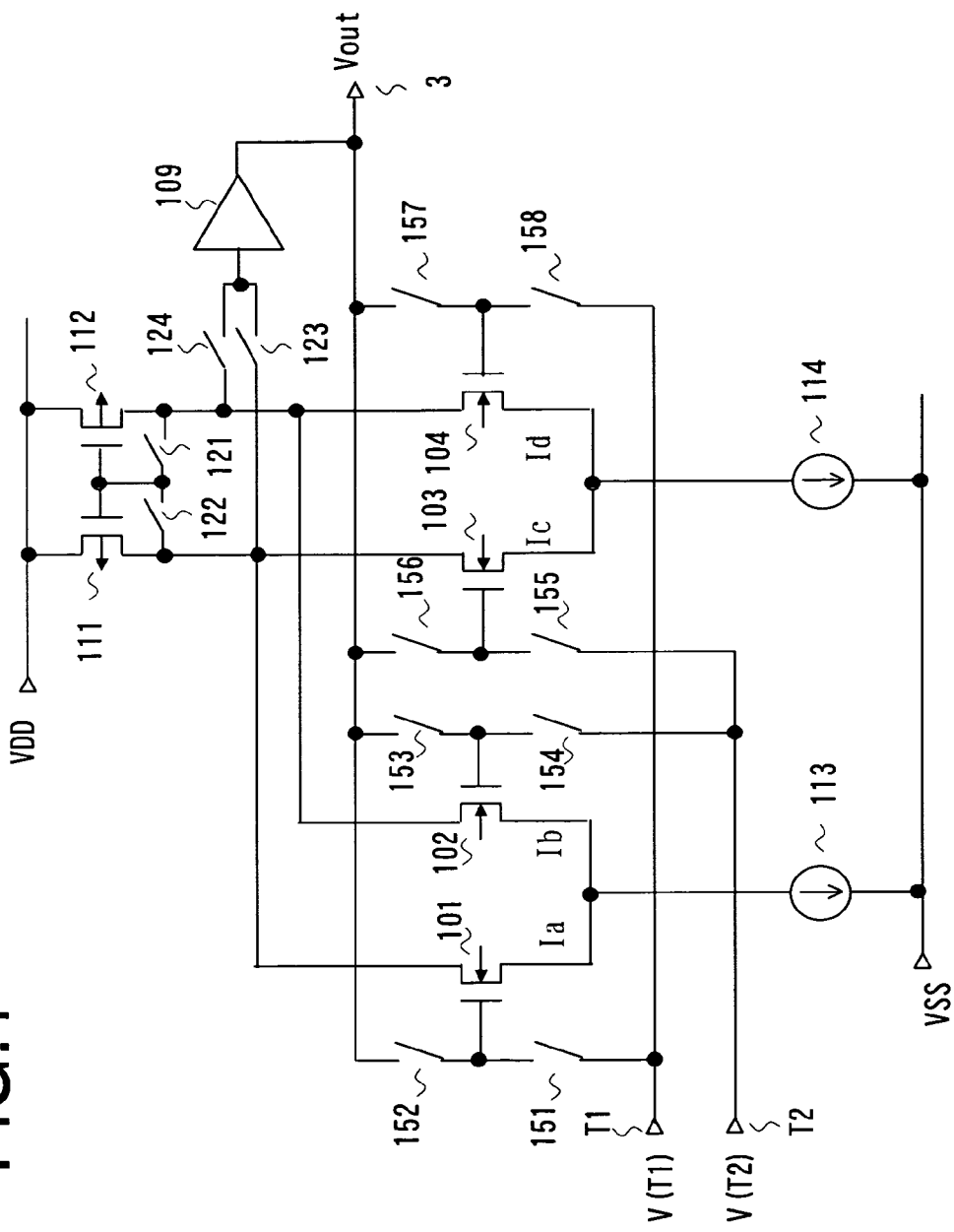
FIG. 1 is a diagram showing a differential amplifier according to a first embodiment of the present invention.

The best mode for carrying out the present invention will now be described. FIG. 1 shows a differential amplifier according to a first embodiment of the present invention.

Referring to FIG. 1, the differential amplifier of the present embodiment includes:

n-channel transistors 101 and 102, as a first differential pair, which have their sources coupled together;

n-channel transistors 103 and 104, as a second differential pair, which have their sources coupled together;

a constant current source 113, which is connected between the common sources of the first differential pair (101, 102) and a low-voltage power supply VSS;

a constant current source 114, which is connected between the common sources of the second differential pair (103, 104) and the low-voltage power supply VSS;

p-channel transistors 111 and 112, which have their drains connected to common connection nodes of an output pair of the first differential pair (101, 102) and an output pair of the second differential pair (103, 104), which have their sources connected to a high-voltage power supply VDD and which have their gates coupled together, and an amplifier stage 109.

The differential amplifier further includes:

a switch 151 which is connected between the terminal T1 and the gate of the n-channel transistor 101;

a switch 152 which is connected between the gate of the n-channel transistor 101 and the output terminal 3;

a switch 154 which is connected between the terminal T2 and the gate of the n-channel transistor 102;

a switch 153 which is connected the gate of the n-channel transistor 102 and the output terminal 3;

a switch 155 which is connected between the terminal T2 and the gate of the n-channel transistor 103;

a switch 156 which is connected between the gate of the n-channel transistor 103 and the output terminal 3;

a switch 158 connected between the terminal T1 and the gate of the n-channel transistor 104; and a switch 157 which is connected between the gate of the n-channel transistor 104 and the output terminal 3.

The differential amplifier also includes:

a switch 121 which is connected between the gate and the drain of the p-channel transistor 112;

a switch 122 which is connected between the gate and the drain of the p-channel transistor 111;

a switch 123 which is connected between a connection node of the drain of the n-channel transistor 101, the drain of the n-channel transistor 103 and the drain of the p-channel transistor 111, and the input terminal of the amplifier stage 109; and a switch 124 connected between a connection node of the drain of the n-channel transistor 102, the drain of the n-channel transistor 104 and the drain of the p-channel transistor 112, and the input terminal of the amplifier stage 109.

FIG. 2 is a diagram illustrating the on/off control method for the switches 121 to 124 and 151 to 158 of the differential amplifier of FIG. 1. The first and second time periods are changed over at a preset cycle.

Figure 13:
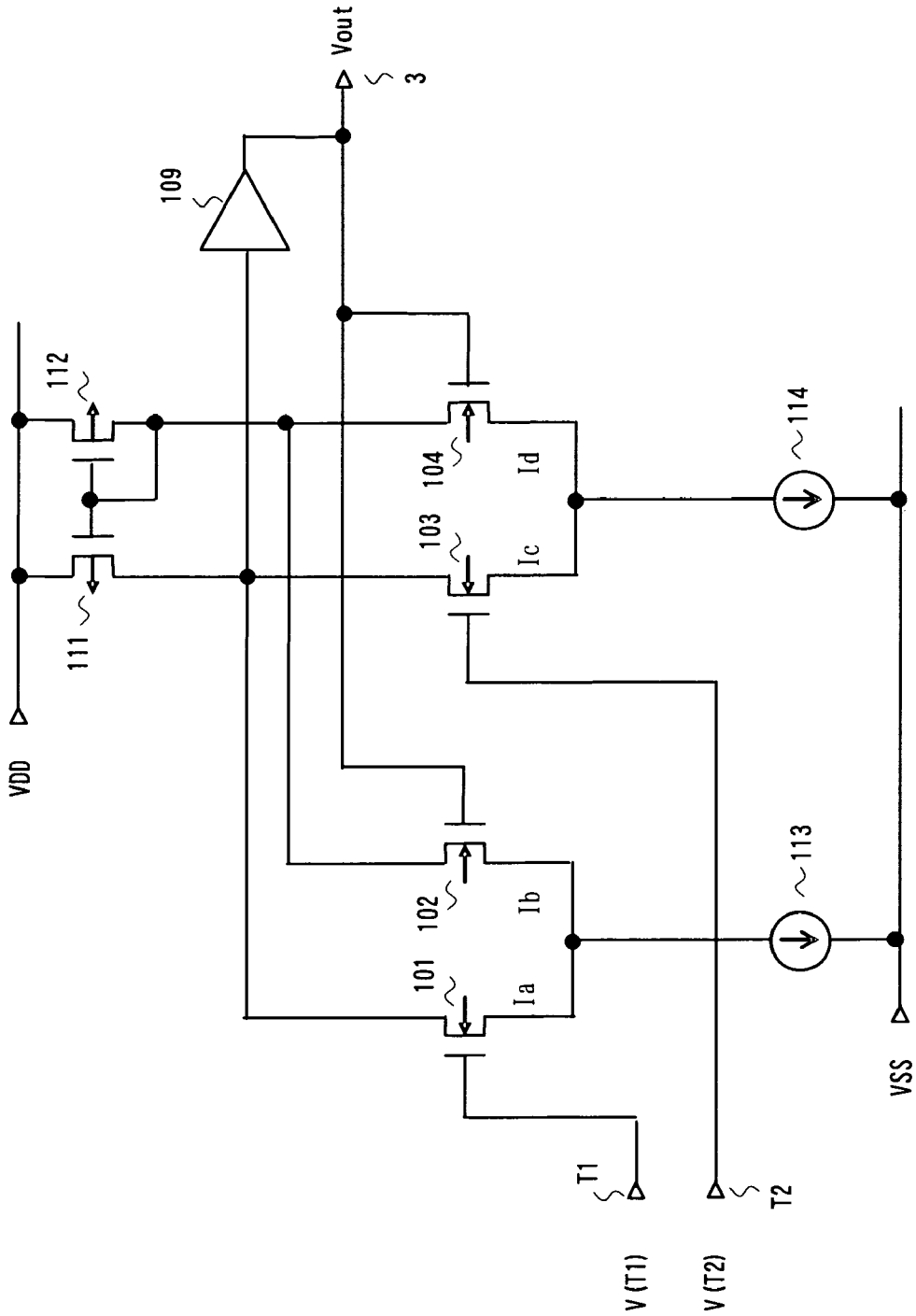
FIG. 13 shows an equivalent circuit of differential amplifiers of FIGS. 1 and 5 during the first time period of FIGS. 2 and 6.
Figure 14:
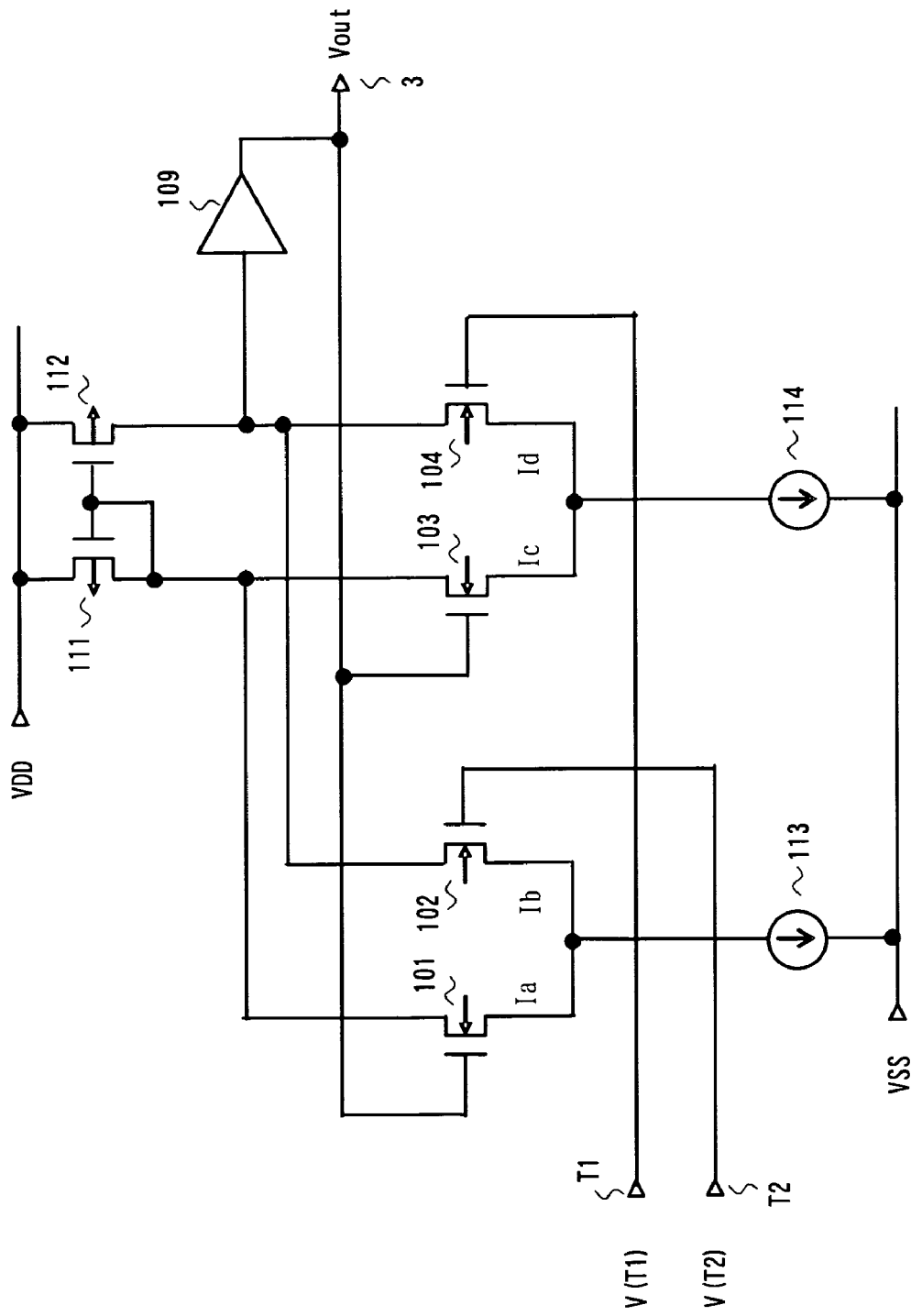
FIG. 14 shows an equivalent circuit of differential amplifiers of FIGS. 1 and 7 during the second time period of FIGS. 2 and 8.

The differential amplifier during the first time period and that during the second time period in FIG. 2 are of the configurations shown by equivalent circuits of FIGS. 13 and 14, respectively.

That is, if, during the first time period of FIG. 2, the switches 121, 123, 151, 153, 155 and 157 are in an on state, and the switches 122, 124, 152, 154, 156 and 158 are in an off state, the differential amplifier is of the configuration shown by the equivalent circuit of FIG. 13. In this case, the gates of transistors 101 and 102 of the first differential pair (non-inverting input and inverting input) are connected to the terminal T1 and to the output terminal 3, respectively. The gates of the transistors 103 and 104 of the second differential pair (non-inverting input and inverting input) are connected to the terminal T2 and to the output terminal 3, respectively. Of the transistors 111 and 112, constituting the current mirror, the transistor 112 forms an input side of the current mirror, and has a gate and a drain connected together and connected to a connection node of the drains of the transistors 102 and 104. The transistor 111 on the output side of the current mirror has a drain connected to a connection node of the drains of the transistors 101 and 103 and to an input end of the amplifier stage 109.

That is, the configuration in which, during the second time period of FIG. 2, the switches 121, 123, 151, 153, 155 and 157 are in an off state and the switches 122, 124, 152, 154, 156 and 158 are in an on state, is the equivalent circuit of FIG. 14. At this time, the gates of the transistors of the first differential pair (101, 102) are connected to the output terminal 3 and to the input terminal T2, respectively, and the gates of the transistors 103 and 104 of the second differential pair (inverting input and non-inverting input) are connected to the output terminal 3 and to the terminal T1, respectively. Of the transistors 111 and 112, which constitutes the current mirror, the transistor 111, forming an input side, has a gate and a drain connected together and to a connection node of the drains of the transistors 101 and 103. The transistor 112, forming an output side of the current mirror, has a drain connected to a connection node of the drains of the transistors 102 and 104 and to an input end of the amplifier stage 109. The difference between the configurations of FIGS. 13 and 14 resides in the inverting input and the non-inverting input of the input pairs of the first and second differential pairs having been interchanged and in the output node of the first and second differential pair (output of the current mirror) having been changed from the drain of the transistor 111 to the drain of the transistor 112.

FIGS. 13 and 14 show two differential amplifiers, which have first inputs of the input pairs connected to terminals T1 and T2, respectively, and have second inputs of the input pairs connected in common to the output terminal 3. When the transistors of the two differential pairs are of the same characteristics, the differential amplifier is able to amplify and output a voltage interiorly dividing the voltages V(T1) and V(T2) at the two terminals T1 and T2 by a ratio of 1:1 (an intermediate voltage between voltages V(T1) and V(T2)).

Figure 38:
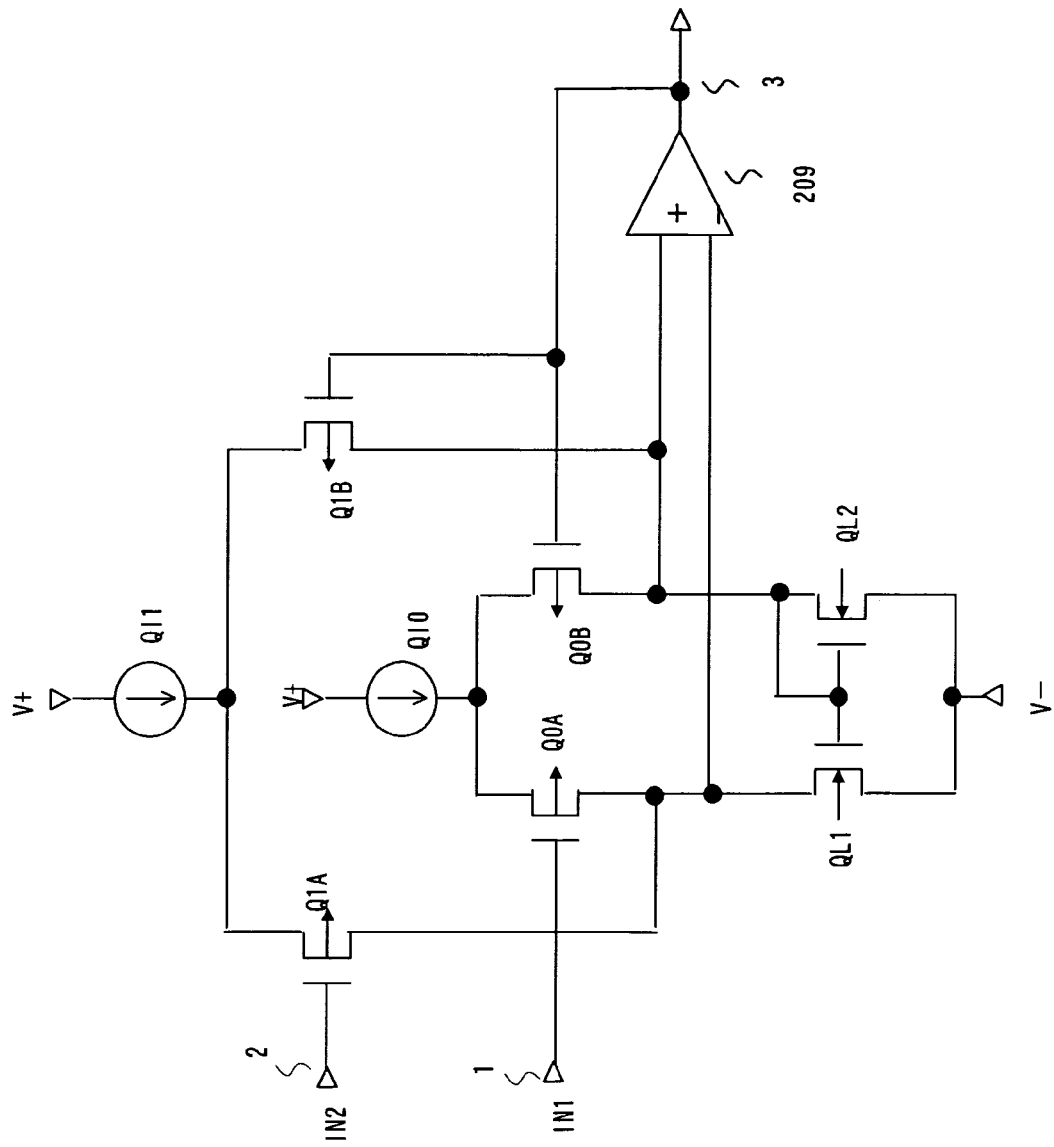
FIG. 38 is a diagram showing the configuration of an amplifier having plural differential pairs as proposed in Patent Document 4.

This configuration corresponds to the amplifier of FIG. 38 where the polarities of the transistors are interchanged and the differential amplifier 209 is replaced by an amplifier stage 109.

Meanwhile, FIGS. 13 and 14 become equivalent to each other when the first and second differential pairs (101, 102) and (103, 104) are transistors of the same characteristics free of variations. In this case, the output voltage Vout is expressed by the following equation:

$$Vout=\{V(T1)+V(T2)\}/2 \qquad (4)$$

However, if there are variations in the transistor characteristics, the operation of FIG. 13 differs from that of FIG. 14.

The variations in the transistor characteristics are generated due to, for example, a semiconductor fabrication process, and give rise to transistor threshold variations and inclination variations of transistor characteristic curve.

Figure 37:
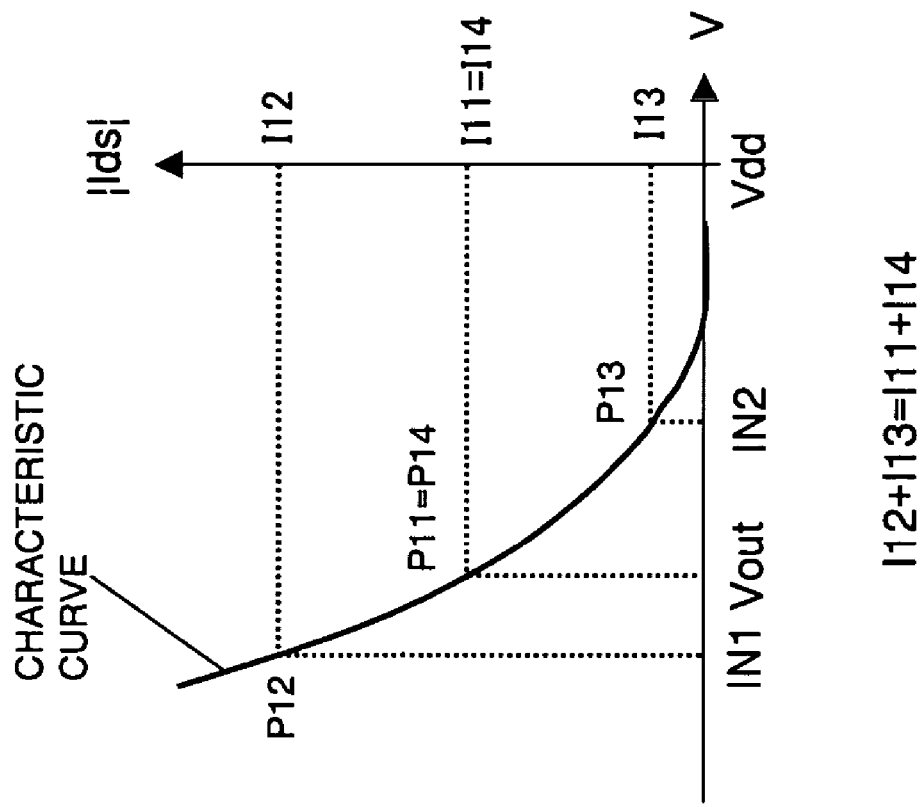
FIG. 37 is a graph for illustrating the operation in case an amplifier 85-1 of FIG. 36 outputs an intermediate voltage of two gray scale voltages IN1 and IN2 as Vout in the first or second state.

The operation of canceling out an output offset ascribable to the transistor threshold variations will now be described. For simplicity of description, the operation for a case where the threshold of the transistor 104, out of the first and second differential pairs (101, 102) and (103, 104), has become deviated from those of the other transistors will be described. It is assumed that there are no variations between the currents at the current sources 113 and 114 or in the current mirror (111, 112). In the following description, as in the description for FIGS. 37 and 39, the operation will be described using the graph showing the relationship between the drain-to-source current Ids and the gate voltage V. The operation points of the transistors 101 and 102, 103 and 104 are designated by a, b, c and d, respectively, and the currents (drain-to-source currents) at the respective operation points are designated by Ia, Ib, Ic and Id, respectively, with $V(T1) \geqq V(T2)$.

Figure 17:
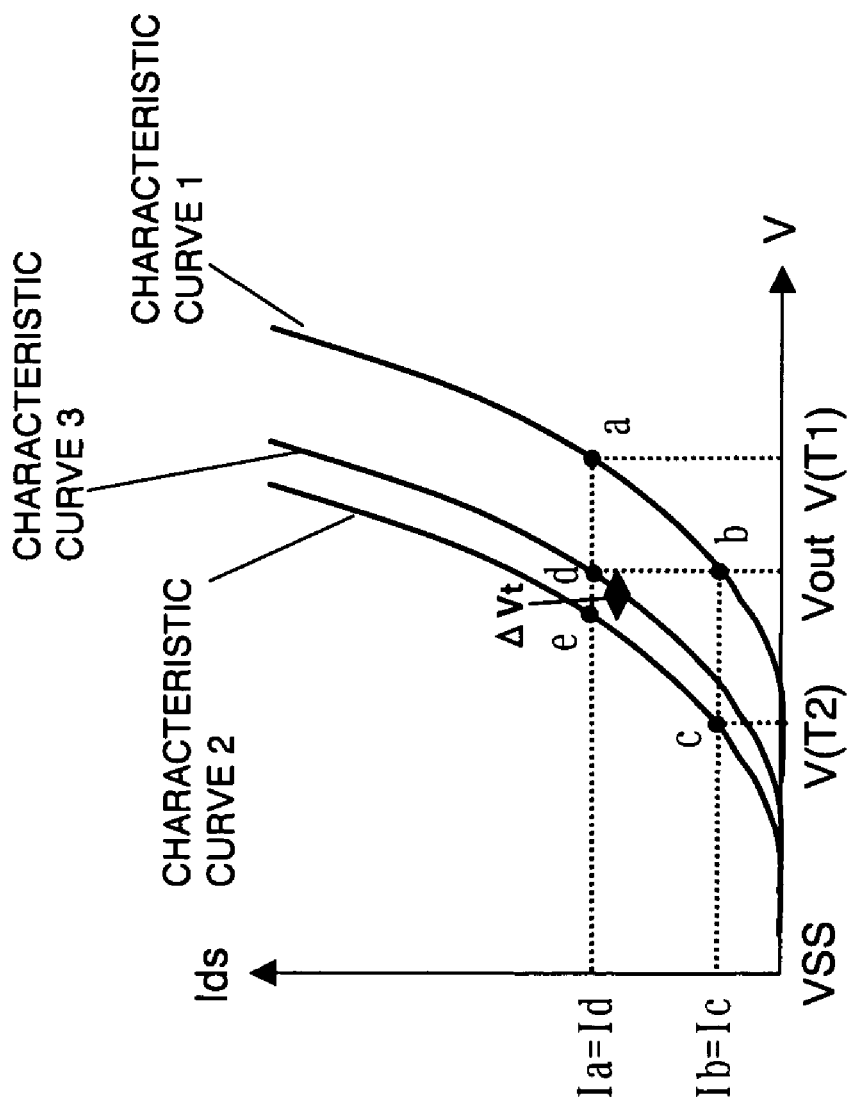
FIG. 17 is a graph for illustrating the operation of the circuit of FIG. 13 for the case of variations in threshold values.

The graph of FIG. 17 illustrates the operation of the circuit of FIG. 13. Specifically, FIG. 17 shows a characteristic curve 1 for the transistors 101 and 102, a characteristic curve 2 for the transistor 103 and a characteristic curve 3 for the transistor 104, the threshold voltage of which has become higher by ΔVt than those of the other transistors. It is noted that the operation points of the transistors are on the respective characteristic curves. The characteristic curves 1, 2 and 3 have been shifted on the abscissa by the potentials of the first and second differential pairs (101, 102) and (103, 104) being changed independently of one another.

Moreover, the characteristic curves 2 and 3 are shifted on the abscissa by variation of the threshold voltage ΔVt. It is assumed that there are no variations other than those of the threshold voltages in the characteristic curves.

Figure 39:
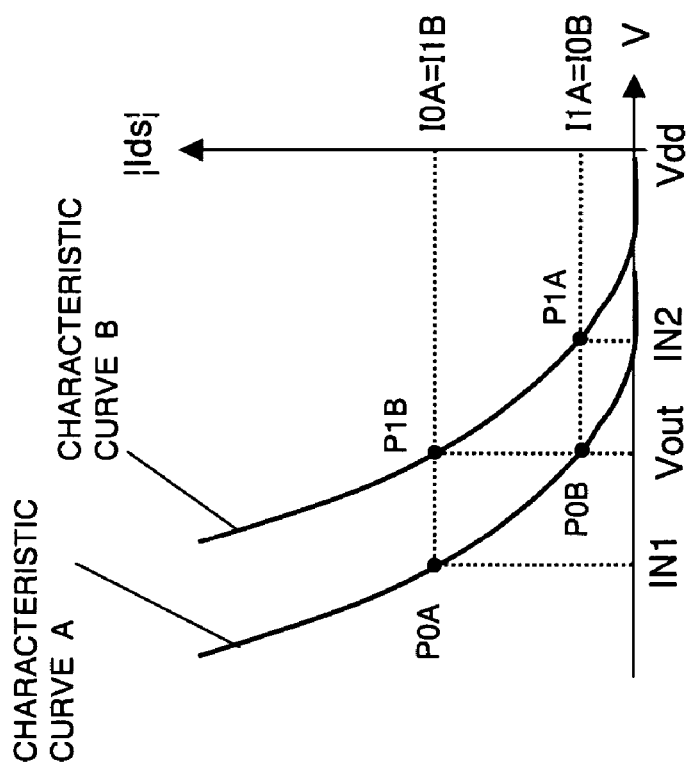
FIG. 39 is a graph for illustrating the operation when the amplifier of FIG. 38 outputs an intermediate voltage of two gray scale voltages IN1 and IN2 as Vout.

If, in FIG. 13, the currents of the current sources 113 and 114 are equal to each other and the input and output currents of the current mirror (111, 112) are equal to each other, as explained with reference to FIG. 39, the following equations are valid:

$$Ia+Ib=Ic+Id \qquad (5)$$

and $$Ia+Ic=Ib+Id \qquad (6)$$

so that $$Ia=Id \text{ and } Ic=Ib \qquad (7).$$

From the equation (7), the four operation points a, b, c and d are determined as shown in FIG. 17. In this case, the operation points b and d of the transistors 102 and 104 are both Vout on the abscissa V, while the operation points a and c of the transistors 101 and 103 are V(T1) and V(T2), respectively, on the abscissa V.

If a point of intersection of a straight line passing through the operation points a and d with the characteristic curve 2 is e, a line segment de is equal to ΔVt. Since a line segment ae, connecting the operation points, is equal to a line segment bc, the output voltage Vout is equal to an intermediate voltage of the V(T1) and V(T2) plus ΔVt/2, and may be expressed by the following equation;

$$Vout=\{V(T1)-V(T2)+\Delta Vt\}/2 \qquad (8)$$

Figure 18:
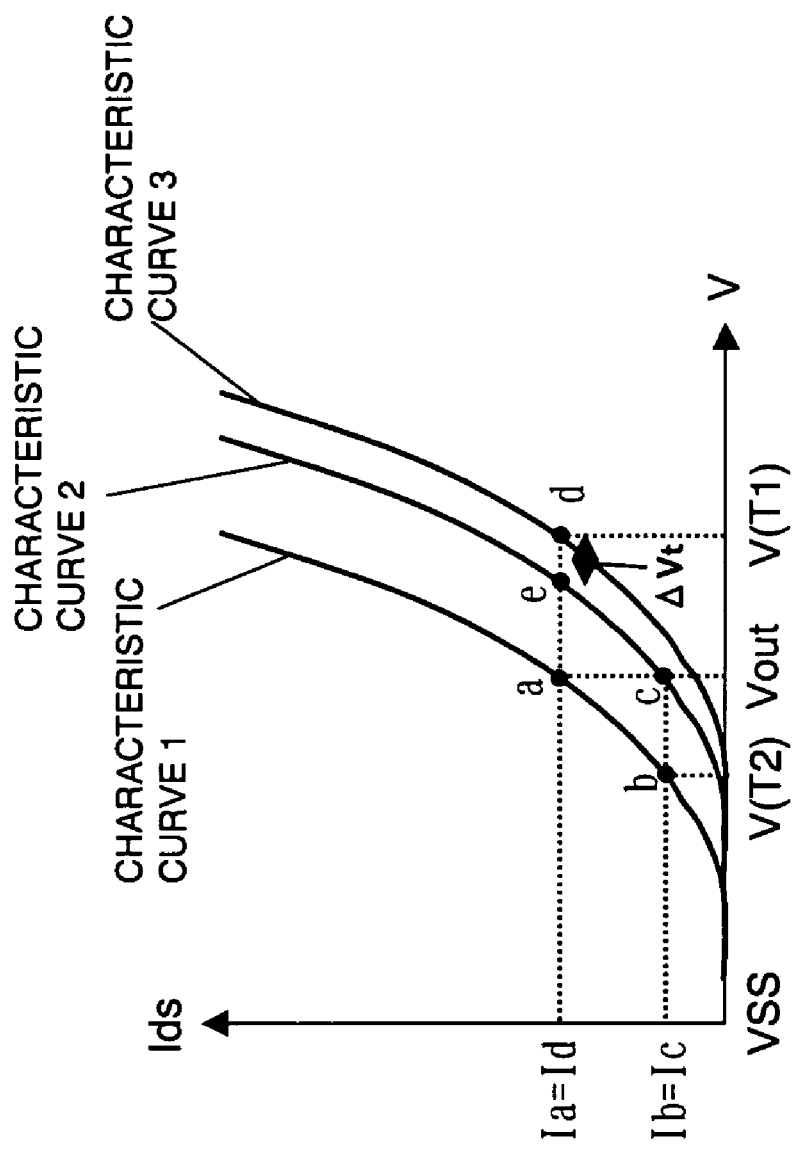
FIG. 18 is a graph for illustrating the operation of the circuit of FIG. 14 for the case of variations in threshold values.

FIG. 18 illustrates the operation of the circuit of FIG. 14. In FIG. 14, the relationship of the equation (7) holds, and the four operation points a, b, c and d are determined as shown in FIG. 18. In this case, the operation points a and c of the transistors 101 and 103 are Vout on the abscissa V, while the operation points b and d of the transistors 102 and 104 are V(T2) and V(T1), respectively. Moreover, if a point of intersection of a straight line passing through the operation points a and d with the characteristic curve 2 is e, a line segment de is equal to ΔVt. Since a line segment ae, connecting the operation points, is equal to a line segment bc, the output voltage Vout is equal to an intermediate voltage of the V(T1) and V(T2) minus ΔVt/2, and may be expressed by the following equation;

$$Vout=\{V(T1)-V(T2)-\Delta Vt\}/2 \qquad (9)$$

As may be seen from above, if the transistor 104 of the differential amplifier of FIG. 1 has a threshold variation ΔVt, the output voltage Vout has an offset of +ΔVt/2 and −ΔVt/2, during the first and second time periods of FIG. 2, respectively, as shown by the equations (8) and (9), respectively.

However, by repeating the first and second time periods of FIG. 2, at preset cycles, the above offsets are time-averaged and become effectively equivalent to the equation (4).

Meanwhile, the operation for the case of $V(T1) \leqq V(T2)$ may readily be derived from the graph illustrating the operation. Although the operation points and the direction of the offset differ from those for the case of $V(T1) \geqq V(T2)$, the output voltage Vout for the first and second time periods has an offset which is the same in magnitude but opposite in polarity. Thus, by repeating the first and second time periods at preset cycles, the output offsets are time-averaged and the output voltage effectively becomes equivalent to the equation (4).

In the above, the case of the threshold variations of the transistor 104 has been described. In case any other transistor of the first and second differential pairs have threshold variations, an output offset may similarly be canceled based on time averaging described above. Hence, the differential amplifier of FIG. 1 is able to obtain an output voltage with high accuracy in case the transistors have threshold variations.

Figure 3:
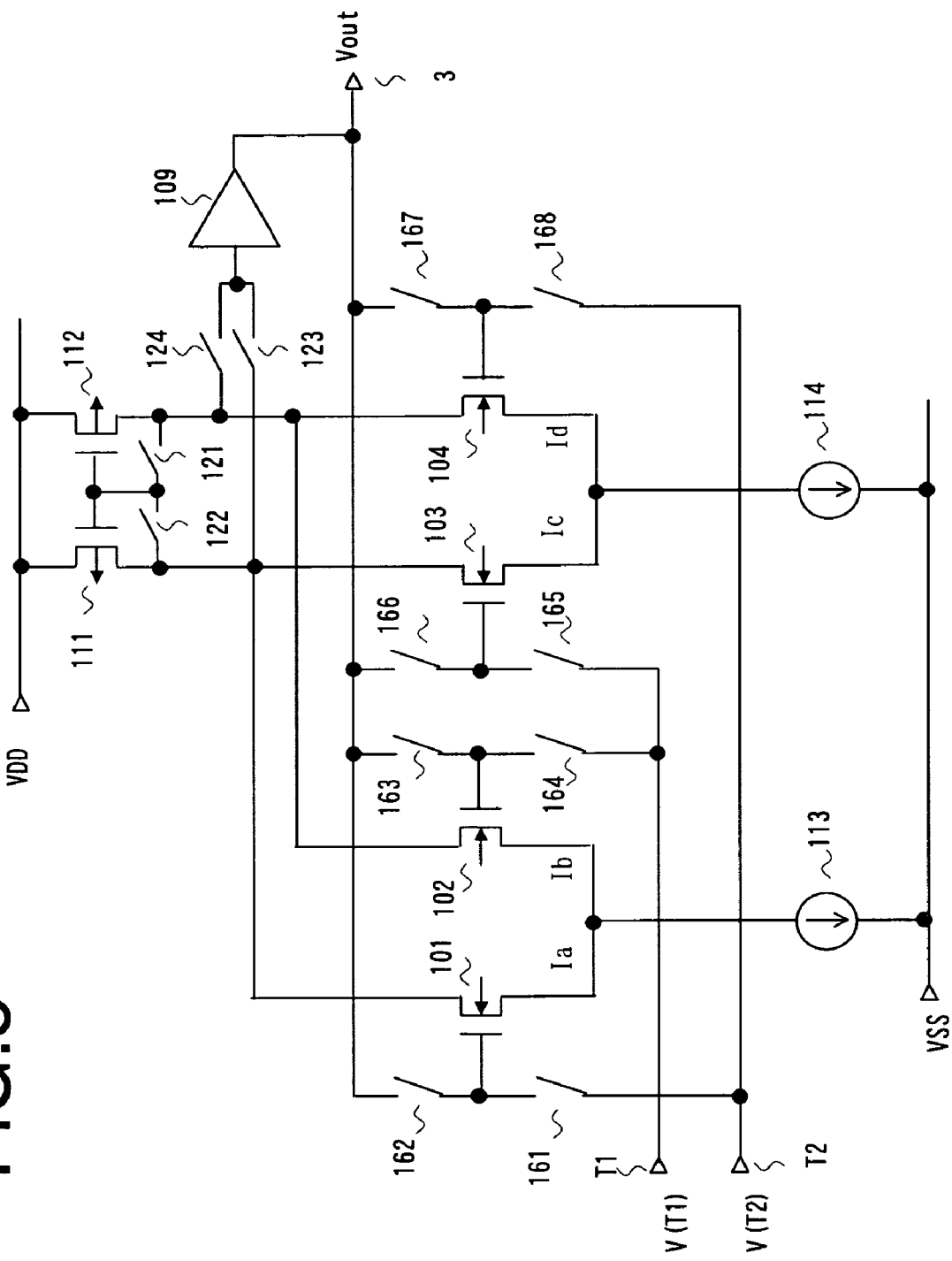
FIG. 3 is a diagram showing a differential amplifier according to a second embodiment of the present invention.

Another embodiment of the present invention will now be described. FIG. 3 shows a differential amplifier according to a second embodiment of the present invention. Referring to FIG. 3, the differential amplifier of the present embodiment differs from the differential amplifier of the first embodiment, shown in FIG. 1, as to switches connected between the gates of the n-channel transistors 101 to 104 on one hand and the terminals T1 and T2 and the output terminal 3 on the other. In the following, the points of difference from the differential amplifier shown in FIG. 1 will be described. The present embodiment includes a switch 161, connected between the terminal T2 and a gate of the n-channel transistor 101, a switch 162, connected between the gate of the n-channel transistor 101 and the output terminal 3, and a switch 164, connected between the terminal T1 and a gate of the n-channel transistor 102. The present embodiment also includes a switch 163 connected between the gate of the n-channel transistor 102 and the output terminal 3, a switch 165 connected between the terminal T1 and the gate of the n-channel transistor 103, and a switch 166 connected between the gate of the n-channel transistor 103 and the output terminal 3. The present embodiment further includes a switch 168 connected between the terminal T2 and the gate of the n-channel transistor 104, and a switch 167 connected between the gate of the n-channel transistor 104 and the output terminal 3. The present embodiment is otherwise the same as the differential amplifier shown in FIG. 1.

FIG. 4 shows a method for on/off control of the switches 121 to 124 and 161 to 168 of the differential amplifier shown in FIG. 3. The first and second time periods are changed over at preset cycles. The differential amplifier of FIG. 3 in the first time period and that in the second time period in FIG. 4 may be represented by equivalent circuits shown in FIGS. 15 and 16, respectively.

Figure 15:
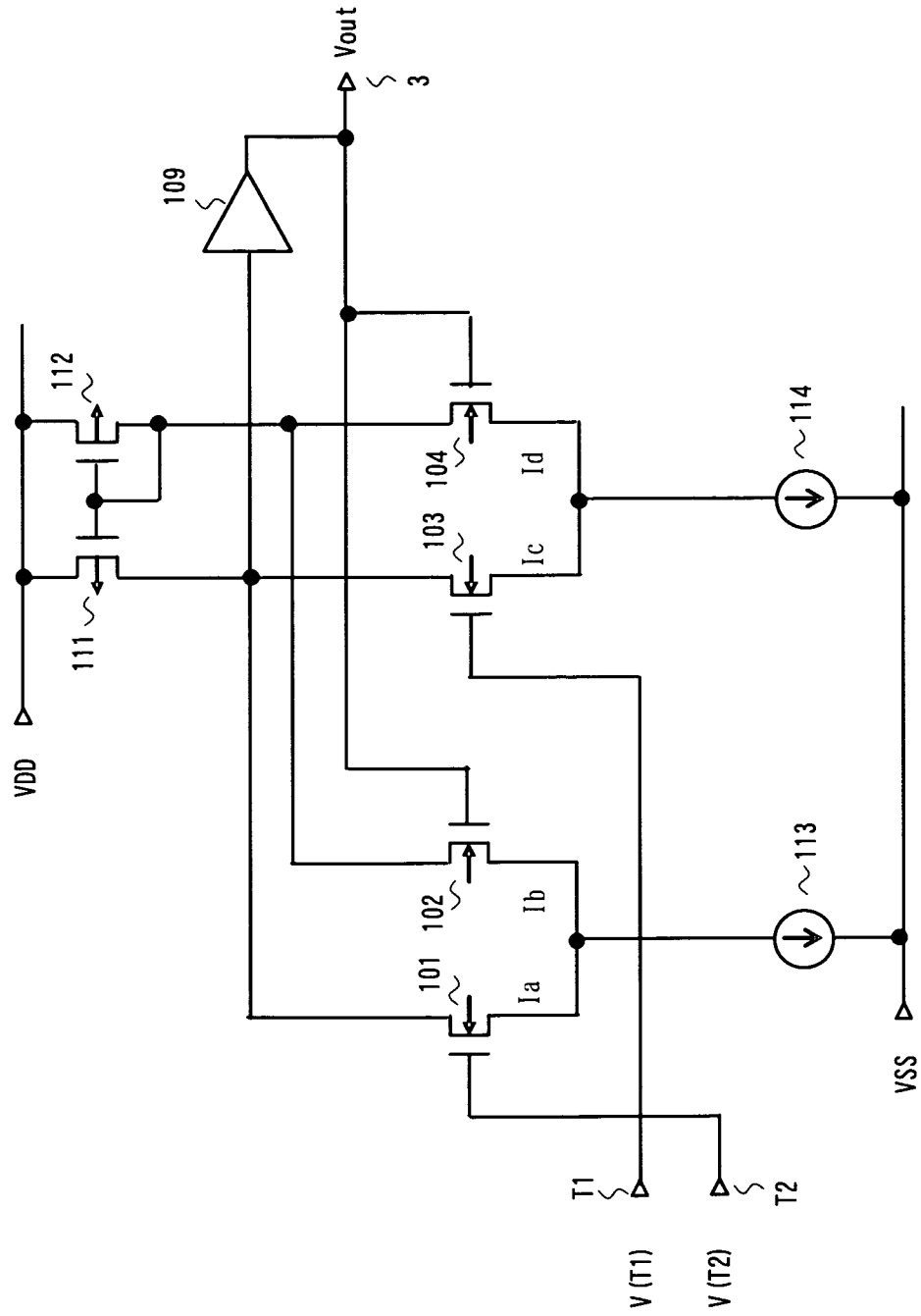
FIG. 15 shows an equivalent circuit of differential amplifiers of FIGS. 3 and 7 during the first time period of FIGS. 4 and 8.

That is, the configuration in which, during the first time period of FIG. 4, the switches 121, 123, 161, 163, 165 and 167 are in an on state and the switches 122, 124, 162, 164, 166 and 168 are in an off state, in FIG. 3, is the equivalent circuit of FIG. 15. At this time, the gates of the transistors 101 and 102 of the first differential pair are connected to the terminal T2 and to the output terminal 3, and the gates of the transistors 103 and 104 of the second differential pair are connected to the terminal T1 and to the output terminal 3, respectively. Out of the transistors 111 and 112, constituting the current mirror, the transistor 112 forms an input side and has a gate and a drain connected together and connected to a connection node of the drains of the transistors 102 and 104. The output side transistor 111 has a drain connected to a connection node of the drains of the transistors 101 and 103 and connected to the input end of the amplifier stage 109.

Figure 16:
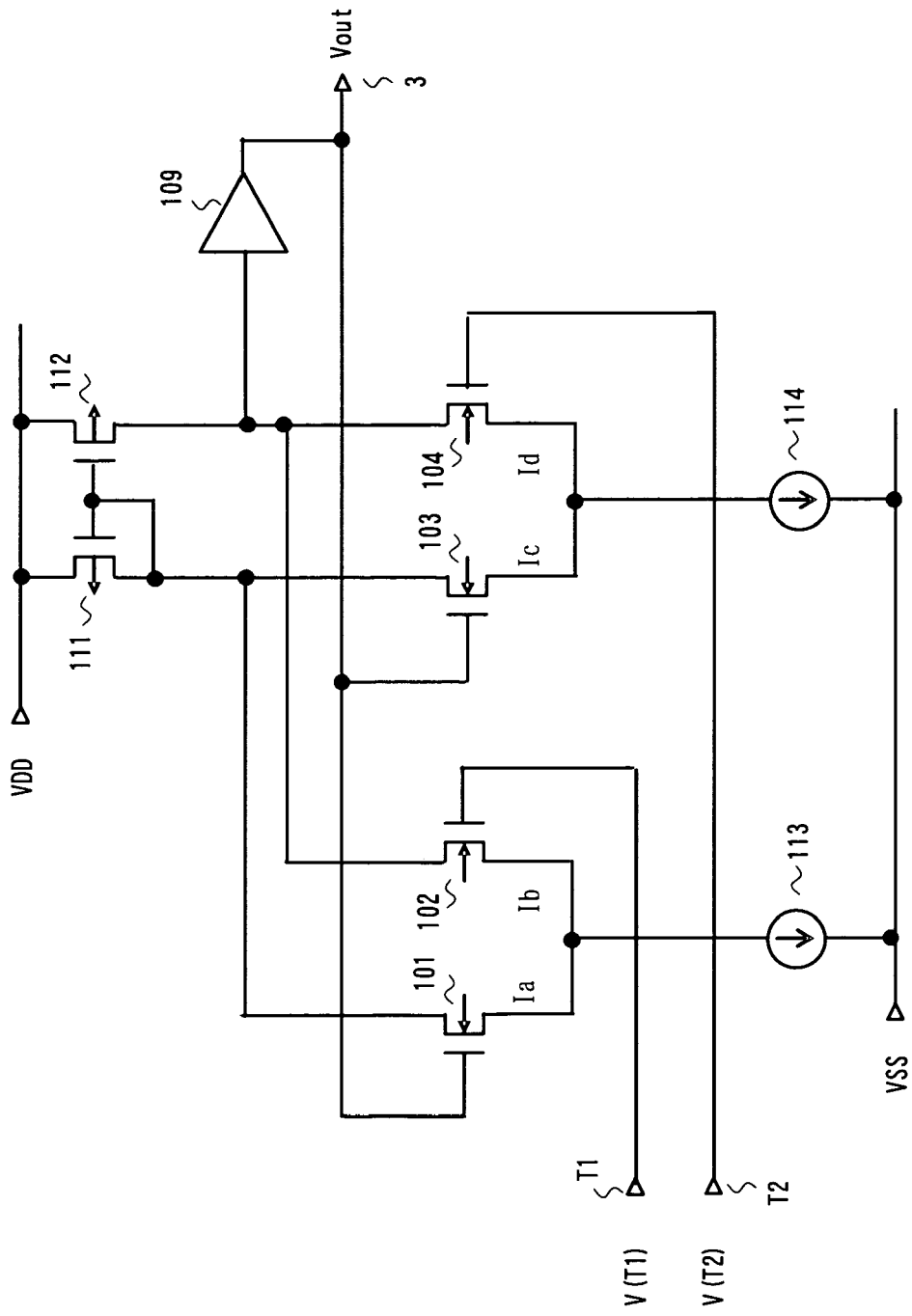
FIG. 16 shows an equivalent circuit of differential amplifiers of FIGS. 3 and 5 during the second time period of FIGS. 4 and 6.

On the other hand, the configuration in which, during the second time period of FIG. 4, the switches 121, 123, 161, 163, 165 and 167 are in an off state and the switches 122, 124, 162, 164, 166 and 168 are in an on state, in FIG. 3, is the equivalent circuit of FIG. 16. At this time, the gates of the transistors 101 and 102 of the first differential pair are connected to the output terminal 3 and to the terminal T1, respectively, and the gates of the transistors 103 and 104 of the second differential pair are connected to the output terminal 3 and to the terminal T2, respectively. Out of the transistors 111 and 112, constituting the current mirror, the transistor 111, forming the input side, has a gate and a drain connected together and connected to a junction of the drains of the transistors 101 and 103. The output side transistor 112 of the current mirror has a drain connected to a junction of the drains of the transistors 102 and 104 and connected to the input end of the amplifier stage 109.

FIGS. 15 and 16 show differential amplifiers, each of which has two differential pairs. One inputs of input pairs of the differential amplifiers are connected to the terminals T1 and T2, respectively, while the other inputs of the input pairs of the differential amplifiers are connected in common to the output terminal 3. In case the transistors of the two differential pairs are of the same characteristics, the differential amplifier is able to amplify and output a voltage interiorly dividing the voltage V(T1) at the terminal T1 and the voltage V(T2) at the terminal T2 at a ratio of 1:1 (an intermediate voltage of the voltages V(T1) and V(T2)).

If the transistors of the first and second differential pairs (101, 102) and (103, 104) are of the same characteristics, free of variations, FIGS. 15 and 16 are equivalent to FIG. 13. However, should variations be produced in the transistor characteristics, the operations of FIGS. 15 and 16 become different from each other.

The operation of canceling out the output offset, ascribable to variations in threshold values of the transistors, by the differential amplifier of FIG. 3, will now be described. In the following description, as in the description of the operation of FIG. 1, it is assumed that only the threshold value of the transistor 104 has become deviated from those of the other transistors, the definition of the four operation points a to d and the point of intersection e is the same, and that $V(T1) \geqq V(T2)$.

Figure 19:
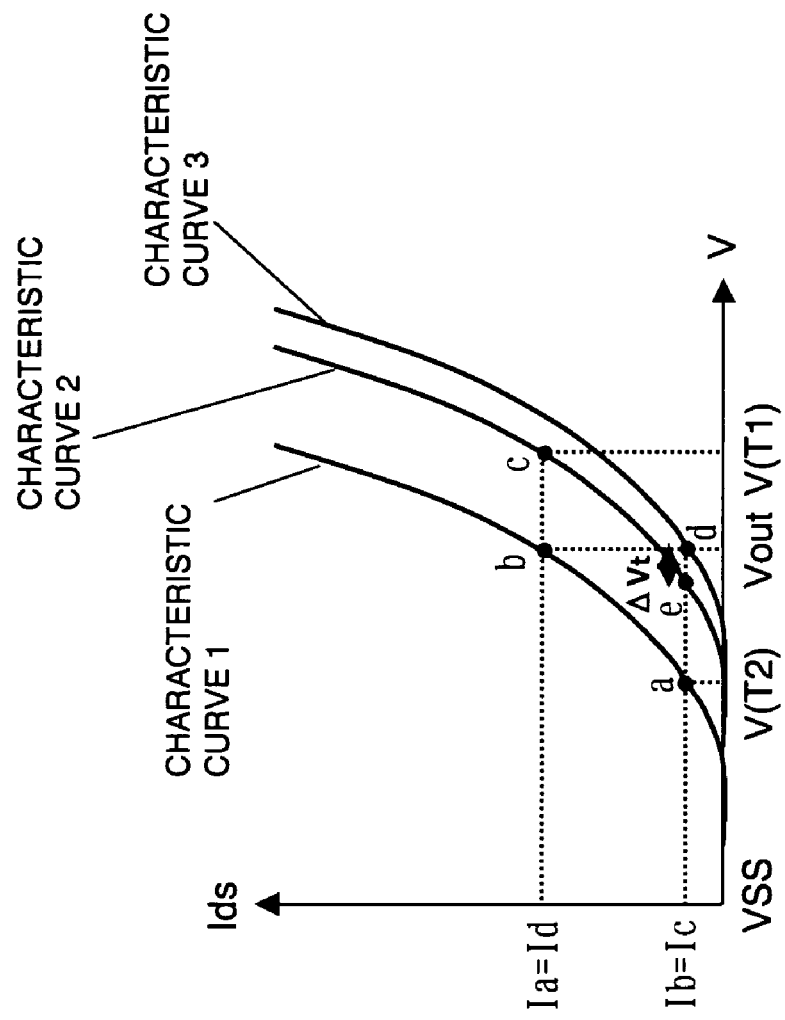
FIG. 19 is a graph for illustrating the operation of the circuit of FIG. 15 for the case of variations in threshold values.

FIG. 19 shows the operation of the circuit of FIG. 15. In FIG. 15, the relationship of the equation (7) is valid, and the four operation points a to d as well as the point of intersection e are determined as shown in FIG. 19. In this case, the operation points b and d of the transistors 102 and 104 are both Vout on the abscissa V, while the operation points a and c of the transistors 101 and 103 are V(T2) and V(T1) on the abscissa V, respectively. The line segment de is $\Delta Vt$. Moreover, the line segments ae and bc are equal to each other. Hence, the output voltage Vout is a voltage intermediate between the V(T1) and V(T2), plus $\Delta Vt/2$, and may be expressed by the equation (8).

Figure 20:
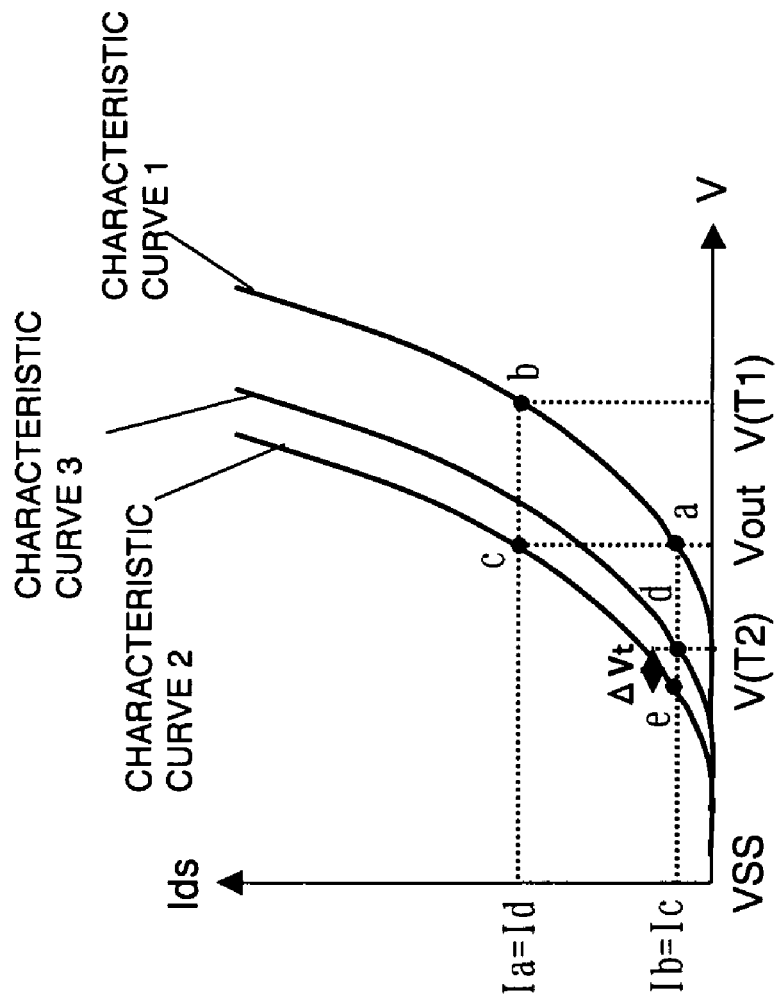
FIG. 20 is a graph for illustrating the operation of the circuit of FIG. 16 for the case of variations in threshold values.

FIG. 20 shows the operation of the circuit of FIG. 16. In FIG. 16, the relationship of the equation (7) holds, and the four operation points a to d and the intersecting point e are determined as shown in FIG. 20. The operation points b and d of the transistors 101 and 103 are both Vout on the abscissa V, whilst the operation points a and c of the transistors 102 and 104 are V(T1) and V(T2) on the abscissa V, respectively. The line segment de is $\Delta Vt$. Moreover, the line segments ae and bc are equal to each other. Hence, the output voltage Vout is intermediate between the V(T1) and V(T2), less $\Delta Vt/2$, and may be expressed by the equation (9).

As described above, if the transistor 104 of the differential amplifier of FIG. 3 has a threshold value variation $\Delta Vt$, the output voltage Vout has an offset of $+\Delta Vt$ or $-\Delta Vt$, during the first time period or during the second time period, respectively, as shown by the equations (8) and (9). However, the above output offset is time-averaged, by the repetition of the first and second time periods at preset cycles, and becomes effectively equivalent to the equation (4). Meanwhile, the operation for the case of $V(T1) \leqq V(T2)$ may readily be derived from the graph showing the operation.

During the first and second time periods, the output voltage Vout undergoes offsets which are equal in magnitude but opposite in polarity. Thus, by repeating the first and second time periods at preset cycles, the time offset is canceled out and becomes effectively equivalent to the equation (4).

In the above description, the case of the transistor 104 having threshold voltage variations has been explained. In case any other transistor of the first and second differential pairs is subjected to variations in the threshold voltage, an output offset may similarly be canceled based on time averaging. Hence, the differential amplifier of FIG. 3 is able to output a voltage with high accuracy in case the transistors undergo variations in threshold voltages.

Figure 5:
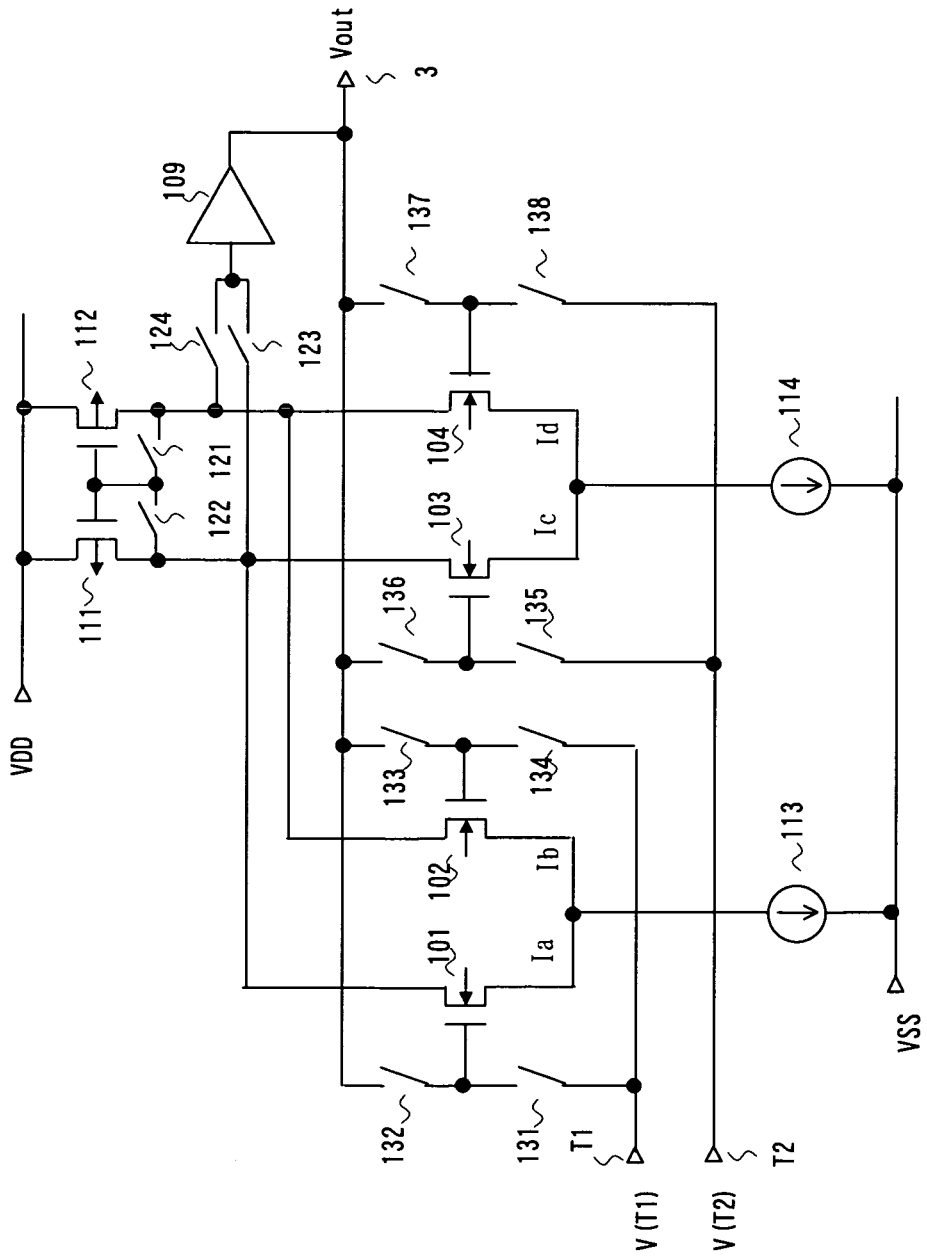
FIG. 5 is a diagram showing a differential amplifier according to a third embodiment of the present invention.

FIG. 5 shows a differential amplifier of a third embodiment of the present invention. Referring to FIG. 5, the differential amplifier of the present embodiment differs from the embodiment of FIG. 1 as to switches connected between the gates of the n-channel transistors 101 to 104 on one hand and the terminals T1 and T2 and the output terminal 3 on the other. In the following, the present embodiment will be described as to the point of difference from the embodiment of FIG. 1. Referring to FIG. 5, the differential amplifier of the present embodiment includes a switch 131, connected between the terminal T1 and the gate of the n-channel transistor 101, a switch 132, connected between the gate of the n-channel transistor 101 and the output terminal 3, and a switch 134, connected between the terminal T1 and the gate of an n-channel transistor 102. The differential amplifier also includes a switch 133, connected between the gate of the n-channel transistor 102 and the output terminal 3, a switch 135 connected between the terminal T2 and the gate of the n-channel transistor 103, and a switch 136 connected between the gate of the n-channel transistor 103 and the output terminal 3. The differential amplifier further includes a switch 138 connected across the terminal T2 and the gate of the n-channel transistor 104, and a switch 137 connected between the gate of the n-channel transistor 104 and the output terminal 3. In other respects, the present embodiment is the same as the embodiment of FIG. 1.

FIG. 6 shows an on/off control method of the switches 121 to 124 and 131 to 138 of the differential amplifier of FIG. 5. The first and second time periods are changed over at preset cycles. The differential amplifier of FIG. 5 during the first time period and that during the second time period of FIG. 6 are as shown by equivalent circuits of FIGS. 13 and 16, respectively.

That is, if, during the first time period of FIG. 6, the switches 121, 123, 131, 133, 135 and 137 are in an on state, and the switches 122, 124, 132, 134, 136 and 138 are in an off state, the resulting circuit may be represented by an equivalent circuit shown in FIG. 13. The states of connection in this case are as indicated above.

On the other hand, if, during the second time period of FIG. 6, the switches 121, 123, 131, 133, 135 and 137 are in an off state, and the switches 122, 124, 132, 134, 136 and 138 are in an on state, the resulting circuit may be represented by an equivalent circuit shown in FIG. 16. The states of connection in this case are as indicated above.

The operation of the differential amplifier of FIG. 5 canceling out the output offset, ascribable to the threshold variations of the transistors, is the same as the operation of FIGS. 17 and 20 for the circuits of FIGS. 13 and 16. That is, the output voltage Vout undergoes offsets which are equal in magnitude but opposite in polarity. Hence, by repeating the first and second time periods at preset cycles, the time offsets are canceled out and become effectively equivalent to the equation (4). That is, the differential amplifier of FIG. 5 is able to obtain an output voltage with high accuracy even if there are threshold variations in the transistors.

Figure 7:
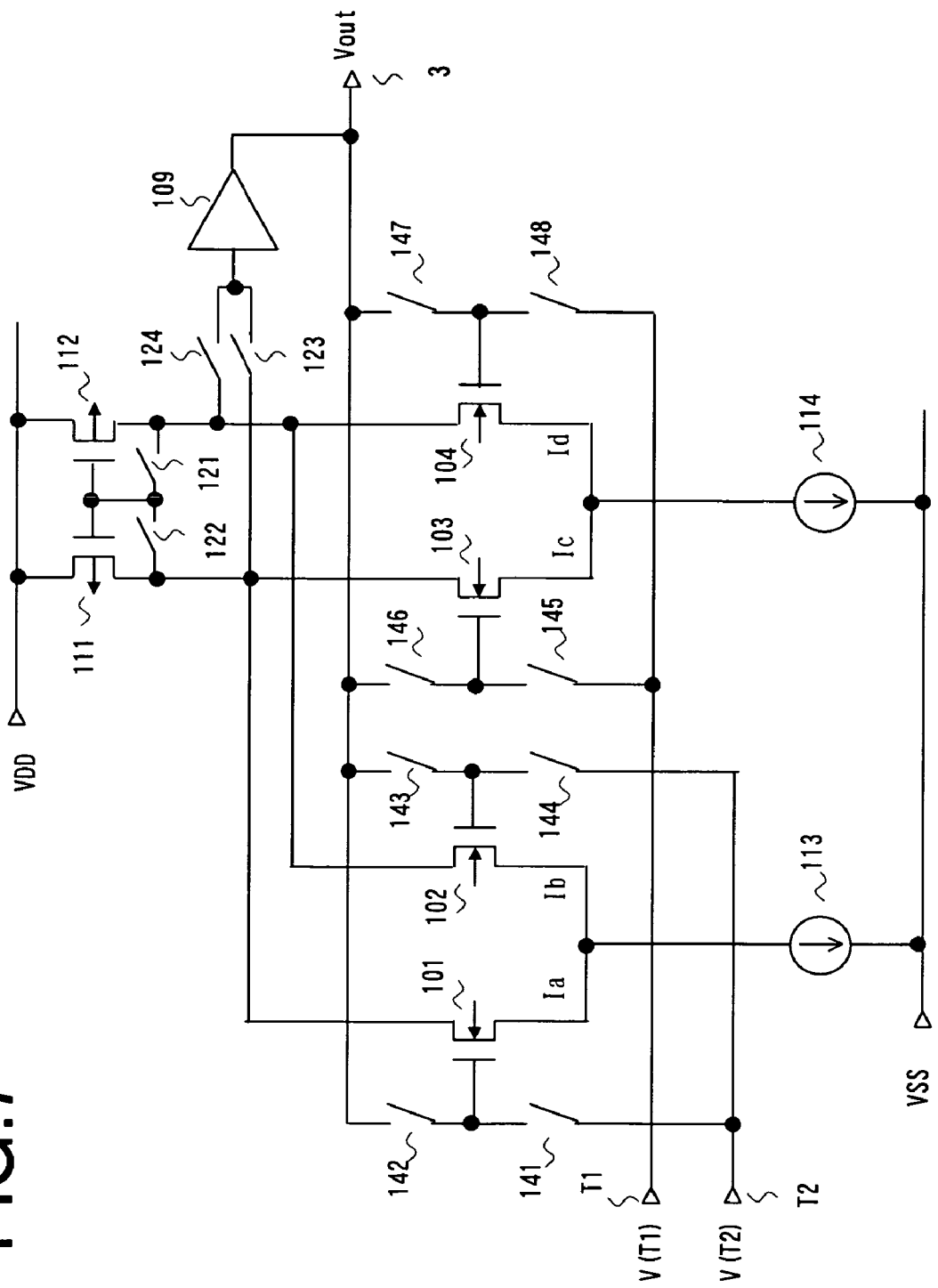
FIG. 7 is a diagram showing a differential amplifier according to a fourth embodiment of the present invention.

FIG. 7 shows a differential amplifier of a fourth embodiment of the present invention. Referring to FIG. 7, the differential amplifier of the present embodiment differs from the embodiment of FIG. 1 as to switches connected between the gates of the n-channel transistors 101 to 104 on one hand and the terminals T1 and T2 and the output terminal 3 on the other. In the following, the present embodiment will be described as to the point of difference from the embodiment of FIG. 1. The differential amplifier of the present embodiment, shown in FIG. 7, includes a switch 141 which is connected between the terminal T2 and the gate of the n-channel transistor 101, a switch 142 which is connected between the gate of the n-channel transistor 101 and the output terminal 3, a switch 144 which is connected between the terminal T2 and the gate of an n-channel transistor 102, a switch 143 which is connected between the gate of the n-channel transistor 102 and the output terminal 3, a switch 145 which is connected between the terminal T1 and the gate of the n-channel transistor 103, a switch 146 which is connected between the gate of the n-channel transistor 103 and the output terminal 3, a switch 148 which is connected between the terminal T1 and the gate of the n-channel transistor 104, and a switch 147 which is connected between the gate of the n-channel transistor 104 and the output terminal 3. In other respects, the present embodiment is the same as the embodiment of FIG. 1.

FIG. 8 shows an on/off control method of the switches 121 to 124 and 141 to 148 of the differential amplifier of FIG. 7. The differential amplifier of FIG. 7 during the first time period and during the second time period of FIG. 8 is as shown by equivalent circuits of FIGS. 15 and 14, respectively.

That is, if, during the first time period of FIG. 8, the switches 121, 123, 141, 143, 145 and 147 are in an on state, and the switches 122, 124, 142, 144, 146 and 148 are in an off state, the resulting circuit may be represented by an equivalent circuit shown in FIG. 15. The states of connection in this case are as indicated above.

On the other hand, if, during the second time period of FIG. 8, the switches 121, 123, 141, 143, 145 and 147 are in an off state, and the switches 122, 124, 142, 144, 146 and 148 are in an on state, the resulting circuit may be represented by an equivalent circuit shown in FIG. 14. The states of connection in this case are as indicated above.

The operation of the differential amplifier of FIG. 7 canceling out the output offset, ascribable to the threshold variations of the transistors, is the same as the operation of FIGS. 19 and 18 for the circuits of FIGS. 15 and 14. That is, as described above, the output voltage Vout undergoes offsets which are equal in magnitude but opposite in polarity. Hence, by repeating the first and second time periods at preset cycles, the time offsets are canceled out and become effectively equivalent to the equation (4). That is, the differential amplifier of FIG. 7 is able to obtain an output voltage with high accuracy even if there are threshold variations in the transistors.

As described above, the differential amplifiers of FIGS. 1, 3, 5 and 7 are each capable of amplifying and outputting a voltage which interiouly divides or interpolates two input voltages V(T1) and V(T2) at a ratio of 1:1, and canceling out the output offset ascribable to the threshold variations of the transistors to obtain an output voltage with high accuracy.

The operation of the differential amplifiers of FIGS. 1, 3, 5 and 7 canceling out the output offset ascribable to variations in the inclination of the characteristic curve of the transistor will now be described. For simplicity of the description, the operation for a case where the inclination of the characteristic curve of the transistor 104, out of the first and second differential pairs (101, 102) and (103, 104), has become deviated from those of the other transistors, will be described, with V(T1)≧V(T2).

Initially, the operation of the differential amplifier of FIG. 1 canceling out the output offset, ascribable to variations in the inclination of the characteristic curve of a transistor, will be described. The method for on/off control of the switches of the differential amplifier shown in FIG. 1, during the first and second time periods is the same as in FIG. 2, that is, the first and second time periods are changed over at preset cycles. The equivalent circuits of the differential amplifier of FIG. 1 during the first and second time periods are shown in FIGS. 13 and 14, respectively.

Figure 21:
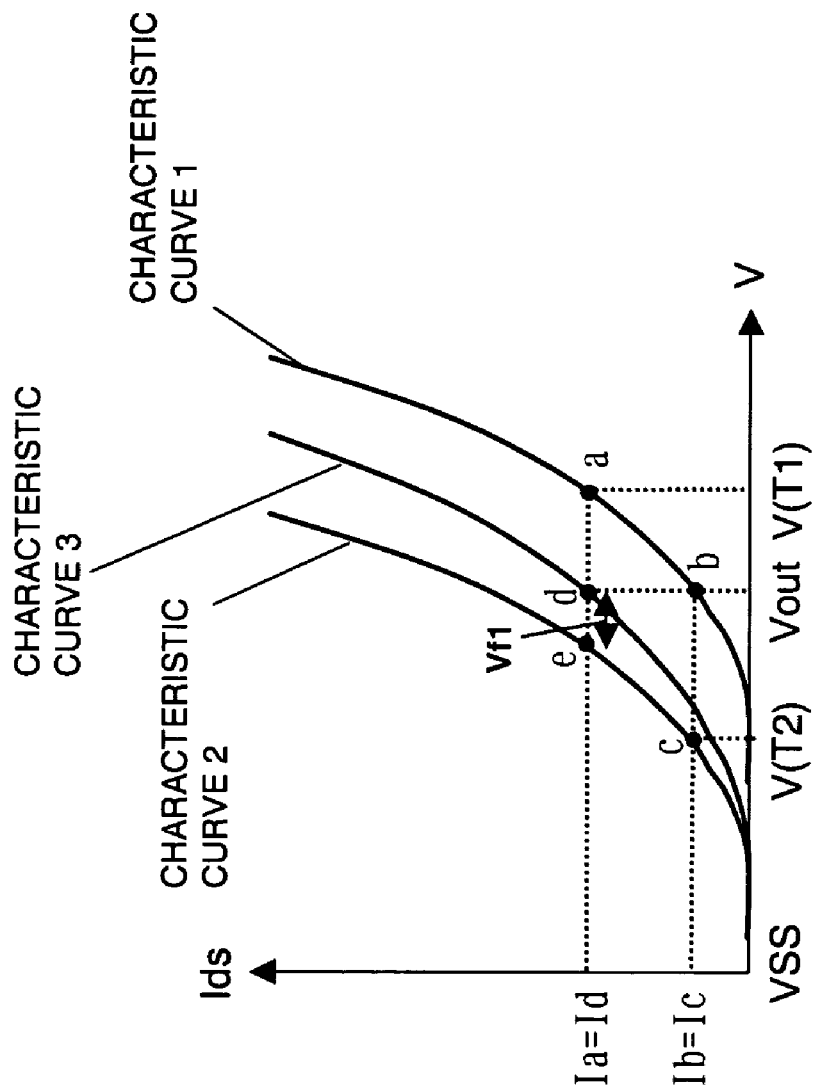
FIG. 21 is a graph for illustrating the operation of the circuit of FIG. 13 for the case of variations in the inclination of characteristic curves.

FIG. 21 shows the operation of the circuit of FIG. 13. In FIGS. 21 to 24, the inclination of the characteristic curve 3 is more moderate than that of the characteristic curve 2, there being no variations in the threshold value. The definition of the characteristic curves 1 and 2 and the respective operation points is the same as in FIGS. 17 to 20.

Thus, the four operation points a to d and the point of intersection e are determined as shown in FIG. 21. If the line segment de is Vf1, the output voltage Vout is an intermediate voltage of the voltage V(T1) and V(T2) plus Vf1/2, and may be expressed by the following equation:

$$Vout=\{V(T1)-V(T2)+Vf1\}/2 \qquad (10).$$

Figure 22:
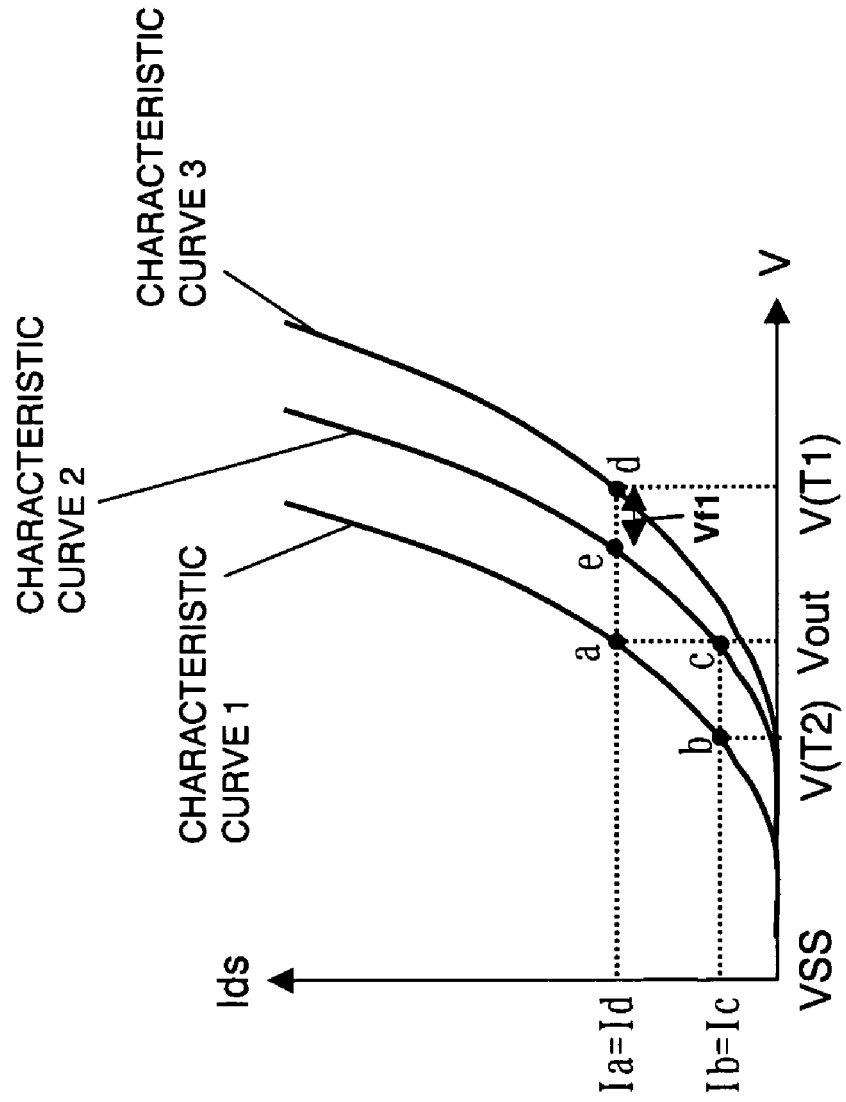
FIG. 22 is a graph for illustrating the operation of the circuit of FIG. 14 for the case of variations in the inclination of characteristic curves.

FIG. 22 shows the operation of the circuit of FIG. 14. In FIG. 22, the four operation points a to d and the point of intersection e are determined as shown. In this case, the line segment de is approximately equal to Vf1, and the output voltage Vout is an intermediate voltage between V(T1) and V(T2) less (Vf1/2), and may be expressed by the equation (11):

$$Vout=\{V(T1)-V(T2)-Vf1\}/2 \qquad (11)$$

It is noted that the value of the output offset Vf1/2 of the equation (10) is not precisely equal to that of the output offset Vf1/2 of the equation (11). The reason is that, even though the relationship of the equation (7) is maintained in FIGS. 21 and 22, the values of Ids of the operation points are slightly offset.

However, the value of the current Ids at each operation point in the operation of FIGS. 21 and 22 is offset only slightly such that the respective output offsets may be deemed to be of approximately the same value of Vf1/2.

As described above, in case the transistor 104 of the differential amplifier of FIG. 1 has variations in the inclination of the characteristic curve, the output voltage Vout is subjected to offset of +Vf1/2 or −Vf1/2, during the first and second time periods of FIG. 2, as shown by the equations (10) and (11), respectively.

However, by repeating the first and second time periods at preset cycles, the output offsets are time-averaged and become effectively equivalent to the equation (4).

The operation for the case where V(T1)≦V(T2) may readily be derived from the graph illustrating the operation. Even though the operation points or the polarity or the magnitude of the offset differ from the case where V(T1)≧V(T2), the output voltages Vout during the first and second time periods have offsets equal in magnitude but opposite in polarity.

Hence, by repeating the first and second time periods at preset cycles, the output offsets are time-averaged and become effectively equivalent to the equation (4).

The foregoing description refers to variations in characteristics of the transistor 104. However, in case any other transistor constituting two differential pairs has variations in transistor characteristics, the output offset may similarly be canceled out by time averaging.

Thus, the differential amplifier of FIG. 1 is able to obtain an output voltage with high accuracy even if the transistors of the differential amplifier have variations in the inclination of transistor characteristic curves.

The operation of the differential amplifier of FIG. 3 canceling out the output offset ascribable to variations in the inclination of the characteristic curve of the transistor will now be described. The method for on/off control of the respective switches of the differential amplifier of FIG. 3 is similar to that shown in FIG. 4, that is, the first and second time periods are changed over at preset cycles. The equivalent circuits of the differential amplifier of FIG. 3 during the first and second time periods are as shown in FIGS. 15 and 16, respectively.

Figure 23:
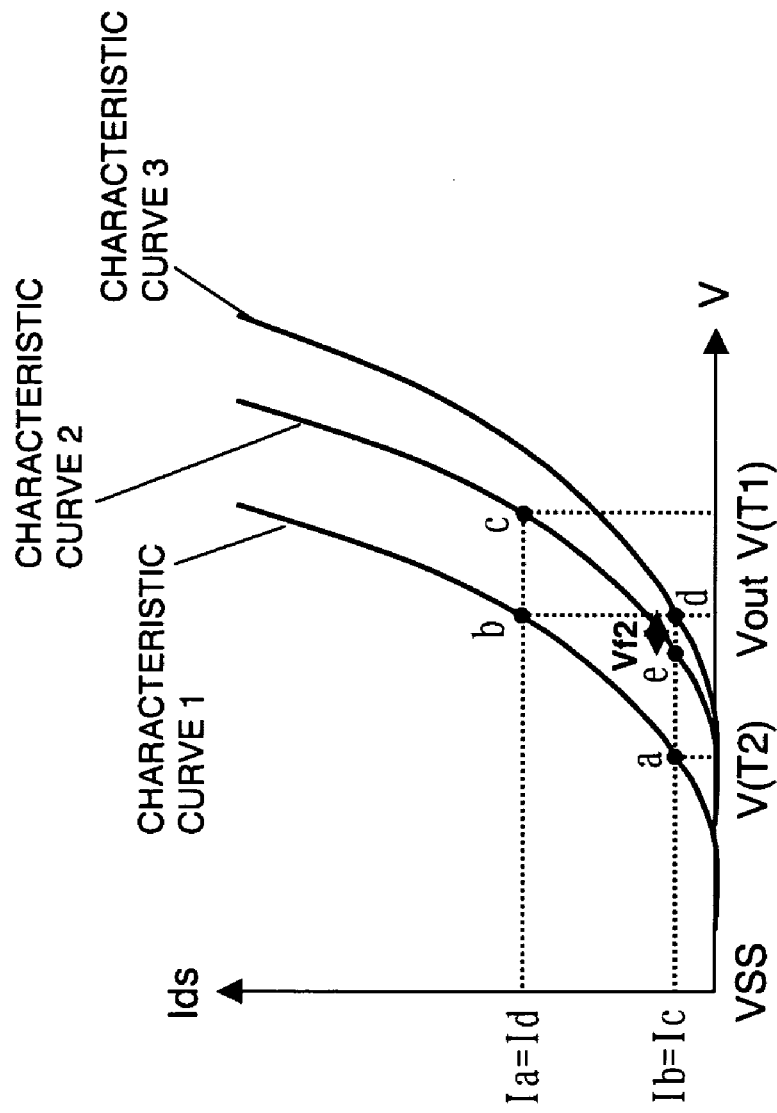
FIG. 23 is a graph for illustrating the operation of the circuit of FIG. 15 for the case of variations in the inclination of characteristic curves.

FIG. 23 shows the operation of the circuit of FIG. 15. The four operation points a to d and the point of intersection e are determined as shown in FIG. 23. If the line segment de is Vf2, the output voltage Vout is an intermediate voltage between the V(T1) and V(T2) plus Vf2/2, and may be expressed by the following equation:

$$Vout=\{V(T1)-V(T2)+Vf2\}/2 \qquad (12)$$

Figure 24:
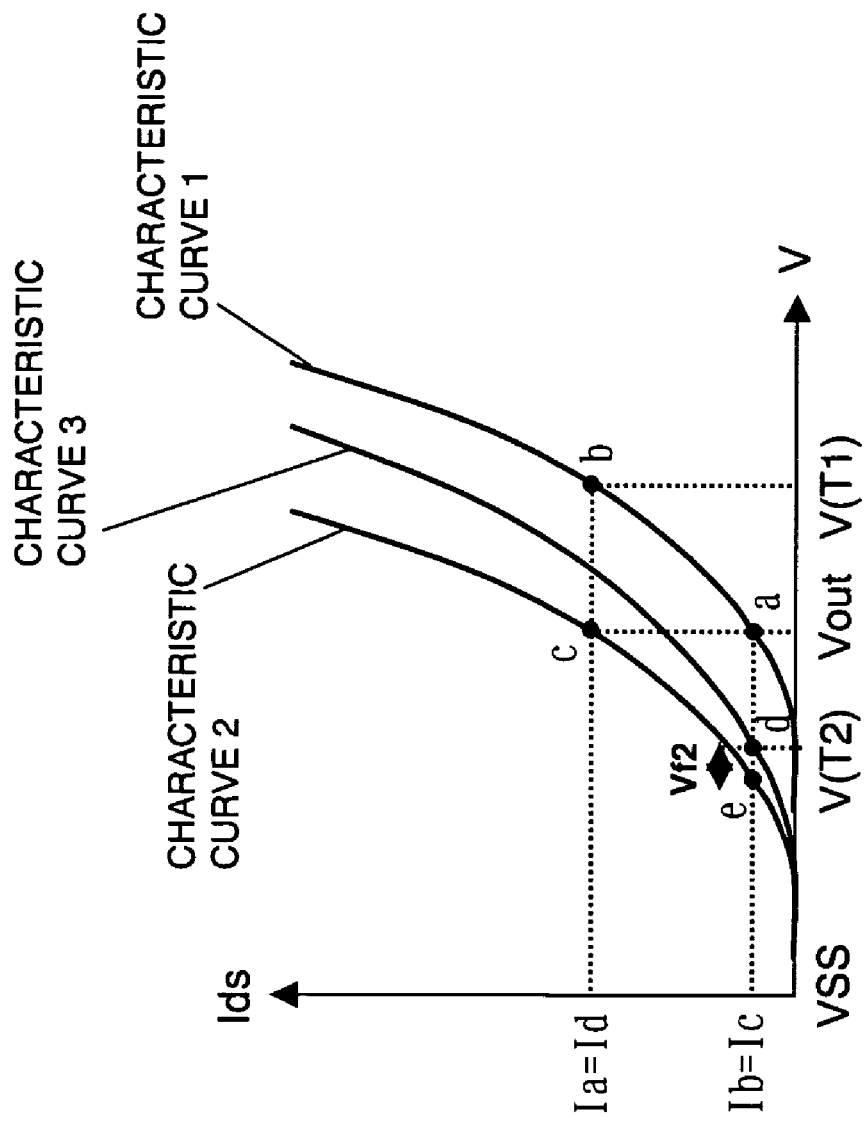
FIG. 24 is a graph for illustrating the operation of the circuit of FIG. 16 for the case of variations in the inclination of characteristic curves.

FIG. 24 shows the operation of the circuit of FIG. 16. The four operation points a to d and the point of intersection e are determined as shown in FIG. 24. The line segment de is approximately equal to Vf2. The output voltage Vout is an intermediate voltage between the V(T1) and V(T2) minus Vf2/2, and may be expressed by the following equation:

$$Vout=\{V(T1)-V(T2)-Vf2\}/2 \qquad (13)$$

It is noted however that the value of the output offset Vf2/2 of the equation (12) is not precisely equal to that of the equation (13). The reason is that, even though the relationship of the equation (7) is maintained in FIGS. 23 and 24, the values of Ids at the operation points are slightly offset.

However, the value of the current Ids at each operation point in the operation of FIGS. 23 and 24 is offset only slightly such that the respective output offsets may be deemed to be of an approximately equal value Vf2/2.

As described above, in case wherein the transistor 104 of the differential amplifier of FIG. 3 has variations in the inclination of the characteristic curve, the output voltage Vout has an offset of +Vf2/2 and −Vf2/2, during the first and second time periods of FIG. 4, as shown by the equations (12) and (13), respectively.

However, by repeating the first and second time periods at preset cycles, the output offsets are time-averaged and become effectively equivalent to the equation (4). The operation for the case where V(T1)≦V(T2) may readily be derived from the graph illustrating the operation. The output voltages Vout during the first and second time periods have offsets equal in magnitude but opposite in polarity.

Hence, by repeating the first and second time periods at preset cycles, the output offsets are time-averaged and become effectively equivalent to the equation (4).

The foregoing description refers to variations in characteristics of the transistor 104. However, in case any other transistor constituting two differential pairs has variations in transistor characteristics, the output offset may similarly be canceled out by time averaging. Hence, even if the transistors of the differential amplifier have variations in the inclination of the respective characteristic curves, the differential amplifier of FIG. 3 is able to obtain an output voltage with high accuracy.

The operation of the differential amplifier of FIG. 5 canceling out the output offset ascribable to variations in the inclination of the characteristic curve of the transistor will now be described. The method for on/off control of the respective switches of the differential amplifier of FIG. 5 is similar to that shown in FIG. 6, that is, the first and second time periods are changed over at preset cycles. The equivalent circuits of the differential amplifier of FIG. 5 during the first and second time periods are as shown in FIGS. 13 and 16, respectively.

The operation during the first time period of the differential amplifier of FIG. 5 is similar to the operation of FIG. 21 regarding the circuit of FIG. 13, whilst the operation thereof during the second time period is similar to the operation of FIG. 24 regarding the circuit of FIG. 16. During the first and second time periods, the output voltage Vout has offsets of +Vf1/2 and −Vf2/2, represented by the equations (10) and (13), respectively.

However, as may be seen from FIGS. 21 and 24, the absolute values Vf1/2 and Vf2/2 of the respective offsets differ appreciably from each other. The reason therefor will now be described. In case of transistor threshold variations, the characteristic curve is simply deviated on the abscissa. Hence, the magnitude of the offset remains unchanged even if the drain-to-source current Ids at the operation point of the transistor is changed.

In the case of variations in the inclination of the characteristic curve of a transistor, the magnitude of the offset depends on the drain-to-source current at the operation point of the transistor. The drain-to-source current of the operation point d of the transistor 104 in FIG. 21 differs appreciably from that in FIG. 24, while the absolute value of the offset Vf1/2 in FIG. 21 also differs appreciably from the absolute value of the offset Vf2/2 in FIG. 24.

On the other hand, the drain-to-source current depends on the voltage difference between the voltages V(T1) and V(T2). The larger the difference between the voltages V(T1) and V(T2), the larger the difference between the magnitudes of the absolute values of the offsets Vf1/2 and Vf2/2 becomes.

Thus, with the differential amplifier of FIG. 5, the output offset cannot be canceled out sufficiently, even in case the first and second time periods are changed over at preset cycles.

The operation of the differential amplifier of FIG. 7 canceling out the output offset, ascribable to variations in the inclination of the characteristic curve of a transistor, will now be described. The method for on/off control of the respective switches of the differential amplifier of FIG. 7 is similar to that shown in FIG. 8, that is, the first and second time periods are changed over at preset cycles. The equivalent circuits of FIG. 7 during the first and second time periods are as shown in FIGS. 15 and 14.

The operation during the first time period of the differential amplifier of FIG. 7 is similar to the operation of FIG. 23 regarding the circuit of FIG. 15, whilst the operation thereof during the second time period is similar to the operation of FIG. 22 for the circuit of FIG. 14.

During the first and second time periods, the output voltages Vout are subjected to the offsets of +Vf2/2 and −Vf1/2, represented by the equations (12) and (11), respectively.

However, as may be seen from FIGS. 22 and 23, the drain-to-source current at the operation point d of the transistor 104 shown in FIG. 22 differs appreciably from that shown in FIG. 23, while the absolute values Vf1/2 and Vf2/2 of the respective offsets also differ appreciably from each other.

With the differential amplifier of FIG. 7, as with the differential amplifier of FIG. 5, the output offset cannot be canceled out sufficiently even if the first and second time periods are changed over at preset cycles.

With the differential amplifiers, shown in FIGS. 1 and 3, it is possible to cancel out not only the output offset ascribable to the transistor threshold variations, but also that ascribable to variations in the inclination of the characteristic curve of a transistor, as described above, thereby enabling an output voltage to be output with high accuracy.

With the differential amplifiers, shown in FIGS. 5 and 7, the output offset, ascribable to transistor threshold variations, can be canceled, however, the output offset, ascribable to variations in the inclination of the characteristic curve of a transistor, cannot be canceled sufficiently.

The differential amplifiers of FIGS. 1, 3, 5 and 7 may be selectively used, depending on the characteristics of the variations in the transistor, such as to obtain an output voltage with high accuracy.

The foregoing description is directed to the operation for the cases where the threshold variations of the transistors 101 to 104, constituting the differential pairs, or variations in the inclination of the characteristic curves of the transistors, have been generated. Such a case where variations in the characteristics of the current sources 113 and 114 or the current mirror, composed by transistors 111 and 112, have been generated, will now be described. It is noted that variations in the transistor characteristics give rise to variations between the current at the current source 113 and that at the current source 114 or to offset between the input and output currents flowing through the current mirror (111, 112).

Thus, the following description is directed to the operation of the differential amplifier shown in FIGS. 1, 3, 5 or 7 canceling out the output offset ascribable to variations between the current at the current source 113 and that at the current source 114 or to offset between the input and output currents flowing through the current mirror (111, 112).

Initially, the operation in case variations have been produced in the currents at the current sources 113 and 114 will be described. For simplicity of description, it is assumed that there are no variations in transistors other than the current sources 113 and 114, and that the definitions of the operation points a, b, c and d of the transistors 101 to 104 and the currents (drain-to-source currents) Ia, Ib, Ic and Id are the same as those in FIG. 33. The graphs stand for the case where the relationship between V(T1) and V(T2) is such that V(T1) ≧V(T2).

If the current value of the current source 114 is higher by ΔI than that of the current source 113, the relation of currents is given by the following equation (14):

$$Ia+Ib=Ic+Id-\Delta I \quad (14)$$

The relationship for the input and output currents of the current mirror (111, 112) is the same as that by the equation (6). Hence, from the equations (6) and (14), the following equation (15) is derived.

$$Ia=Id-\Delta I/2, \text{ and}$$

$$Ib=Ic-\Delta I/2 \quad (15)$$

That is, the relationship of the equation (15) is valid for the differential amplifiers of FIGS. 1, 3, 5 and 7.

Initially, the operation of the differential amplifier of FIG. 1 canceling out the output offset ascribable to variations in current values between the current sources 113 and 114 will be described.

The on/off control of the switches of the differential amplifier of FIG. 1 is similar to that shown in FIG. 2, that is, the first and second time periods are changed over at preset cycles. The equivalent circuits of the differential amplifier of FIG. 1 during the first and second time periods are as shown in FIGS. 13 and 14.

Figure 25:
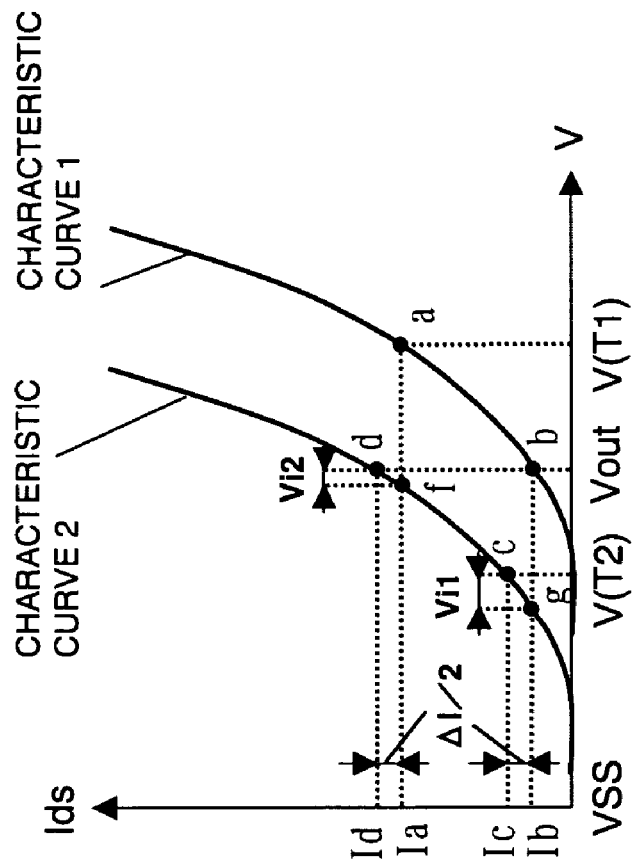
FIG. 25 is a graph for illustrating the operation of the circuit of FIG. 13 for the case of variations in the current of current sources.

FIG. 25 shows the operation of the circuit of FIG. 13 (operation where the current value of the current source 114 is higher by ΔI than the current value of the current source 113). In FIG. 25, the four operation points a, b, c and d are maintained in the relationship of the equation (15), and are determined as shown.

It is assumed that a point of intersection of a straight line passing through the operation point a and extending parallel to the abscissa V (Ids=Ia) and the characteristic curve 2 is f, a point of intersection of a straight line passing through the operation point b and extending parallel to the abscissa V (Ids=Ib) and the characteristic curve 2 is g, the potential difference between the operation point c and the point of intersection g is Vi1 and that the potential difference between the operation point d and the point of intersection f is Vi2.

Since the line segment af is equal to the line segment bg, the output voltage Vout is an intermediate voltage of V(T1) and V(T2) less (Vi1−Vi2)/2, and may be expressed by the following equation:

$$Vout=\{V(T1)+V(T2)-(Vi1-Vi2)\}/2 \quad (16)$$

Figure 26:
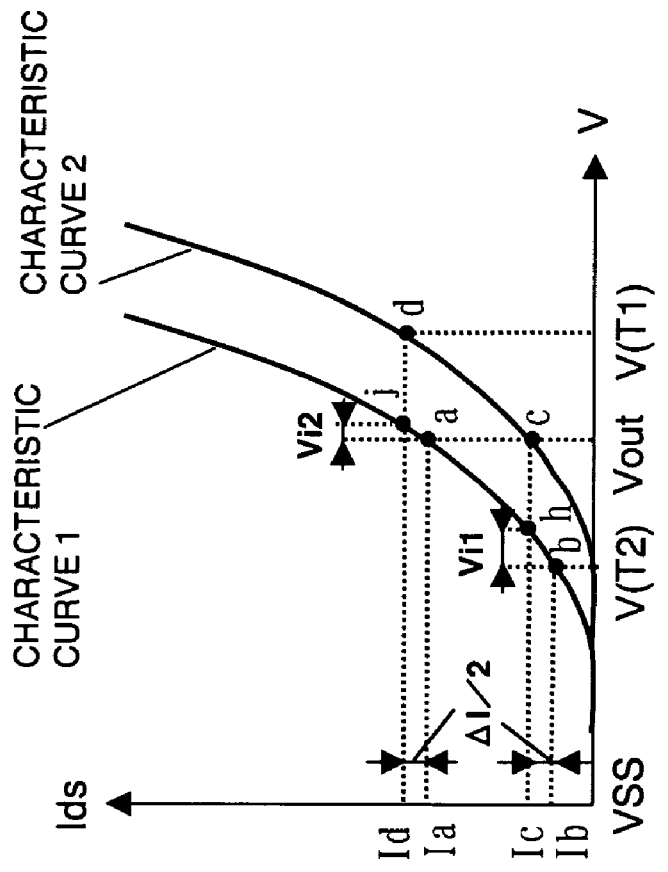
FIG. 26 is a graph for illustrating the operation of the circuit of FIG. 14 for the case of variations in the current of current sources.

FIG. 26 shows the operation of the circuit of FIG. 14 (operation where the current value of the current source 114 is higher by ΔI than the current value of the current source 113). In FIG. 26, the four operation points a, b, c and d are determined as shown in FIG. 26, with the currents flowing therethrough being as defined by the equation (15).

It is assumed that a point of intersection of a straight line passing through the operation point c and extending parallel to the abscissa V (Ids=Ic) and a characteristic curve 1 is h, a point of intersection of a straight line passing through the operation point d and extending parallel to the abscissa V (Ids=Id) and the characteristic curve 1 is j.

In this case, the potential difference between the operation point b and the point of intersection h is approximately Vi1 and that the potential difference between the operation point a and the point of intersection j is approximately Vi2.

Since the line segment ch is equal to the line segment dj, the output voltage Vout is an intermediate voltage of V(T1) and V(T2) plus (Vi1−Vi2)/2, and may be expressed by the following equation:

$$Vout=\{V(T1)+V(T2)+(Vi1-Vi2)\}/2 \quad (17)$$

It is noted however that the values of the output offset (Vi1−Vi2)/2 of the equations (16) and (17) are not precisely equal to each other. The reason is that, even though the relationship of the equation (15) is maintained in FIGS. 25 and 26, the values of Ids of the respective operation points are slightly offset. However, the value of the current Ids at operation points in the operation of FIGS. 23 and 24 is offset only slightly such that the respective output offsets may be deemed to be of an approximately equal value of (Vi1−Vi2)/2.

As described above, if there are variations between the currents at the current sources 113 and 114, in the differential amplifier of FIG. 1, the output voltages Vout during the first and second time periods of FIG. 2 have offsets of −(Vi1−Vi2)/2 and +(Vi1−Vi2)/2 during the first and second time periods of FIG. 2, as shown by the equations (16) and (17), respectively.

However, by repeating the first and second time periods of FIG. 2 at preset cycles, the output offsets are time-averaged and become effectively equivalent to the equation (4). The operation for the case where V(T1)≦V(T2) may readily be derived from the graph illustrating the operation. The output voltage Vout during the first and second time periods gives rise to offsets equal in magnitude but opposite in polarity, even though the operation points, the polarity or the magnitude of the offset differ from those for the case of V(T1)≧V(T2).

However, the output offset may be time-averaged, by repeating the first and second time periods at preset cycles, and effectively becomes equivalent to the equation (4).

Hence, the differential amplifier of FIG. 1 is able to obtain an output voltage with high accuracy even though there are variations in current values between the current sources 113 and 114.

The operation of the differential amplifier of FIG. 3 canceling out the output offset ascribable to variations in current values between the current sources 113 and 114 will now be described. The on/off control of the switches of the differential amplifier of FIG. 3 is similar to that shown in FIG. 4, that is, the first and second time periods are changed over at preset cycles. The equivalent circuits of the differential amplifier of FIG. 1 during the first and second time periods are as shown in FIGS. 15 and 16.

Figure 27:
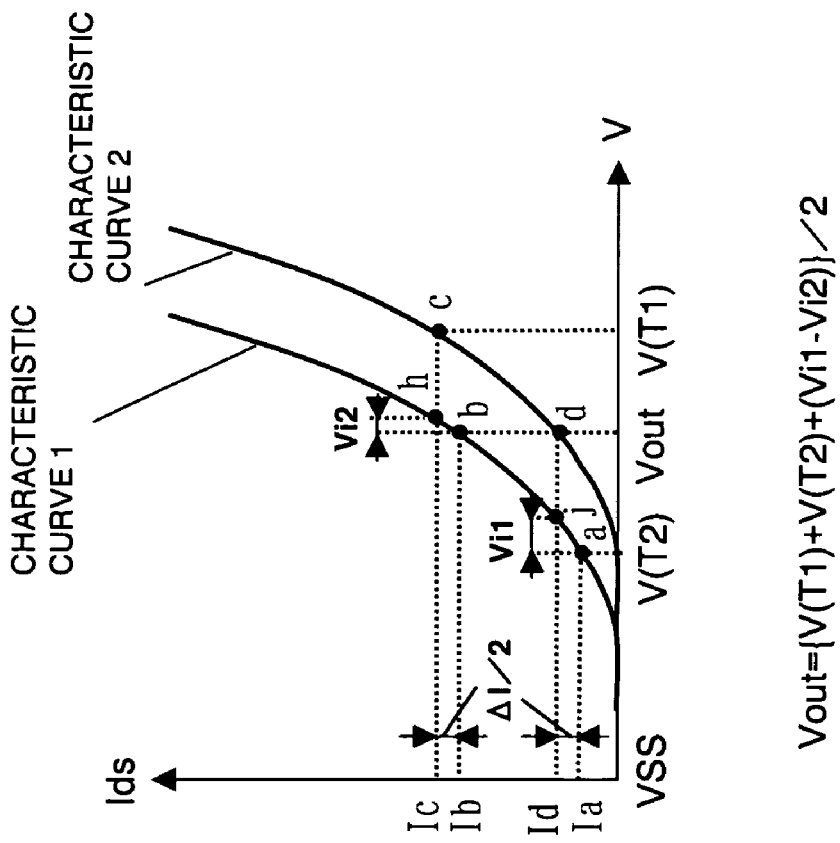
FIG. 27 is a graph for illustrating the operation of the circuit of FIG. 15 for the case of variations in the current of current sources.

FIG. 27 shows the operation of the circuit of FIG. 15 (operation where the current value of the current source 114 is higher by ΔI than the current value of the current source 113).

If the currents through the four operation points a to d are maintained as defined by the equation (15), and the definition of the points of intersection j and h are as shown in FIG. 26, the operation points and the points of intersection are determined as shown in FIG. 27. In this case, the operation points and the points of intersection a, b, c, d, j and h are in the same position relationships as the operation points and the points of intersection b, a, d, c, h and j of FIG. 26. The potential difference between the operation point a and the point of intersection j of FIG. 27 is approximately Vi1, while that between the operation point b and the point of intersection h is approximately Vi2.

Thus, as in FIG. 26, the output voltage Vout is an intermediate voltage between V(T1) and V(T2) plus (Vi1−Vi2)/2, and may be expressed by the equation (17).

Figure 28:
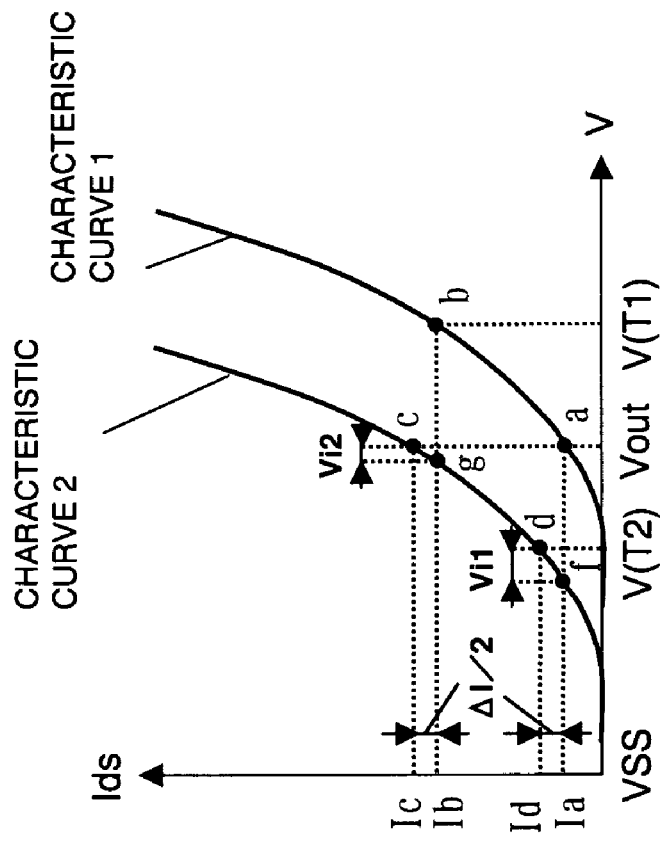
FIG. 28 is a graph for illustrating the operation of the circuit of FIG. 16 for the case of variations in the current of current sources.

FIG. 28 shows the operation of the circuit of FIG. 16 (the operation when the current value of the current source 114 is higher by ΔI than that of the current source 113). If it is assumed that the currents at the four operation points a, b, c and d are maintained in the relationship of the equation (15) and the definition of the points of intersection f and g is as in FIG. 25, the operation points and the points of intersection are determined as shown in FIG. 28. In this case, the operation points and the points of intersection a, b, c, d, f and g are in the same position relationships as those for the operation points and the points of intersection b, a, d, c, g and f of FIG. 25. The potential difference between the operation point d and the point of intersection f of FIG. 28 is approximately Vi1, while that between the operation point c and the point of intersection g is approximately Vi2.

Thus, as in FIG. 25, the output voltage Vout is an intermediate voltage between V(T1) and V(T2) less (Vi1−Vi2)/2, and may be expressed by the equation (16).

As described above, with the differential amplifier of FIG. 3, the output voltage Vout during the first and second time periods of FIG. 4 is represented by the equations (17) and (16), respectively, in case there are variations between the current at the current source 113 and that at the current source 114. That is, the output voltage has offsets of +(Vi1−Vi2)/2 and −(Vi1−Vi2)/2.

However, by repeating the first and second time periods of FIG. 4 at preset cycles, the output offsets are time-averaged and become effectively equivalent to the equation (4).

The operation for the case where V(T1)≦V(T2) may readily be derived from the graph illustrating the operation. The output voltage Vout during the first and second time periods has offsets equal in magnitude but opposite in polarity.

Hence, by repeating the first and second time periods at preset cycles, the output offsets are time-averaged and become effectively equivalent to the equation (4), thus enabling an output voltage to be output with high accuracy.

The operation of the differential amplifier of FIG. 5 canceling out the output offset, ascribable to variations between the current at the current source 113 and that at the current source 114, will now be described.

The on/off control of the switches of the differential amplifier of FIG. 5 is similar to that shown in FIG. 6, that is, the first and second time periods are changed over at preset cycles. The equivalent circuits of the differential amplifier of FIG. 5 during the first and second time periods are as shown in FIGS. 13 and 16, respectively.

The operation during the first time period of the differential amplifier of FIG. 5 is similar to the operation of FIG. 25 regarding the circuit of FIG. 13, whilst the operation thereof during the second time period is similar to the operation of FIG. 28 regarding the circuit of FIG. 16.

As described above, the output voltages Vout during the first and second time periods may be expressed by the equation (16), and have an offset of −(Vi1−Vi2)/2.

Thus, with the differential amplifier of FIG. 5, the output offsets during the first and second time periods are the same in polarity and magnitude, so that, even when the first and second time periods are changed over at preset cycles, the output offset cannot be canceled out.

The operation of the differential amplifier of FIG. 7 canceling out the output offset, ascribable to variations between the current at the current source 113 and that at the current source 114, will now be described. The on/off control of the switches of the differential amplifier of FIG. 7 is similar to that shown in FIG. 8, that is, the first and second time periods are changed over at preset cycles. The equivalent circuits of the differential amplifier of FIG. 7 during the first and second time periods are as shown in FIGS. 15 and 14, respectively.

The operation during the first time period of the differential amplifier of FIG. 7 is similar to the operation of FIG. 27 regarding the circuit of FIG. 15, whilst the operation thereof during the second time period is similar to the operation of FIG. 26 regarding the circuit of FIG. 14.

As described above, the output voltages Vout during the first and second time periods may be expressed by the equation (17), and have an offset of +(Vi1−Vi2)/2.

Thus, with the differential amplifier of FIG. 7, the output offsets during the first and second time periods are the same in polarity and magnitude, so that, even when the first and second time periods are changed over at preset cycles, the output offset cannot be canceled out.

The operation in case there are variations between the input and output currents of the current mirror (111, 112) will now be described. For simplicity of description, it is assumed that there are no variations in transistors other than the current mirror (111, 112), and that the definitions of the operation points a, b, c and d of the transistors 101 to 104, the points of intersection f, g, h and j and the currents (drain-to-source currents) Ia, Ib, Ic and Id are the same as those in FIGS. 25 to 28. The graphs stand for the case where the relationship between V(T1) and V(T2) is such that V(T1)≧V(T2).

If, due to variations in characteristics of at least one of the transistors 111 and 112, the drain-to-source current of the transistor 112 is higher by ΔI than that of the transistor 111, the relationship between the currents is expressed by the following equation (18):

$$Ia+Ic=Ib+Id-\Delta I \tag{18}$$

The relationship for the currents of the current sources 113 and 114 is the same as that by the equation (5). Hence, from the equations (5) and (18), the following equation (19) is derived:

$$Ia=Id-\Delta I/2$$

$$Ib=Ic+\Delta I/2 \tag{19}$$

That is, the relationship of the equation (19) is valid for the differential amplifiers of FIGS. 1, 3, 5 and 7.

Initially, the operation of the differential amplifier of FIG. 1 canceling out the output offset ascribable to variations in current values between the input/output currents flowing through the current mirror (111, 112) will be described. The on/off control of the switches of the differential amplifier of FIG. 1 is similar to that shown in FIG. 2, that is, the first and second time periods are changed over at preset cycles. The equivalent circuits of the differential amplifier of FIG. 1 during the first and second time periods are as shown in FIGS. 13 and 14.

Figure 29:
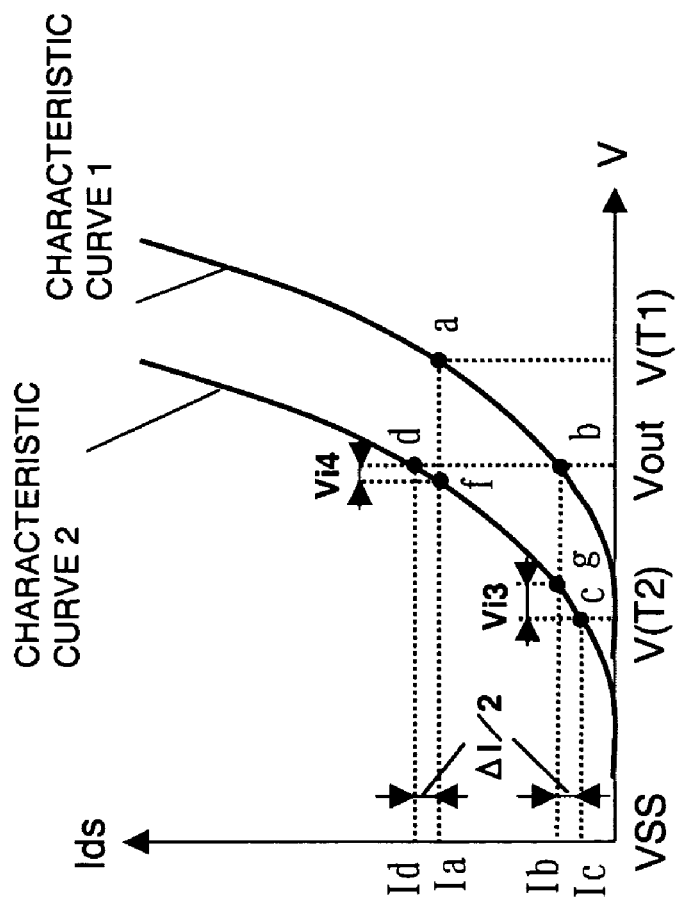
FIG. 29 is a graph for illustrating the operation of the circuit of FIG. 13 for the case of variations in the current of a current mirror.

FIG. 29 shows the operation of the circuit of FIG. 13 (operation where the output current of the transistor 112 is higher by ΔI than the output current of the transistor 111). In case the relationship of the equation (19) is maintained between the currents at the four operation points a, b, c and d, the operation points and the points of intersection are determined as shown in FIG. 29. Let the potential difference between the operation point c and the point of intersection g be Vi3 and let the potential difference between the operation point d and the point of intersection f be Vi4. Since the line segment af is equal to the line segment bg, the output voltage Vout is an intermediate voltage of V(T1) and V(T2) plus (Vi3+Vi4)/2, and may be expressed by the following equation:

$$Vout=\{V(T1)+V(T2)+(Vi3+Vi4)\}/2 \tag{20}$$

Figure 30:
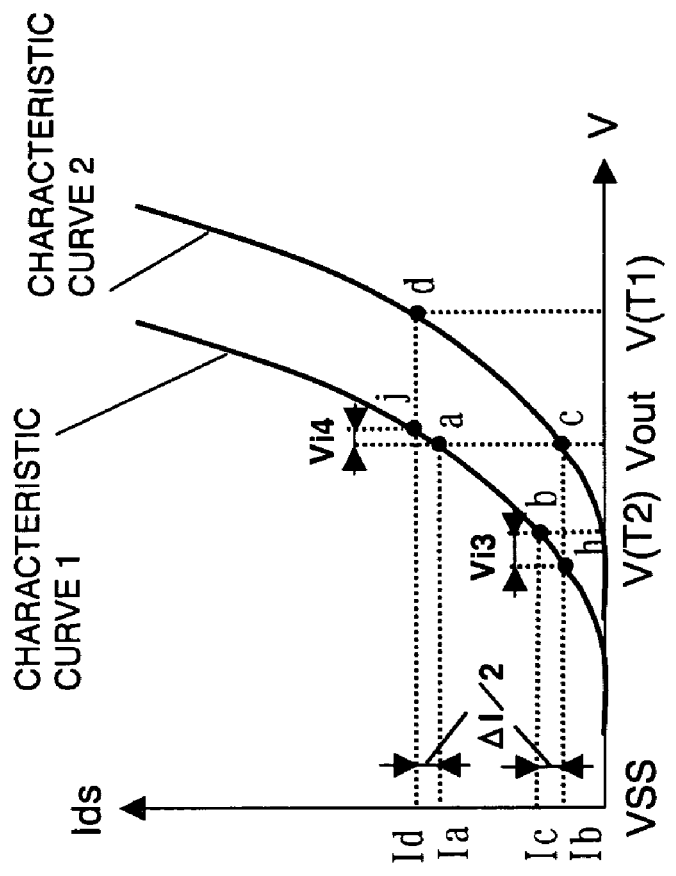
FIG. 30 is a graph for illustrating the operation of the circuit of FIG. 14 for the case of variations in the current of the current mirror.

FIG. 30 shows an operation of the circuit of FIG. 14 (the operation in which the output current of the transistor 112 is higher by ΔI than the output current of the transistor 111). In case the relationship of the equation (19) is maintained between the currents at the four operation points a, b, c and d, the operation points and the points of intersection are determined as shown in FIG. 30.

The potential difference between the operation point b and the point of intersection j is approximately Vi3 and that between the operation point a and the point of intersection j is approximately Vi4. Since the line segment ch is equal to the line segment dj, the output voltage Vout is an intermediate voltage of V(T1) and V(T2) minus (Vi3+Vi4)/2, and may be expressed by the following equation:

$$Vout=\{V(T1)+V(T2)-(Vi3+Vi4)\}/2 \tag{21}$$

It is noted however that the values of the output offset (Vi3+Vi4)/2 of the equations (20) and (21) are not precisely equal to each other. The reason is that, even though the relationship of the equation (19) is maintained in FIGS. 29 and 30, there is slight deviation in the values of Ids at the respective operation points. However, the value of the current Ids at each operation point in the operation of FIGS. 29 and 30 is offset only slightly such that the respective output offsets may be deemed to be of an approximately equal value (Vi3+Vi4)/2.

As described above, if there are variations in current values between the input and output currents flowing through the current mirror (111, 112), in the differential amplifier of FIG. 1, the output voltages Vout during the first and second time periods of FIG. 2 have offsets of +(Vi3+Vi4)/2 and −(Vi3+Vi4)/2 as shown by the equations (20) and (21), respectively.

However, by repeating the first and second time periods of FIG. 2 at preset cycles, the output offsets are time-averaged and become effectively equivalent to the equation (4).

The operation for the case where $V(T1) \leq V(T2)$ may readily be derived from the graph illustrating the operation. The output voltages Vout during the first and second time periods have offsets equal in magnitude but opposite in polarity, even though the operation points, the signs or the magnitudes of the offsets differ from those for the case of $V(T1) \geq V$ (T2).

Hence, the output offsets may be time-averaged, by repeating the first and second time periods at preset cycles, and effectively become equivalent to the equation (4).

Consequently, the differential amplifier of FIG. 1 is able to obtain an output voltage with high accuracy even though there are variations in current values between the input and output currents flowing through the current mirror (111, 112).

The operation of the differential amplifier of FIG. 3 canceling out the output offset ascribable to an offset between the input and output currents flowing through the current mirror (111, 112) will now be described. The on/off control of the switches of the differential amplifier of FIG. 3 is similar to that shown in FIG. 4, that is, the first and second time periods are changed over at preset cycles. The equivalent circuits of the differential amplifier of FIG. 3 during the first and second time periods are as shown in FIGS. 15 and 16.

Figure 31:
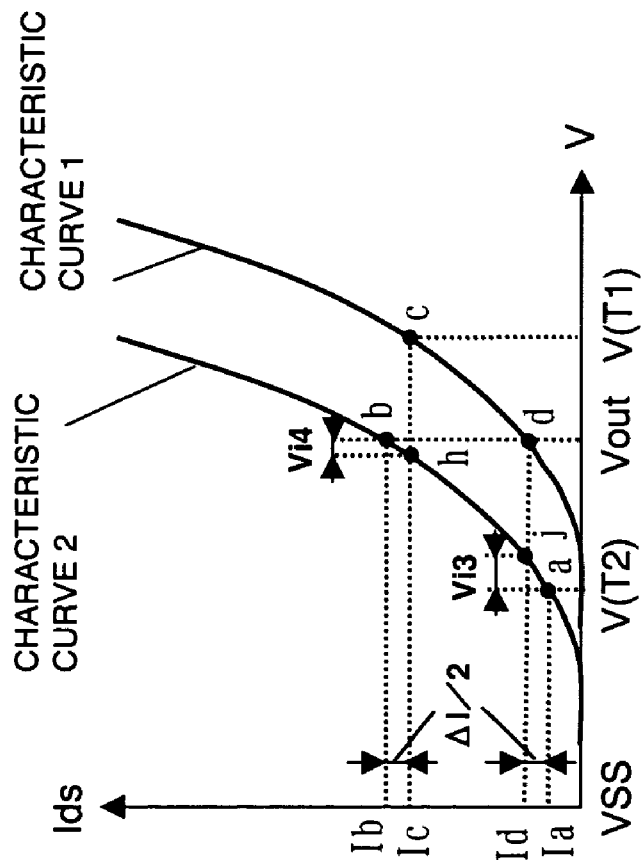
FIG. 31 is a graph for illustrating the operation of the circuit of FIG. 15 for the case of variations in the current of current mirror.

FIG. 31 shows the operation of the circuit of FIG. 15 (operation where the current value of the transistor 112 is higher by ΔI than the output current of the transistor 111).

If the relationship of the equation (19) is maintained between the currents at the four operation points a to d, the operation points and the points of intersection are determined as shown in FIG. 31. In this case, the operation points and the points of intersection a, b, c, d, h and j are in the same position relationships as those for the operation points and the points of intersection c, d, a, b, g and f of FIG. 29. The potential difference between the operation point a and the point of intersection j of FIG. 31 is Vi3, while the potential difference between the operation point b and the point of intersection h is Vi4.

Thus, as in FIG. 29, the output voltage Vout is an intermediate voltage between V(T1) and V(T2) plus (Vi3+Vi4)/2, and may be expressed by the equation (20).

Figure 32:
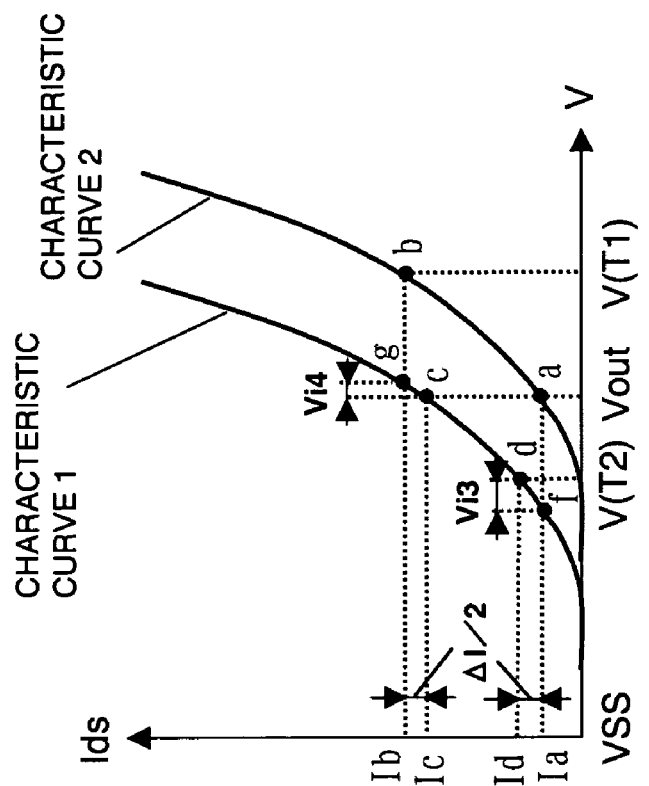
FIG. 32 is a graph for illustrating the operation of the circuit of FIG. 16 for the case of variations in the current of current mirror.

FIG. 32 shows the operation of the circuit of FIG. 16 (the operation in which the output current of the transistor 112 is higher by ΔI than the output current of the transistor 111). When the relationship of the equation (19) is maintained for the currents at the four operation points a, b, c and d, the operation points and the points of intersection are determined as shown in FIG. 32.

In this case, the operation points and the points of intersection a, b, c, d, f and g are in the same position relationships as those for the operation points and the points of intersection c, d, a, b, h and j of FIG. 30. The potential difference between the operation point d and the point of intersection f of FIG. 32 is approximately Vi3, while that between the operation point c and the point of intersection g is approximately Vi4. Consequently, as in FIG. 30, the output voltage Vout is an intermediate voltage between the voltages V(T1) and V(T2) less (Vi3+Vi4)/2, and may be expressed by the equation (21).

If, as described above, the differential amplifier of FIG. 3 has an offset between the input and output currents flowing through the current mirror (111, 112), the output voltage Vout during the first time period and that during the second time period of FIG. 4 are represented by the equations (20) and (21), respectively. That is, the output voltage is subjected to offset of +(Vi3+Vi4)/2 or −(Vi3+Vi4)/2.

However, the above output offset is time-averaged by repeating the first and second time periods of FIG. 4 at preset cycles, and becomes effectively equivalent to the equation (4), to enable an output voltage to be output with high accuracy.

The operation for the case where $V(T1) \leq V(T2)$ may readily be derived from the graph illustrating the operation. The output voltages Vout during the first and second time periods have offsets equal in magnitude but opposite in polarity.

Hence, the output offsets may be time-averaged, by repeating the first and second time periods at preset cycles, and effectively become equivalent to the equation (4). Consequently, the differential amplifier of FIG. 3 is able to obtain an output voltage with high accuracy.

The operation of the differential amplifier of FIG. 5 canceling out the output offset ascribable to an offset between the input and output currents flowing through the current mirror (111, 112) will now be described. The method for on/off control of the switches of the differential amplifier of FIG. 5 is similar to that shown in FIG. 6, that is, the first and second time periods are changed over at preset cycles. The equivalent circuits of the differential amplifier of FIG. 5 during the first and second time periods are as shown in FIGS. 13 and 16.

The operation during the first time period of the differential amplifier of FIG. 5 is similar to the operation of FIG. 29 regarding the circuit of FIG. 13, whilst the operation thereof during the second time period is similar to the operation of FIG. 32 regarding the circuit of FIG. 16. The output voltages Vout during the first and second time periods are expressed by the equations (20) and (21), as described above.

Hence, with the differential amplifier of FIG. 5, the output offset is time-averaged by repeating the first and second time periods at preset cycles, and becomes effectively equal to the equation (4) to enable an output voltage to be output with high accuracy.

The operation of the differential amplifier of FIG. 7 canceling out the output offset ascribable to an offset between the input current and the output current flowing through the current mirror (111, 112) will now be described. The on/off control of the respective switches of the differential amplifier of FIG. 7 is as shown in FIG. 8, that is, the first and second time periods are switched at preset cycles. The equivalent circuits of the differential amplifier of FIG. 7 during the first and second time periods are as shown in FIGS. 15 and 14, respectively.

The operation during the first time period of the differential amplifier of FIG. 7, that is, the operation in case the output current of the transistor 112 is higher by ΔI than the output current of the transistor 111, is similar to the operation of FIG. 31 for the circuit of FIG. 15. The operation during the second time period is similar to the operation of FIG. 30 for the circuit of FIG. 14, that is, the operation in case the output current of the transistor 112 is larger by ΔI than the output current of the transistor 111.

As described above, the output voltages Vout during the first and second time periods may be expressed by the equations (20) and (21), respectively.

Hence, the output offsets may be time-averaged, by repeating the first and second time periods at preset cycles, and may effectively become equivalent to the equation (4), thus enabling an output voltage to be output with high accuracy.

As described above, the differential amplifier of FIG. 1 or 3 is able to cancel out the output offset ascribable to variations between the currents at the current sources 113 and 114 or to an offset between the input current and the output current flowing through the current mirror (111, 112), thus enabling an output voltage to be output with high accuracy.

On the other hand, the differential amplifier of FIG. 5 or 7 is able to cancel out the output offset, ascribable to an offset between the input current and the output current flowing through the current mirror (111, 112), however, it is unable to cancel out the output offset ascribable to an offset between the currents flowing through the current sources 113 and 114.

The differential amplifiers of FIGS. 1, 3, 5 and 7 may be selectively used, depending on the degree of variations between the currents flowing through the current sources 113 and 114 or on the deviations between the input current and the output current flowing through the current mirror (111, 112), thus enabling an output voltage to be output with high accuracy.

Figure 9:
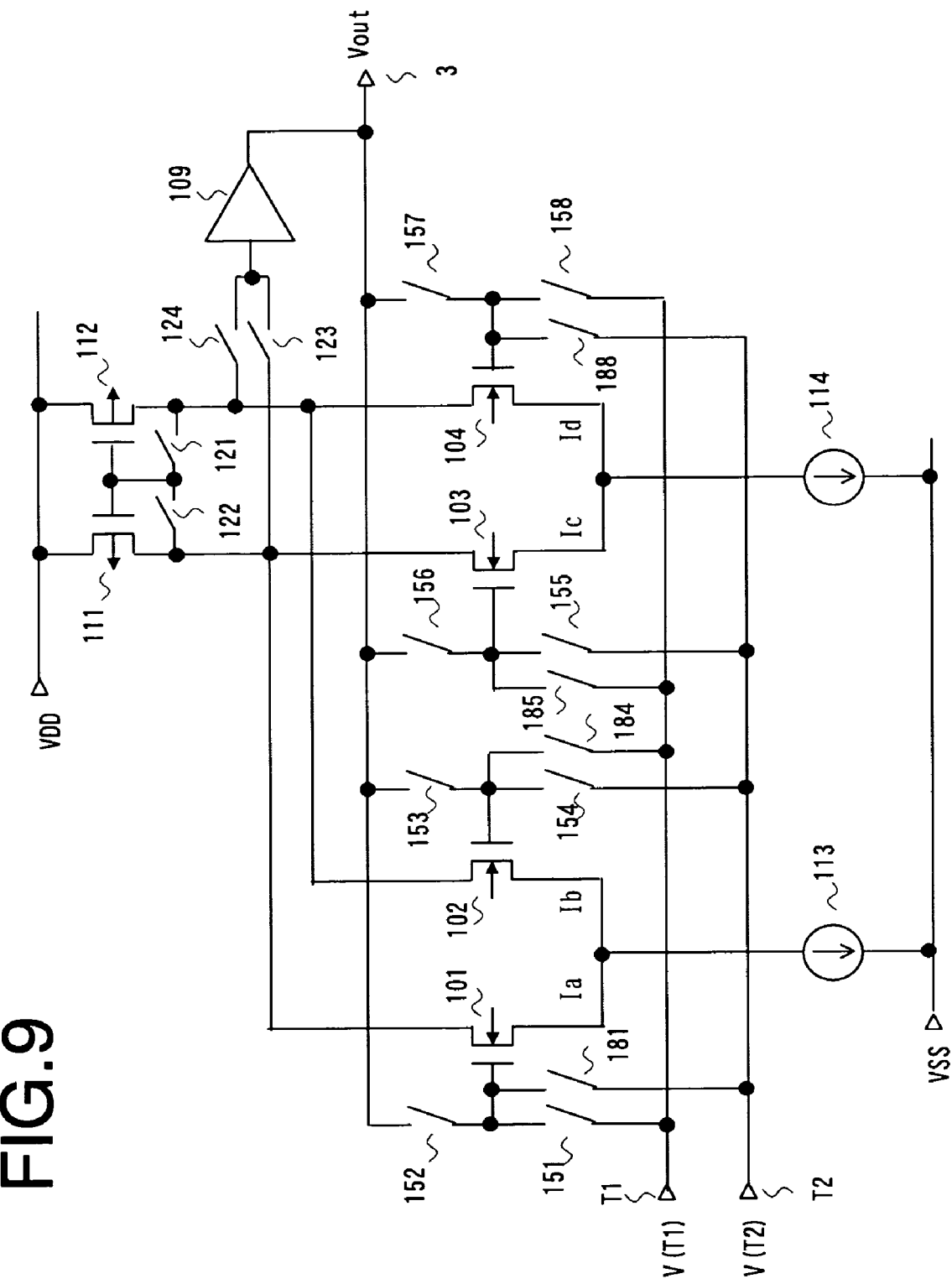
FIG. 9 is a diagram showing a differential amplifier according to a fifth embodiment of the present invention.

FIG. 9 shows a differential amplifier of a fifth embodiment of the present embodiment. Referring to FIG. 9, the differential amplifier of the present embodiment corresponds to a differential amplifier of FIG. 1 added by switches 181, 184, 185 and 188.

The switches 181, 184, 185 and 188 are provided between the terminal T2 and the gate of the transistor 101, between the terminal T1 and the gate of the transistor 102, between the terminal T1 and the gate of the transistor 103 and between the terminal T2 and the gate of the transistor 104.

FIG. 10 shows the method for on/off control of the respective switches of the differential amplifier of FIG. 9.

For the first time period, the switches 121, 123, 153 and 157 are in an on state, while the switches 122, 124, 152 and 156 are in an off state, the switches 151, 155 are in an on state and the switches 154, 158, 181, 185, 184 and 188 are in an off state. In this case, the differential amplifier is shown by an equivalent circuit of FIG. 13.

For the second time period, the switches 121, 123, 153 and 157 are in an off state, while the switches 122, 124, 152 and 156 are in an on state, the switches 151, 155 are in an off state and the switches 154, 158 are in an on state and the switches 181, 185, 184 and 188 are in an off state. In this case, the differential amplifier is shown by an equivalent circuit of FIG. 14.

For the third time period, the switches 121, 123, 153 and 157 are in an on state, while the switches 122, 124, 152 and 156 are in an off state, the switches 151, 155, 154, 158 are in an off state, the switches 181, 185 are in an on state and the switches 184 and 188 are in an off state. In this case, the differential amplifier is shown by an equivalent circuit of FIG. 15.

For the fourth time period, the switches 121, 123, 153 and 157 are in an off state, while the switches 122, 124, 152 and 156 are in an on state, the switches 151, 155, 154, 158, 181 and 185 are in an off state and the switches 184 and 188 are in an on state. In this case, the differential amplifier is shown by an equivalent circuit of FIG. 16.

The first to fourth time periods are changed over at preset cycles. The differential amplifier of FIG. 9 during the first to fourth time periods is shown by equivalent circuits shown in FIGS. 13 to 16, respectively.

With the differential amplifier of FIG. 9, the four equivalent circuits undergo periodical switching, so that, by the operation as described with reference to FIGS. 17 to 32, it is possible to cancel out the output offset ascribable to variations in transistor characteristics, thus enabling an output voltage to be output with high accuracy. Meanwhile, the sequence of the first to fourth time periods is arbitrary.

The differential amplifier of FIG. 9 is able to issue a voltage output to the utmost accuracy. However, the number of switches or control signals and the circuit size in this differential amplifier are larger than those of the differential amplifiers of FIGS. 1, 3, 5 and 7. It is therefore desirable that these differential amplifiers shall be selectively used in dependence upon the voltage accuracy needed or the upon the available chip area.

Figure 11:
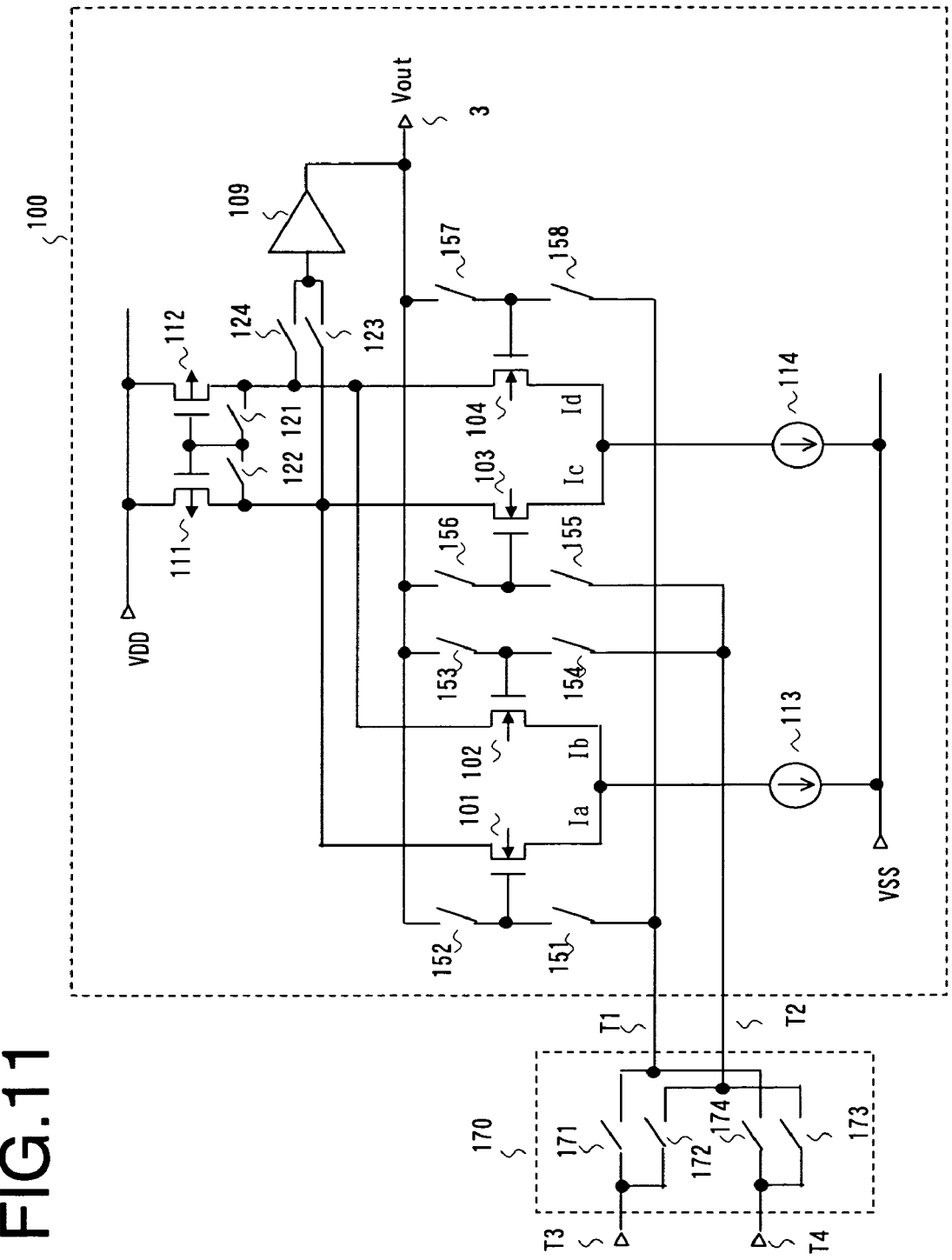
FIG. 11 is a diagram showing a modification of the differential amplifier shown in FIG. 9.

FIG. 11 shows a modification of the differential amplifier of FIG. 9. The differential amplifier of FIG. 11 corresponds to a differential amplifier 100 of FIG. 1, to input terminals T1 and T2 of which is added an input control circuit 170. The input control circuit 170 includes terminals T3 and T4, for receiving the voltages V(T3) and V(T4), respectively, a switch 171 for connecting the terminal T3 to the terminal T1, a switch 172 for connecting the terminal T3 to the terminal and T2, a switch 174 for connecting the terminal T4 to the terminal T1 and a switch 173 for connecting the terminal T4 to the terminal T2.

FIG. 12 shows a method for on/off control of respective switches of the differential amplifier shown in FIG. 11. During the first time period, the switches 121, 123, 151, 153, 155 and 157 are in an on state, the switches 122, 124, 152, 154 and 158 are in an off state, the switches 171, 173 are in an on state and the switches 172, 174 are in an off state. During the second time period, the switches 121, 123, 151, 153, 155 and 157 are in an off state, the switches 122, 124, 152, 154 and 158 are in an on state, the switches 171, 173 are in an on state and the switches 172, 174 are in an off state. During the third time period, the switches 121, 123, 151, 153, 155 and 157 are in an on state, the switches 122, 124, 152, 154 and 158 are in an off state, the switches 171, 173 are in an off state and the switches 172, 174 are in an on state. During the fourth time period, the switches 121, 123, 151, 153, 155 and 157 are in an off state, the switches 122, 124, 152, 154 and 158 are in an on state, the switches 171, 173 are in an off state and the switches 172, 174 are in an on state.

The first to fourth time periods are changed over at preset cycles. The on/off control of the first and second time periods and that of the third and fourth time periods of respective switches (switches 121 to 124 and 151 to 158) of the differential amplifier 100 corresponds to two terminals of the on/off control of the first and second time periods of FIG. 2. That is, the differential amplifier 100 may be of the same configuration and of the same switch control as those of the differential amplifier of FIG. 1.

The respective switches of the input control circuit 170 are controlled so that, during the first and second time periods, the switches 171 and 173 are in an on state and the switches 172 and 174 are in an off state to supply the voltages V(T3) and V(T4) to the terminals T1 and T2, respectively, and so that, during the third and fourth time periods, the switches 171 and 173 are in an off state and the switches 172 and 174 are in an on state to supply the voltages V(T4) and V(T3) to the terminals T1 and T2, respectively.

By so doing, the equivalent circuits of the differential amplifier of FIG. 11 during the first, second, third and fourth time periods are as shown in FIGS. 13, 14, 15 and 16, provided that V(T1) and V(T2) in these figures are replaced by V(T3) and V(T4), respectively. With the differential amplifier of FIG. 11, the four equivalent circuits are changed over periodically, so that, by the operation explained with reference to FIGS. 17 to 32, the output offset, ascribable to variations of transistor characteristics, may be canceled to enable an output voltage to be output with high accuracy.

The meritorious effect of the differential amplifier of FIG. 11, as compared to the differential amplifier shown in FIG. 9, is that the number of control signals may be reduced.

However, even with the differential amplifier of FIG. 11, the number of switches and control signals and the circuit area are larger than those of the differential amplifiers of FIGS. 1, 3, 5 and 7. It is therefore preferred that the differential amplifiers shall be used selectively depending on the voltage accuracy needed or on the chip area desired.

In FIG. 11, the differential amplifier of FIG. 1 is used as the differential amplifier 100. However, the differential amplifier shown in FIG. 3, 5 or 7 may, of course, be used. The switch control for these differential amplifiers, shown in FIGS. 4, 6 and 8, may also be used unchanged.

The differential amplifiers, described above with reference to FIGS. 1, 3, 5, 7, 9 and 11, are provided with two differential pairs formed by n-channel transistors. The same meritorious effects may, of course, be achieved with the use of a differential amplifier provided with two differential pairs, formed by p-channel transistors, or a rail-to-rail differential amplifier provided with a differential pair formed by n-channel transistors and a differential pair formed by p-channel transistors.

Figure 35:
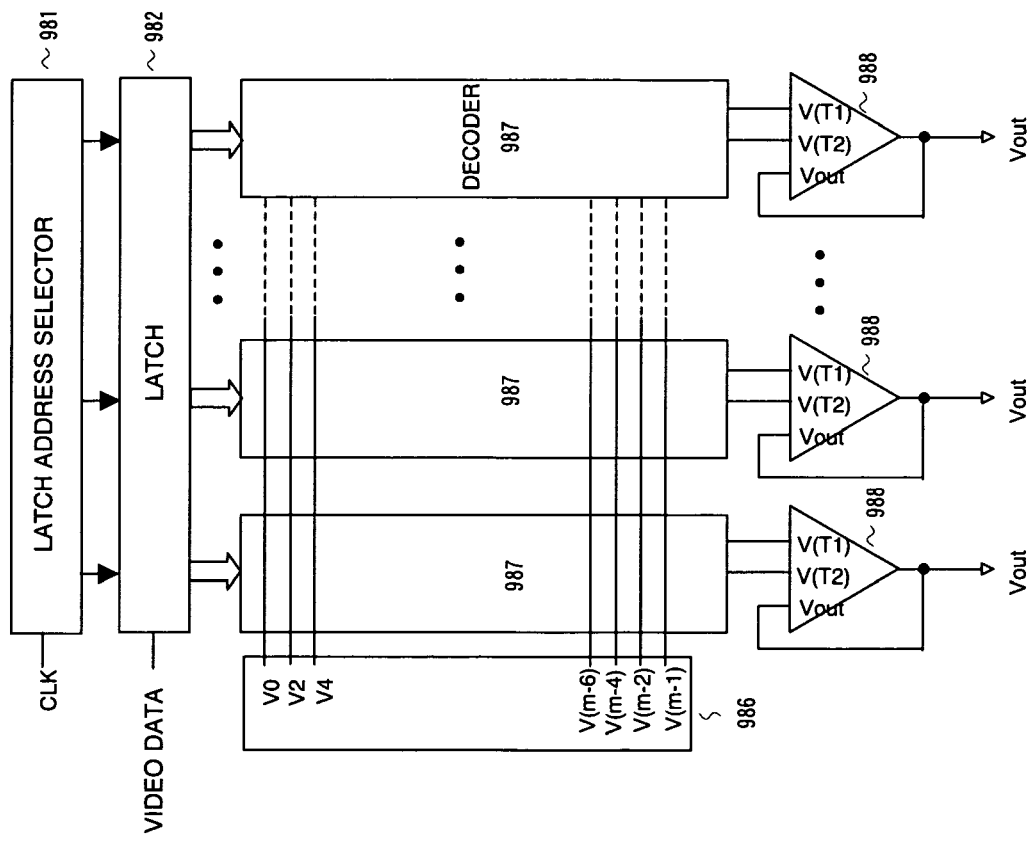
FIG. 35 is a diagram corresponding to FIG. 16 of Patent Document 1 and showing an illustrative configuration of a data driver proposed in the Patent Document 1.

Each of the above-described differential amplifiers may be used as an amplifier circuit 988 for a data driver shown in FIG. 35.

With the use of the differential amplifier of the present embodiment, an output voltage may be output with high accuracy even in case of a large voltage difference between two voltage supplied to the differential amplifier. Moreover, an output offset can be canceled in case the threshold values or the inclination of the characteristic curves of the transistors are subjected to variations. Hence, with a low-order gray scale or a high-order gray scale, with a larger voltage difference between the gray scale levels, the number of decoder devices may be reduced to reduce the chip area of the data driver.

The switching method of a comparative embodiment will now be described. The comparative embodiment represents an undesirable switching method. If, in the above-described differential amplifiers, two connecting states, for example, the equivalent circuits shown in FIGS. 13 and 15, are switched periodically, the output offset can scarcely be canceled. It is because the direction of the output offset becomes equal in case the threshold values or the inclination of the characteristic curves of the transistors of the differential pairs are subjected to variations or in case the input current and the output current of the current mirror (111, 112) have been deviated from each other.

The same may be said of the switching of the equivalent circuits of FIGS. 14 and 16.

That is, two connecting states may periodically be switched only as proposed by the present invention, if the output offset is to be canceled effectively.

Figure 33:
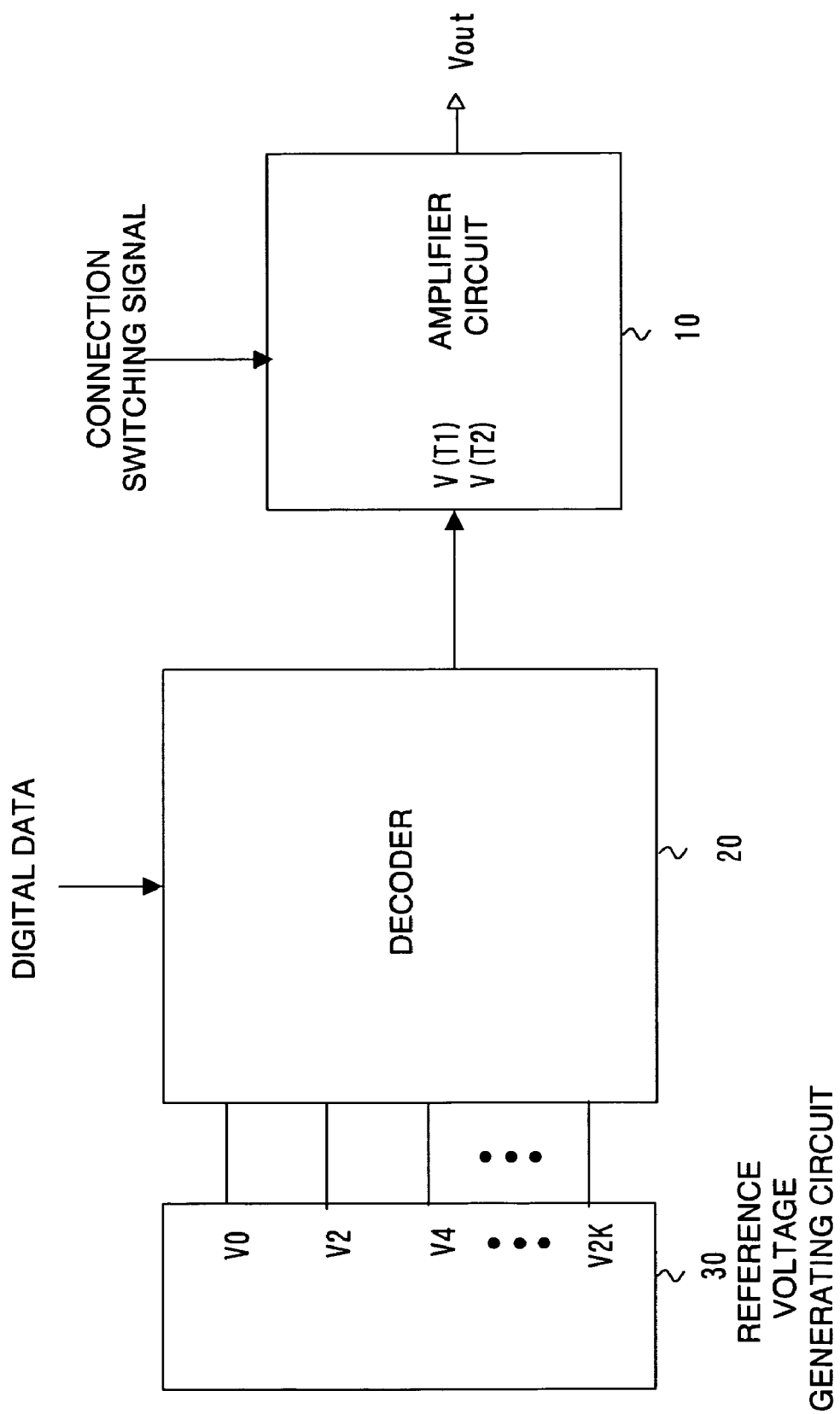
FIG. 33 is a diagram showing the configuration of a digital-to-analog converter employing a differential amplifier of the present invention.

FIG. 33 shows the configuration of an embodiment of a digital-to-analog converter employing the differential amplifier according to the present invention. Specifically, FIG. 33 depicts the configuration of principal functional blocks.

Referring to FIG. 33, this digital-to-analog converter includes a reference voltage generating circuit 30, a decoder 20 and an amplifier circuit 10.

The amplifier circuit 10 uses any of the differential amplifiers shown in FIGS. 1, 3, 5, 7, 9 and 11. The amplifier circuit 10 receives a connection switching signal which controls the switches of the differential amplifiers to switch between the respective time periods of FIGS. 2, 4, 6, 8, 10 and 12, associated with the respective differential amplifiers, at preset cycles.

In this manner, the amplifier circuit 10 is able to amplify and output a voltage which interiorly divides the two input voltages V(T1) and V(T2) at a ratio of 1:1. In addition, the amplifier circuit is able to cancel out an output offset ascribable to variations in transistor characteristics to obtain an output voltage with high accuracy even in case of a large voltage difference between the voltages V(T1) and V(T2). Meanwhile, if the amplifier circuit 10 is the differential amplifier of FIG. 11, the two input voltages are V(T3) and V(T4).

The reference voltage generating circuit 30 generates (K+1) reference voltages $V_0, V_2, V_4, \ldots, V_{2K}$, corresponding to every two gray scale levels of the gray scale voltage, to output the so generated reference voltages to the decoder 20.

The decoder 20 receives digital data and, depending on the digital data received, selects two voltages, to output the selected voltages as V(T1) and V(T2) to the amplifier circuit 10. Meanwhile, the two voltages V(T1) and V(T2), selected by the decoder 20, may be selected simultaneously, that is, in parallel, or sequentially, that is, in cascade. It is noted that, during the time the amplifier circuit 10 outputs a voltage corresponding to digital data, the two voltages V(T1) and V(T2) must be supplied to respective non-inverting input ends of the two differential pairs (101, 102) and (103, 104) of the amplifier circuit 10.

The digital-to-analog converter, shown in FIG. 33, is able to output (2K+1) voltage levels, at the maximum, for the (K+1) reference voltages, responsive to the digital data.

The number of the reference voltages, generated by the reference voltage generating circuit 30, is small, as compared to the number of the output voltages, as in FIG. 35. Hence, it is possible to implement an area-saving digital-to-analog converter.

In case the digital-to-analog converter, shown in FIG. 33, is applied to the data driver of the display of FIG. 35, a data driver can be implemented which is able to issue a voltage output more accurately than heretofore.

In the data driver, to which the digital-to-analog converter shown in FIG. 33 is applied, the connection switching signal supplied to each amplifier circuit 10, may be changed over at a rate equal to an integer number multiple of an image picture rewrite period of the display (frame cycle) or to an integer number multiple of a data line rewrite period (line cycle). In this case, the display quality may be improved by averaging out the luminance of the display for the same video data at a rate equal to an integer number multiple of a rewrite period of an image picture. It is of course possible with the liquid crystal display to carry out switching similar to that for the Patent publication 2.

The connection switching signal may be changed over a plural number of times during one data period in which gray-scale voltage signal are supplied to the data lines. Since the data lines represent a high capacitive load, positive and negative offsets of smaller magnitudes, if applied alternately to the data lines, are mitigated and averaged out in the data lines, thereby improving the display quality.

Of course, the present invention may be applied not only to the liquid crystal display but also to any other suitable active matrix display controlling the luminance of pixels. As typical of this active matrix display is an organic EL (electroluminescence) display which has recently been put to practical use.

Figure 34B:
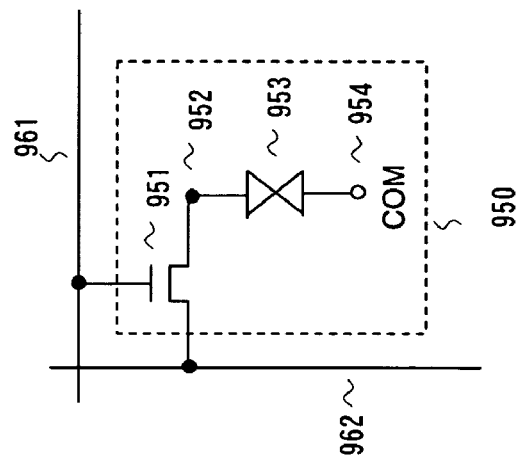
FIGS. 34A and 34B are diagrams showing a typical configuration of a display of the active matrix driving system.
Figure 34A:
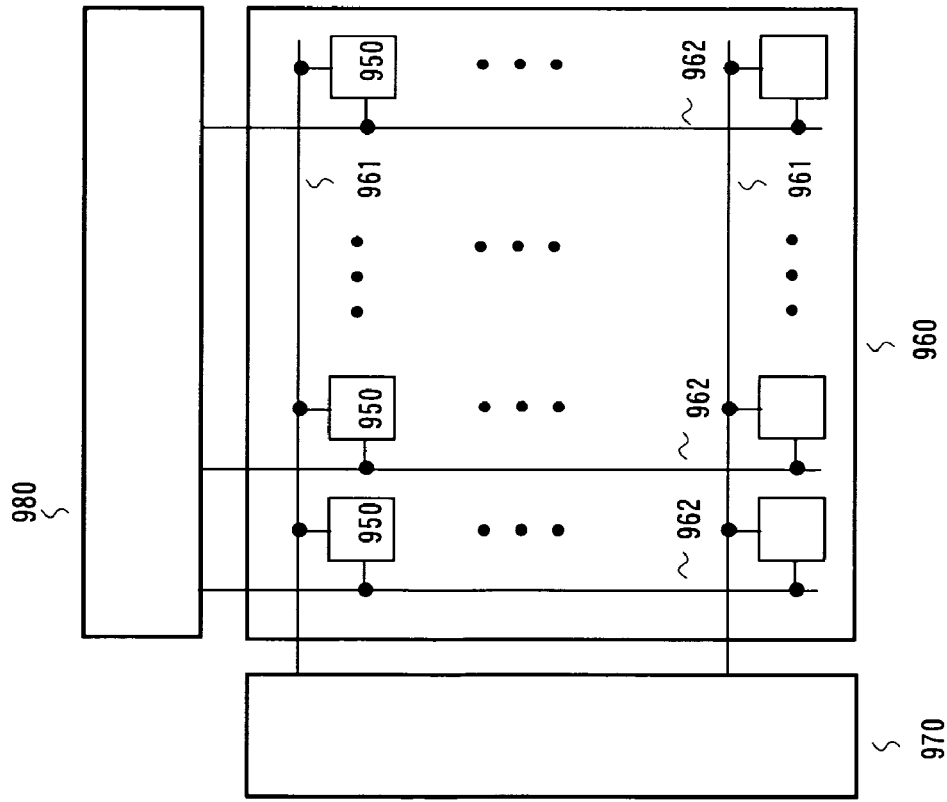
Figure 40:
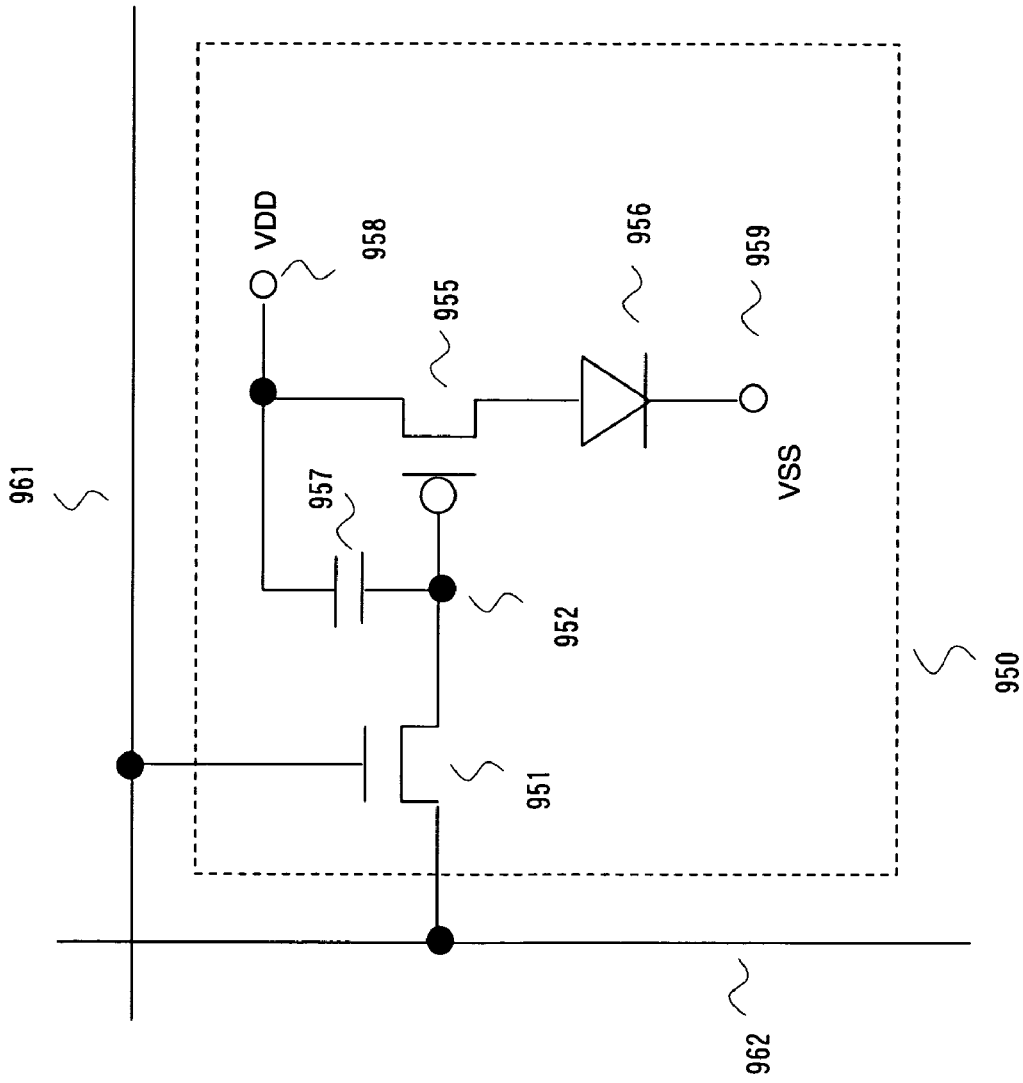
FIG. 40 is a diagram showing, by an equivalent circuit, the main configuration of a pixel part 950 (one pixel) in an EL display.

FIG. 40 schematically shows, by an equivalent circuit, the principal configuration of a pixel part 950 for one pixel in an EL display. If the pixel part 950 of FIG. 40 is applied to the pixel part 950 of FIG. 34A, then FIG. 34A illustrates the configuration of an EL display of the active matrix system.

In FIG. 40, the pixel part 950 is made up of thin-film transistors (TFTs) 951 and 955, an electrode terminal 952, an EL device (light emitting diode) 956, a capacitor 957 and power supply terminals 958 and 959. A display part of an organic EL display includes a substrate on which are layered the electrode, thin-film transistors (TFTs), and EL devices, formed by a thin film of an organic material. The TFT 951, as a switching device for connecting a data line 962 to the electrode terminal 952, has its control end connected to a gate line 961. Meanwhile, in FIG. 40, the functions of the TFT 951 and the electrode terminal 952 are the same as those of the pixel part of the liquid crystal display of FIG. 34B and hence the same reference numerals are used to depict the components. The TFT 955 and the EL device 956 are connected in series between the two power supply terminals 958 and 959, and the electrode terminal 952 is connected to a control terminal of the TFT 955. To the electrode terminal 952 is connected one end of a voltage holding capacitor 957, the other end of which is connected to a terminal capable of causing a constant current to flow through the TFT 955, specifically, to the power supply terminal or to the source terminal of the TFT 955.

The scheme for display is briefly as follows: The TFT 951, having the switching function, is on/off controlled by the scanning signal. When the TFT 951 is turned on, a gray-scale voltage signal, corresponding to a video data signal, is supplied to the pixel electrode 952 and applied to the control end of the TFT 955. The TFT 955 converts the gray-scale voltage signal into the current corresponding to the gray-scale voltage signal to control the luminance of light emitted by the EL device 956 having luminance characteristics in keeping with the current flowing therethrough. The holding capacitor 957 holds the potential of the pixel electrode 952, even after the TFT 951 is turned off, thereby holding the luminance of light emitted by the EL device 956 for a predetermined time to display an image.

FIG. 40 shows an example where the TFTs 951 and 955 are configured as an n-channel transistor and as a p-channel transistor, respectively. These TFTs may also be configured as transistors of the same polarity type. A switching TFT may also be provided in addition to the TFTs 951 and 955. While a variety of configurations for improving the performance have so far been proposed, only a basic configuration is shown in the foregoing description.

As described above, the differential amplifier of the present invention may be used as a data driver of an organic EL display, for demonstrating the meritorious effect comparable to that achieved with the liquid crystal display.

Figure 41:
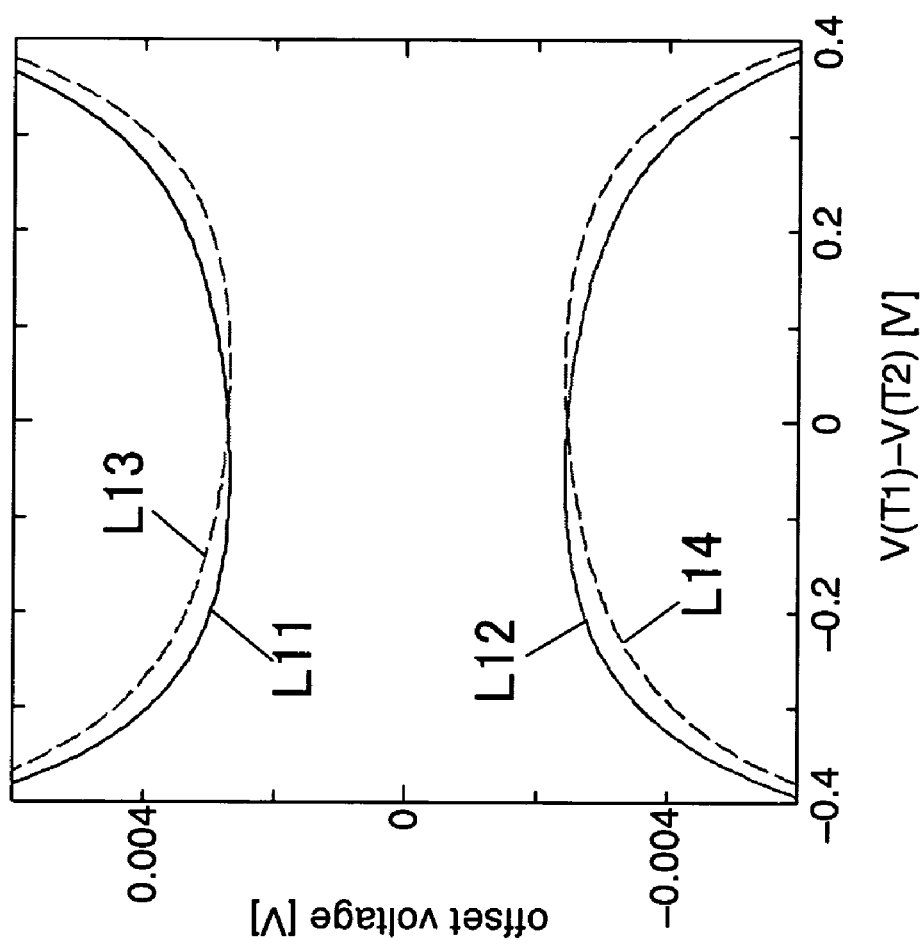
FIG. 41 is a graph showing the results of simulation carried out for confirming the effect of the present invention.
Figure 42:
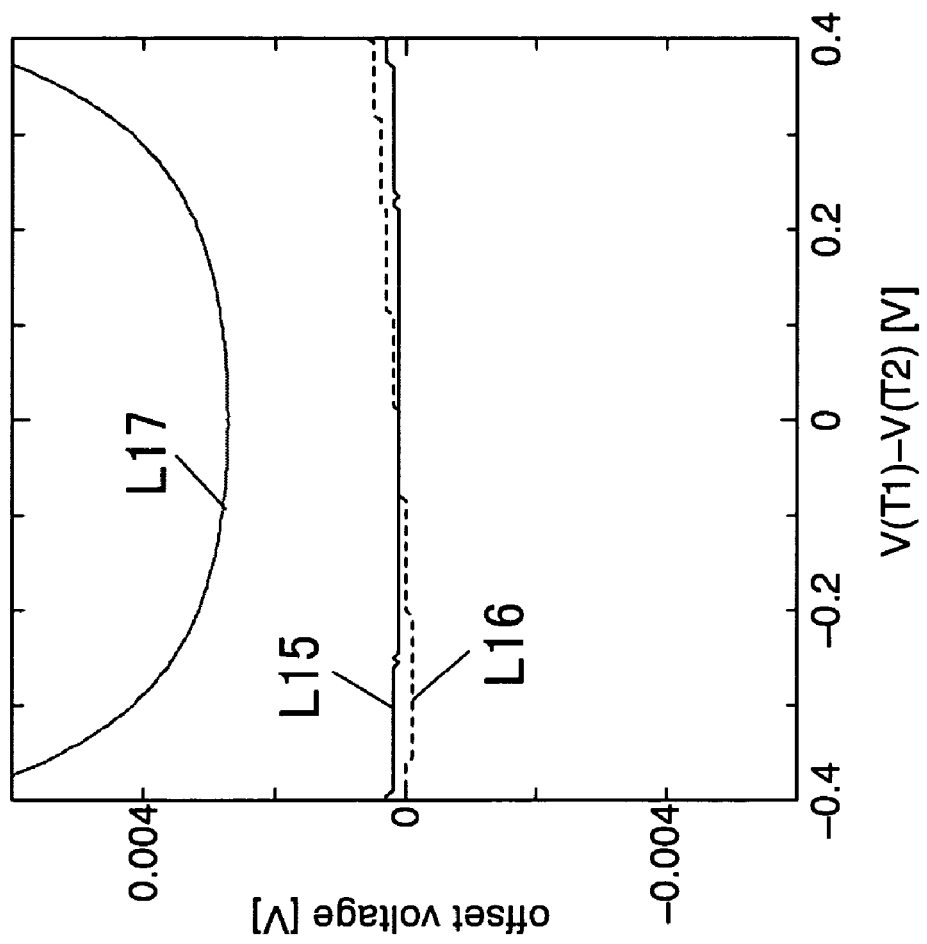
FIG. 42 is a graph showing the results of simulation carried out for confirming the effect of the present invention.

FIGS. 41 and 42 show the results of simulation carried out for confirming the meritorious effect of the present invention.

FIG. 41 shows the result of simulation for a case in which the channel width of only the transistor 104, out of the transistors 101 to 104 of two differential pairs, is decreased by 2%, for example, by 0.2 μm for a design channel width of 10 μm, and in which the channel width of the transistor 111 of the current mirror (111, 112), is decreased by 2% as compared to that of the transistor 112.

Thus, the inclination of the characteristic curve of the transistor 104 is decreased and the current at the transistor 112 is increased, as compared to the current at the transistor 111. The result is the operation described with reference to FIGS. 21 to 24 and 29 to 32.

FIG. 41 shows characteristic curves L11, L12, L13 and L14 for the output offset plotted against the voltage difference {V(T1)−V(T2)} between the voltages V(T1) and V(T2). These characteristic curves stand for the results in the equivalent circuits of FIGS. 13, 14, 15 and 16, respectively.

The characteristic curves for the output offset L11 to L14 show dependency of the voltage difference {V(T1)−V(T2)}. The reason is that, in FIGS. 21 to 24, the magnitudes of Vf1 and Vf2 depend on the voltage difference {V(T1)−V(T2)}, and that, in FIGS. 29 to 32, the magnitudes of Vi3 and Vi4 also depend on the voltage difference {V(T1)−V(T2)}.

In particular, the magnitude of Vi3 shows strong dependency on the voltage difference {V(T1)−V(T2)}. The reason is that, in FIGS. 29 to 32, when the voltage difference {V(T1)−V(T2)} becomes higher, the current value at the operation point of the differential transistor, supplied with the voltage V(T2), is decreased, with the inclination of the characteristic curve of the differential amplifier also becoming smaller, thus appreciably increasing the magnitude of Vi3.

FIG. 41 shows the result in case the transistors 104, 111 are subjected to variations in characteristics. If, in addition, other transistors are also subjected to variations, an amount of offset may become several times that shown in FIG. 41 at the maximum.

FIG. 42 shows the results of simulation in which the connection states of two of the equivalent circuits of FIGS. 13, 14, 15 and 16, with the offset of FIG. 41, are changed over at preset cycles to average out the offset. Specifically, FIG. 42 shows characteristic curves of the effective offset that may be obtained with the present invention.

The characteristic curve L15 shows the results of simulation for a case of switching of the connection states of the equivalent circuits of FIGS. 13 and 14, that is, averaging out the characteristic curves L11 and L12. That is, the characteristic curve L15 stands for the operation of the differential amplifier of FIG. 1.

The characteristic curve L16 shows the results of simulation for a case of switching of the connection states of the equivalent circuits of FIGS. 13 and 16, that is, averaging out the characteristic curves L11 and L14. That is, the characteristic curve L16 stands for the operation of the differential amplifier of FIG. 5.

The characteristic curve L17 shows the results of simulation for a case of switching of the connection states of the equivalent circuits of FIGS. 11 and 13, that is, averaging out the characteristic curves L11 and L13. That is, the characteristic curve L17 stands for the operation of a comparative example (undesirable switching operation).

It is seen from FIG. 42 that the offset of the characteristic curve L15 is smallest, with that of the characteristic curve L16 being also smaller. Conversely, the offset is scarcely suppressed for the characteristic curve L17.

The foregoing demonstrates offset suppressing effect by the differential amplifiers of FIGS. 1 and 5.

Meanwhile, the characteristic curve L16 has the offset slightly greater than that of the characteristic curve L15, due to the difference between Vf1 and Vf2 of FIGS. 19 and 22. The meritorious effect due to the operation by the differential amplifiers of FIGS. 3 and 7 is similar to that by the differential amplifiers of FIGS. 1 and 5.

Figure 36:
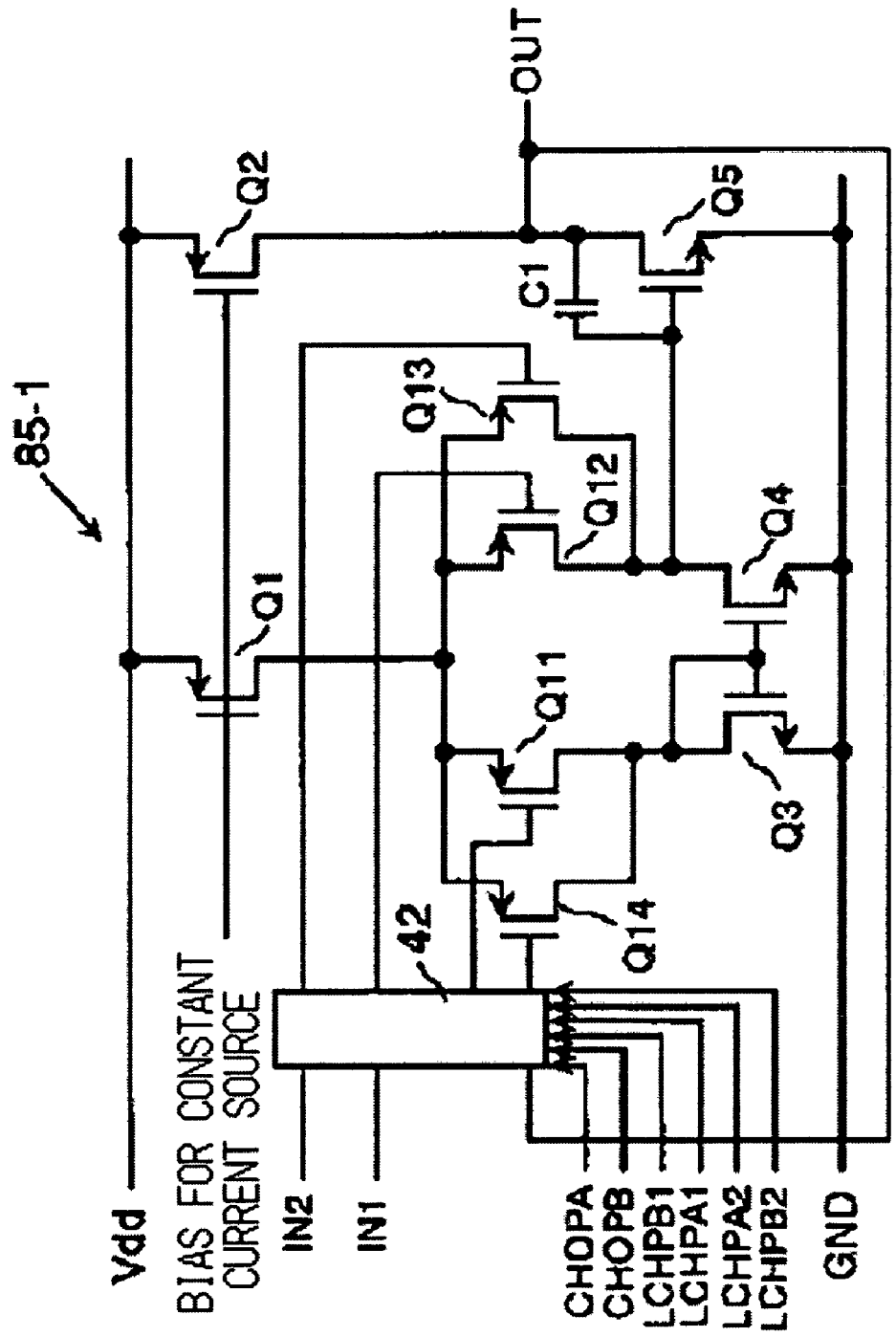
FIG. 36 is a diagram corresponding to FIG. 15 of Patent Document 3 and showing an illustrative configuration of an amplifier circuit of an output section of the data driver proposed in the Patent Document 3.
Figure 43:
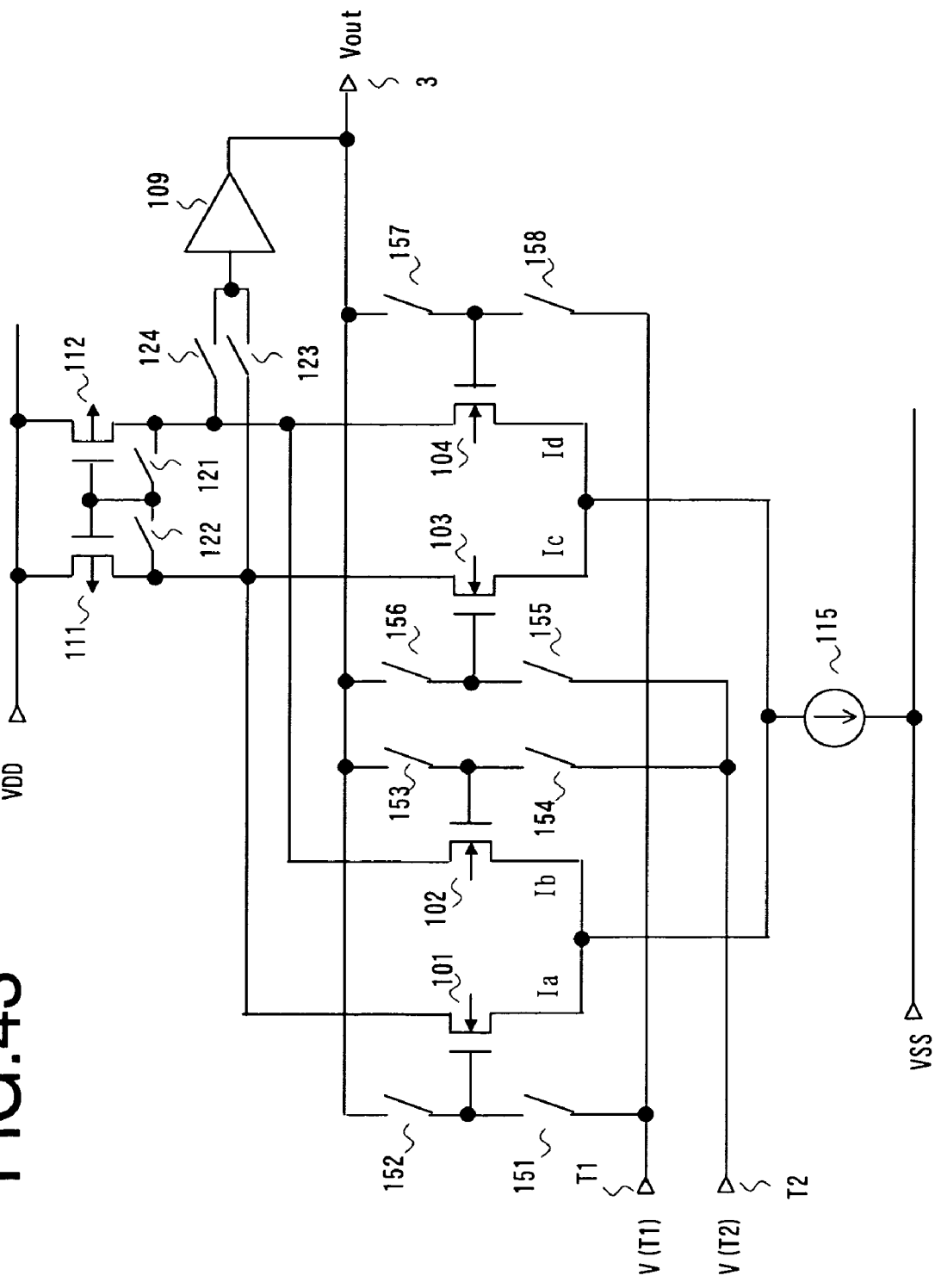
FIG. 43 is a diagram showing the configuration of a differential amplifier in which current sources 113 and 114 are replaced by a current source 115 which commonly drives differential pairs (101, 102) and (103, 104).

For comparison with the present invention, there are also shown the results of the simulation in case wherein currents supplied to two differential pairs are supplied from a common current source, such as an amplifier 85-1 shown in FIG. 36 (85-1 of FIG. 15 of Patent Document 3). FIG. 43 shows a differential amplifier in which the current sources 113 and 114 for the differential amplifier of FIG. 1 are replaced by a current source 114 which is used as a common driving unit for the differential pairs (101, 102) and (103, 104). By way of showing the results of simulation, the output offset characteristics, in the four equivalent circuits, in case only the channel widths of the transistors 104, 111 are decreased by 2%, as in FIG. 41, are shown in FIG. 44.

Figure 44:
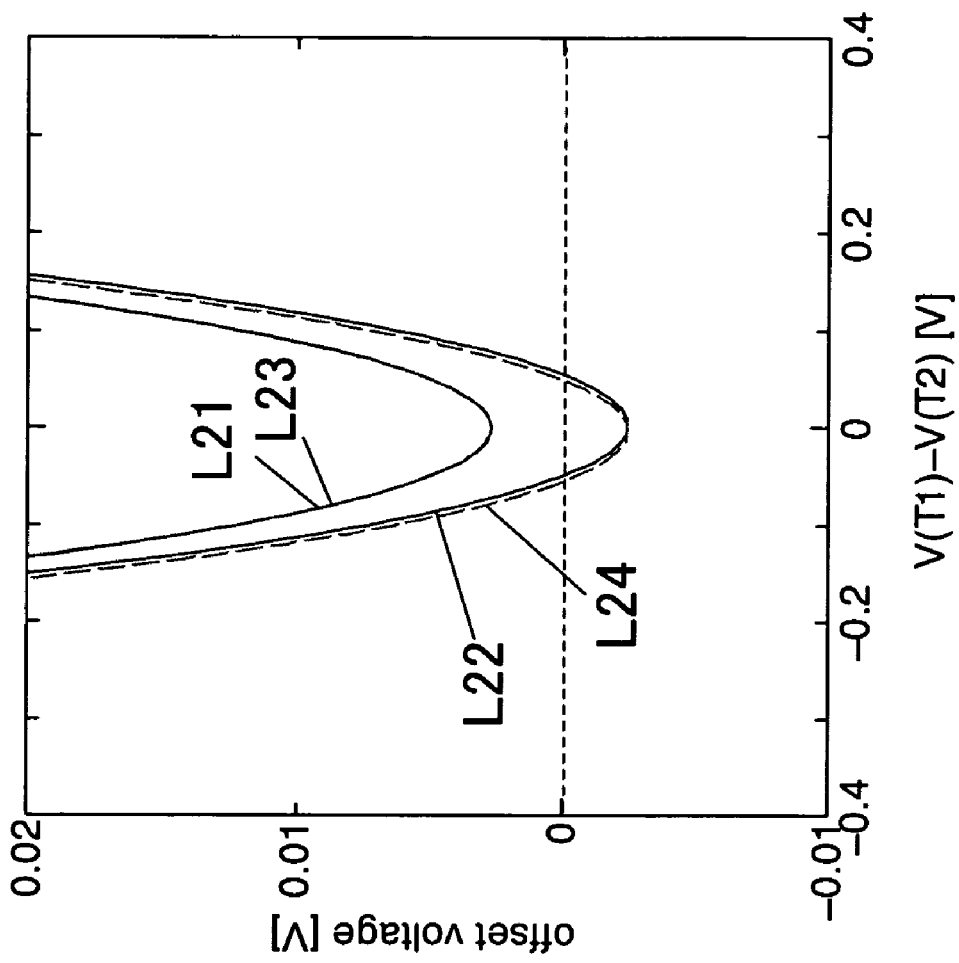
FIG. 44 is a graph showing output offset characteristics in four equivalent circuits in case the channel widths only of the transistors 104, 111 of FIG. 43 have been decreased by 2%.

The output offset characteristic curves L21, L22, L23 and L24 of FIG. 44 correspond respectively to equivalent circuits in which the current sources 113 and 114 in FIGS. 13, 14, 15 and 16 have been replaced by the sole current source 115.

The offset characteristic curves L21, L22, L23 and L24 exhibit strong dependency upon the voltage difference {V(T1)–V(T2)}. The offset is appreciably increased in the vicinity of the zero of the voltage difference {V(T1)–V(T2)}.

Meanwhile, the difference between the offset characteristic curves L21 and L23 and the offset characteristic curves L22 and L24 depends on the deviation of the input and output currents of the current mirror (111, 112).

Figure 45:
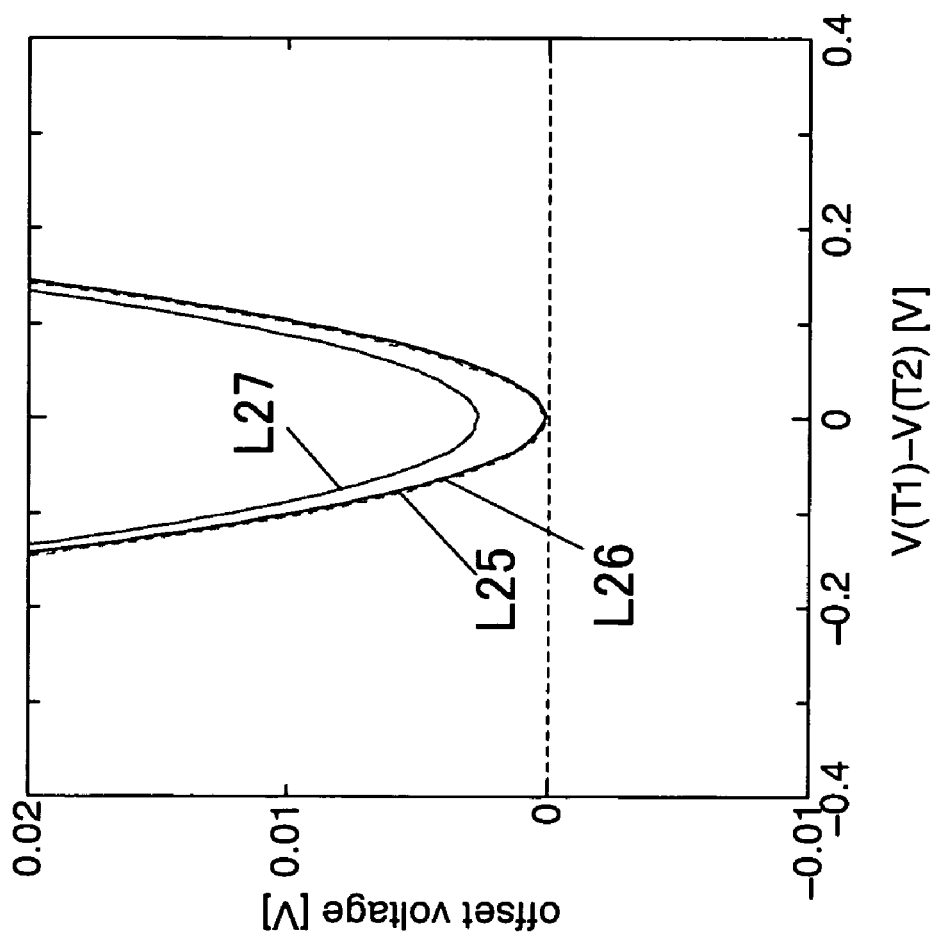
FIG. 45 is a graph showing characteristic curves for effective offsets in two equivalent circuits of FIGS. 13 to 16, the current sources 113 and 114 of which have been replaced by the current source 115, with the connection states of the circuits being changed over at preset cycles for averaging out the offset.

FIG. 45 shows characteristic curves of the effective offset when the offset has been averaged out on switching the connection of two of the equivalent circuits of FIGS. 13 to 16, in which the current sources 113 and 114 have been replaced by the current source 115.

The characteristic curve L25, obtained on averaging the characteristic curves L21 and L22, stands for the operation of the differential amplifier of FIG. 43. The characteristic curve L26 is obtained on averaging out the characteristic curves L21 and L24, while the characteristic curve L27 is obtained on averaging out the characteristic curves L21 and L23.

It is seen from FIG. 45 that, with the characteristic curves L25 and L26, the offset is suppressed to a small value in the vicinity of zero difference {V(T1)–V(T2)}, and that, with the characteristic curve L27, the offset has not been suppressed.

It is seen from above that, if the two differential pairs are driven by a common current source, and the voltage difference {V(T1)–V(T2)} is of a larger value, the output offset is increased, which is not practically desirable.

Hence, the configuration provided with current sources, independently driving two differential pairs, as shown in FIGS. 1, 3, 5 and 7, is desirable. It should be noted however that the configuration having a common current source driving two differential pairs may yield the meritorious effects, similar to those of the differential amplifiers shown in FIGS. 1 to 8, provided that the voltage difference {V(T1)–V(T2)} is in the vicinity of zero.

That is, the configuration with the common current source may safely be used for a case where there are an extremely large number of gray scale levels of a display, with the voltage difference between different gray scale levels being sufficiently small. An illustrative structure of the differential amplifier for such case is shown in FIG. 43. However, the configuration of the differential amplifiers of FIGS. 3, 5 and 7, having the current sources 113 and 114 replaced by the current source 115, may also be used.

Figure 46:
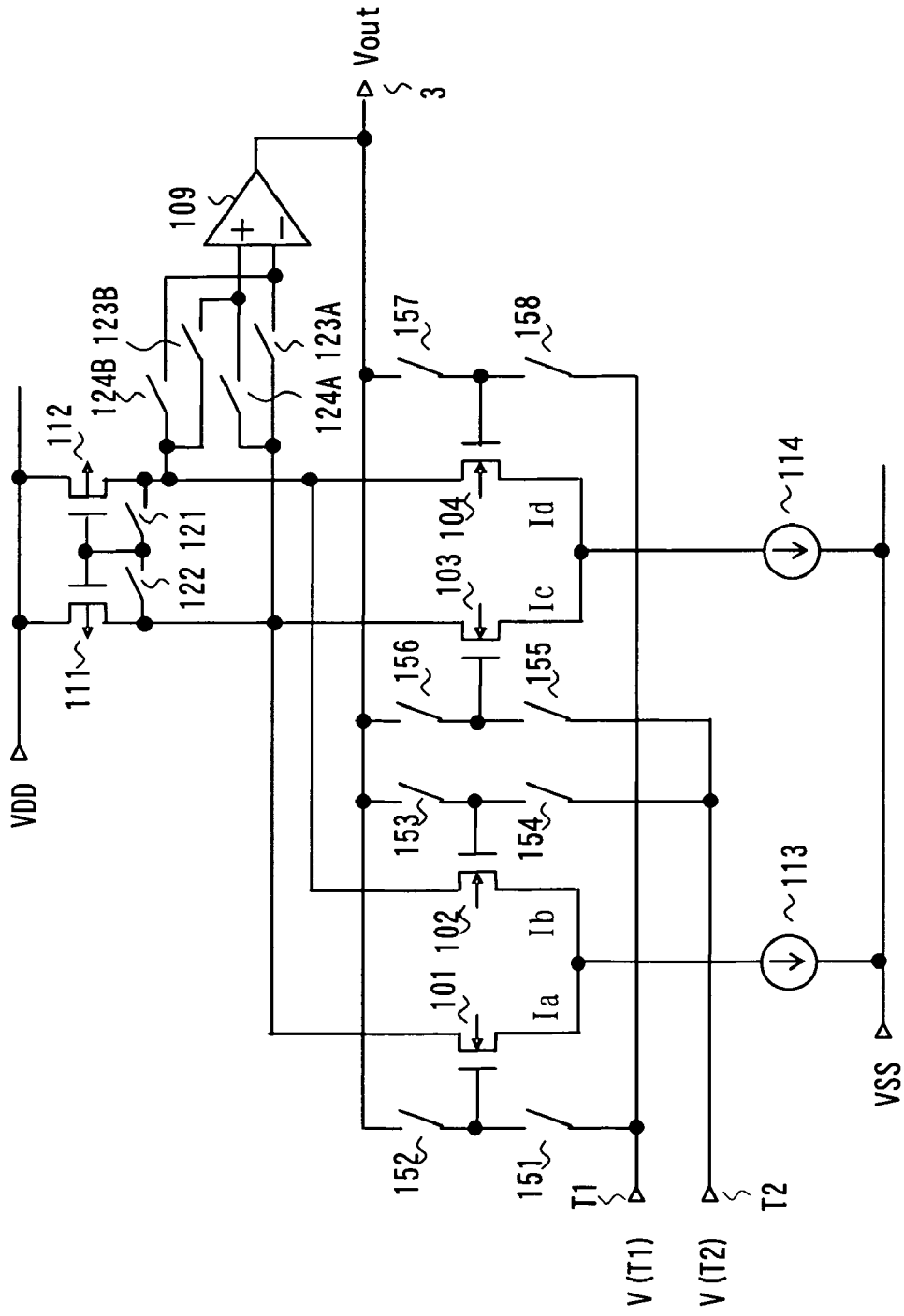
FIG. 46 is a diagram showing a modification of FIG. 1.

In the differential amplifier, shown in FIGS. 1, 3, 5, 7, 9 and 11, the amplifier stage 109 may be formed by a differential amplifier stage. FIG. 46 shows the configuration of a differential amplifier in which the amplifier stage 109 is formed by a differential amplifier stage 109. Referring to FIG. 46, the differential amplifier also includes switches 123A and 124A and switches 124B and 123B, in place of the switches 123 and 124 of FIG. 1. The switches 123A and 124A are connected between a connection node of the drains of the n-channel transistors 101 and 103 and the drain of the p-channel transistor 111 on one hand and the inverting input (–) and the non-inverting input (+) of the differential amplifier stage 109 on the other. The switches 124B and 123B are connected between a connection node of the drains of the n-channel transistors 102 and 104 and the drain of the p-channel transistor 112 on one hand and the inverting input (–) and the non-inverting input (+) of the differential amplifier stage 109 on the other. The configuration of the differential amplifier stage 109 is otherwise the same as that shown in FIG. 1.

In FIG. 46, the switches 151 to 158, 121 and 122 are controlled on or off in the same way as in FIG. 2. The switches 123A and 123B are on/off controlled in the same way as the switch 123 of FIG. 2, that is, the switches 123A and 123B are in an on state and off during the first and second time periods, respectively. The switches 124A and 124B are controlled on or off in the same way as the switch 124 of FIG. 2, that is, the switches 124A and 124B are in an off state and on during the first and second time periods, respectively. Thus, as in the differential amplifier shown in FIG. 1, the output offsets during the first and second time periods are opposite in polarity and equal in magnitude. Hence, the output offset may be canceled by periodically switching between the first and second time periods. It should be noted that, in case the differential amplifier stage 109 itself has an offset ascribable to variations in transistor characteristics, the output offset, inclusive of the offset of the differential amplifier stage 109 itself, may be canceled out in the differential amplifier stage 109 of FIG. 46. It is because the destination of connection of the inverting input (–) and the non-inverting input (+) are interchanged during the first and second time periods.

The description for the case where a data driver, exploiting the digital-to-analog converter, shown in FIG. 33, is used as an amplifier circuit of the data driver 980 for the display of FIG. 34A, will be supplemented. The connection states of the amplifier circuits 10 of the data driver 980 are controlled by the connection switching signals. In the simplest case, the connection states of all amplifier circuits 10 as a group are periodically switched between the connection state of the first time period and that of the second time period.

The amplifier circuits 10 may well be divided into plural groups, for example, two groups, so as to be controlled in a different manner from one group to the other. The diagram of FIG. 47 shows switch control for the differential amplifiers (see FIG. 33), making up the data driver 980 of FIG. 34A, in which the differential amplifiers are divided into those of the group one and for those of the group two. In FIG. 47, the amplifier circuit 10 is formed by the differential amplifier of FIG. 1, and the on/off states of the switches during the time period N and during the time period (N+1) are shown. With the differential amplifiers of the group one, control during the time period N and that during the time period (N+1) are the control during the first time period and that during the second time period, respectively. With the differential amplifiers of the group two, control during the time period N and that during the time period (N+1) are the control during the second time period and during the first time period, respectively. As for the manner of dividing the differential amplifiers into the group one and the group two, the differential amplifiers driving the odd-numbered data lines and those driving the even-numbered data lines may be those of the group one and the group two, respectively.

The meritorious effect of performing the switching control shown in FIG. 47 will be described. The data driver 980 (see FIG. 34A) is formed by integration on a mono-crystal silicon substrate or an insulating substrate, such as glass substrate. The transistors are subjected to variations in characteristics produced in the course of the semiconductor manufacturing process. The variations in transistor characteristics may be classified into local distribution and uniform distribution. It may be surmised that, in case the distribution of ions has become slightly tilted in a certain direction as a result of ion implantation into the substrate, the variations in transistor characteristics become uniform distribution, and that local distribution is produced by peculiar action in the course of the ion implantation. In particular, in case the variations in transistor characteristics are uniform distribution, a common action takes place for the amplifier circuits 10, from one connection state to the next, with the result that the amplifier circuits 10 of the same connection state are subjected to the output offset of the same positive or negative direction.

In case the connection states of all of the amplifier circuits 10 as a sole group are changed over between the connection state of the first time period and that of the second time period with the frame cycle, luminance variations of the pixels connected to the same scan line in the display employing the data driver will occur in the same direction.

In case the differential amplifiers are divided into two groups and controlled in a different manner from one group to another, it is possible with the display employing the data driver to average out the luminance variations, in a row of pixels during one driving period, because the direction of luminance variations of respective pixels, connected to the scan line, differs from one group to the other.

Hence, the control of FIG. 47 leads to improved display quality of the display. Although FIG. 47 shows a case where the differential amplifier of FIG. 1 is used as the amplifier circuit 10, the differential amplifier of FIG. 3, 5 or 7 may, of course, be used in similar manner.

Although the present invention has so far been explained with reference to the preferred embodiments, the present invention is not limited to the particular configurations of these embodiments. It will be appreciated that the present invention may encompass various changes or corrections such as may readily be arrived at by those skilled in the art within the scope and the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier comprising:
first and second terminals for receiving signals;
a third terminal for outputting a signal;
first and second differential pairs, each having an input pair and an output pair, said first and second differential pairs being supplied with currents from current sources associated therewith, respectively;
a load circuit connected to the output pairs of said first and second differential pairs;
an amplifier stage for receiving, as an input, a signal of at least one connection node of a connection node pair of said load circuit and the output pairs of said first and second differential pairs, said amplifier stage having an output connected to said third terminal; and
a connection switching circuit for controlling the switching between
a first connection state in which first and second inputs of the input pair of said first differential pair are connected to said first terminal and said third terminal, respectively, and in which first and second inputs of the input pair of said second differential pair are connected to said second terminal and said third terminal, respectively, and
a second connection state in which said first and second inputs of the input pair of said first differential pair are connected to said third terminal and said second terminal, respectively, and in which said first and second inputs of the input pair of said second differential pair are connected to said third terminal and said first terminal, respectively.

2. A differential amplifier comprising:
first and second terminals for receiving signals;
a third terminal for outputting a signal;
first and second differential pairs, each having an input pair and an output pair, said first and second differential pairs being supplied with currents from current sources associated therewith, respectively;
a load circuit connected to the output pairs of said first and second differential pairs;
an amplifier stage for receiving, as an input, a signal of at least one connection node of a connection node pair of said load circuit and the output pairs of said first and second differential pairs, said amplifier stage having an output connected to said third terminal; and
a connection switching circuit for controlling the switching between
a first connection state in which first and second inputs of the input pair of said first differential pair are connected to said first terminal and said third terminal, respectively, and in which first and second inputs of the input pair of said second differential pair are connected to said second terminal and said third terminal, respectively, and
a second connection state in which said first and second inputs of the input pair of said first differential pair are connected to said third terminal and said first terminal, respectively, and in which said first and second inputs of the input pair of said second differential pair are connected to said third terminal and said second terminal, respectively.

3. The differential amplifier according to claim 1, wherein said connection switching circuit switches, in a preset sequence, between said first and second connection states and, in addition, a third connection state and a fourth connection state,
said third connection state being such a state in which said first and second inputs of the input pair of said first differential pair are connected to said second and third terminals, respectively, and in which said first and second inputs of the input pair of said second differential pair are connected to said first and third terminals, respectively,
said fourth connection state being such a state in which said first and second inputs of the input pair of said first differential pair are connected to said third and first terminals, respectively, and in which said first and second inputs of the input pair of said second differential pair are connected to said third and second terminals, respectively.

4. The differential amplifier according to claim 1, wherein first outputs of the output pairs of said first and second differential pairs are connected to each other at a first connection node;
second outputs of the output pairs of said first and second differential pairs are connected to each other at a second connection node; and wherein
said connection switching circuit performing switching control so that, in said first connection state, said first connection node is connected, as an output end of the output pairs of said first and second differential pairs, to an input end of said amplifier stage, and so that, in said second connection state, said second connection node is connected, as an output end of the output pairs of said first and second differential pairs, to said input end of said amplifier stage.

5. The differential amplifier according to claim 1, wherein first outputs of the output pairs of said first and second differential pairs are connected to each other at a first connection node;
  second outputs of the output pairs of said first and second differential pairs are connected to each other at a second connection node;
  said amplifier stage is composed by a differential amplifier stage having an input pair; and wherein
  said connection switching circuit performs switching control so that, in said first connection state, said first and second connection nodes are connected, as output ends of the output pairs of said first and second differential pairs, to first and second inputs of the input pair of said differential amplifier stage, respectively, and so that, in said second connection state, said first and second connection nodes are connected, as output ends of the output pairs of said first and second differential pairs, to said second and first inputs of the input pair of said differential amplifier stage, respectively.

6. The differential amplifier according to claim 3, wherein first outputs of the output pairs of said first and second differential pairs are connected to each other at a first connection node;
  second outputs of the output pairs of said first and second differential pairs are connected to each other at a second connection node; and wherein
  said connection switching circuit performs switching control so that, in said first and third connection states, said first connection node is connected as an output end of the output pairs of said first and second differential pairs to an input end of said amplifier stage, and so that, in said second and fourth connection states, said second connection node is connected as an output end of the output pairs of said first and second differential pairs to said input end of said amplifier stage.

7. The differential amplifier according to claim 3, wherein first outputs of the output pairs of said first and second differential pairs are connected to each other at a first connection node;
  second outputs of the output pairs of said first and second differential pairs are connected to each other at a second connection node;
  said amplifier stage is composed by a differential amplifier stage having an input pair; and wherein
  said connection switching circuit performs switching control so that, in said first and third connection states, said first and second connection nodes are connected, as output ends of the output pairs of said first and second differential pairs, to first and second inputs of the input pair of said differential amplifier stage, respectively, and so that, in said second and fourth connection states, said first and second connection nodes are connected, as output ends of the output pairs of said first and second differential pairs, to said second and first inputs of the input pair of said differential amplifier stage, respectively.

8. The differential amplifier according to claim 1, wherein said load circuit is composed by a current mirror;
  first outputs of the output pairs of said first and second differential pairs are connected to each other at a first connection node;
  second outputs of the output pairs of said first and second differential pairs are connected to each other at a second connection node; and wherein
  said connection switching circuit performs switching control so that,
  in said first connection state, said first connection node is connected to an output of said current mirror and to the input of said amplifier stage, and said second connection node is connected to an input of said current mirror, and so that,
  in said second connection state, said first connection node is connected to the input of said current mirror and said second connection node is connected to the output of said current mirror and to the input of said amplifier stage.

9. The differential amplifier according to claim 3, wherein said load circuit is composed by a current mirror;
  first outputs of the output pairs of said first and second differential pairs are connected to each other at a first connection node;
  second outputs of the output pairs of said first and second differential pairs are connected to each other at a second connection node; and wherein
  said connection switching circuit performs switching control so that, in said first and third connection states, said first connection node is connected to an output of said current mirror and to the input of said amplifier stage, and said second connection node is connected to an input of said current mirror, and so that,
  in said second and fourth connection states, said first connection node is connected to the input of said current mirror and said second connection node is connected to the output of said current mirror and to the input of said amplifier stage.

10. A differential amplifier comprising:
  first and second terminals receiving two signal voltages;
  a third terminal outputting an output signal;
  first and second differential pairs, each having an input pair and output pair, said first and second differential pairs being driven by first and second current sources having one ends connected to a first power supply;
  a current to voltage converter connected between the output pairs of said first and second differential pairs and a second power supply, said current to voltage converter combining output currents flowing through said first and second differential pairs and outputting a voltage based on the currents combined;
  an amplifier circuit connected between an output end of said current to voltage converter and said third terminal; and
  a connection switching circuit for switching between
    a first connection state in which first and second inputs of the input pair of said first differential pair are connected to said first terminal and said third terminal, respectively, and in which first and second inputs of the input pair of said second differential pair are connected to said second terminal and said third terminal, respectively, and
    a second connection state in which said first and second inputs of the input pair of said first differential pair are connected to said third terminal and said second terminal, respectively, and in which said first and second inputs of the input pair of said second differential pair are connected to said third terminal and said first terminal, respectively.

11. The differential amplifier according to claim 10, wherein said connection switching circuit includes:
  first and second switches connected between said first input of the input pair of said first differential pair and said first terminal and between said first input and said third terminal, respectively;
  third and fourth switches connected between said second input of the input pair of said first differential pair and said third terminal and between said second input and said second terminal, respectively;

fifth and sixth switches connected between said first input of the input pair of said second differential pair and said second terminal and between said first input and said third terminal, respectively; and seventh and eighth switches connected between said second input of the input pair of said second differential pair and said third terminal and between said second input and said first terminal, respectively.

12. A differential amplifier comprising:

first and second terminals receiving two signal voltages;

a third terminal outputting an output signal;

first and second differential pairs, each having an input pair and output pair, said first and second differential pairs being driven by first and second current sources having one ends connected to a first power supply;

a current to voltage converter connected between the output pairs of said first and second differential pairs and a second power supply, said current to voltage converter combining output currents flowing through said first and second differential pairs and outputting a voltage based on the currents combined;

an amplifier circuit connected between an output end of said current to voltage converter and said third terminal; and a connection switching circuit for switching between a first connection state in which first and second inputs of the input pair of said first differential pair are connected to said first terminal and to said third terminal, respectively, and in which first and second inputs of the input pair of said second differential pair are connected to said second terminal and said third terminal, respectively, and a second connection state in which said first and second inputs of the input pair of said first differential pair are connected to said third terminal and to said first terminal, respectively, and in which said first and second inputs of the input pair of said second differential pair are connected to said third terminal and said second terminal, respectively.

13. The differential amplifier according to claim 12, wherein said connection switching circuit includes:

first and second switches connected between said first input of the input pair of said first differential pair and said first terminal and between said first input and said third terminal, respectively;

third and fourth switches connected between said second input of the input pair of said first differential pair and said third terminal and between said second input and said first terminal, respectively;

fifth and sixth switches connected between said first input of the input pair of said second differential pair and said second terminal and between said first input and said third terminal, respectively;

seventh and eighth switches connected between said second input of the input pair of said second differential pair and said third terminal and between said second input and said second terminal, respectively.

14. The differential amplifier according to claim 1, further comprising an input switching circuit for switching between two signal voltages supplied to said first and second terminals.

15. A data driver for driving a data line based on an input digital data signal, wherein the data driver includes a differential amplifier as set fourth in claim 1.

16. The data driver according to claim 15, comprising:

a plurality of said differential amplifiers driving a plurality of said data lines, and a connection switching signal for controlling each of the connection switching circuits of said differential amplifiers; wherein said differential amplifiers are divided into first and second groups; and wherein when said first group of said differential amplifiers is controlled to said first connection state, said connection switching signal controls said second group of said differential amplifiers to said second connection state; and wherein when said first group of said differential amplifiers is controlled to said second connection state, said connection switching signal controls said second group of said differential amplifiers to said first connection state.

17. A display comprising:

a data driver inclusive of said differential amplifier as set fourth in claim 1; and a display panel; wherein a data line of said display panel is driven based on an output signal of said data driver.

18. A display comprising:

a plurality of data lines extending parallel to one another in one direction;

a plurality of scan lines extending parallel to one another in a direction orthogonal to said one direction;

a plurality of pixel electrodes arranged in a matrix pattern at points of intersection of said data lines and said scan lines;

a plurality of transistors provided in a one-for-one relationship with respect to said plural pixel electrodes so that first ends of the drains and sources of the transistors are connected to the pixel electrodes and second ends of the drains and sources of the transistors are connected to said data lines associated therewith, with the gates of the transistors being connected to said scan lines;

a gate driver for supplying scan signals to said scan lines; and a data driver for supplying gray-scale signals, associated with input data, to said data lines;

said data driver being a data driver of the display as set fourth in claim 15.

19. A differential amplifier comprising first and second signals;

an output terminal for outputting an output signal;

first and second differential pairs, each having an input pair and an output pair, said first and second differential pairs being supplied with currents from current sources associated therewith, respectively;

a load circuit connected to the output pairs of said first and second differential pairs;

an amplifier stage receiving, as an input, a signal at least in a connection node of a connection node pair of said load circuit and the output pairs of said first and second differential pairs, said amplifier stage having an output end connected to said output terminal; and a switching circuit for controlling the switching between a first state in which said first signal and said output signal are coupled to first and second inputs of the input pair of said first differential pair and in which said second signal and said output signal are coupled to first and second inputs of the input pair of said second differential pair, and a second state in which said output signal and said second signal are coupled to said first and second inputs of the input pair of said first differential pair and in which said output signal and said first signal are coupled to said first and second inputs of the input pair of said second differential pair.

20. A differential amplifier comprising
first and second signals;
an output terminal for outputting an output signal;
first and second differential pairs, each having an input pair and an output pair, said first and second differential pairs being supplied with currents from current sources associated therewith, respectively;
a load circuit connected to the output pairs of said first and second differential pairs;
an amplifier stage receiving, as an input, a signal at least in a connection node of a connection node pair of said load circuit and the output pairs of said first and second differential pairs, said amplifier stage having an output end connected to said output terminal; and
a switching circuit for controlling the switching between
a first state in which said first signal and said output signal are coupled to first and second inputs of the input pair of said first differential pair and in which said second signal and said output signal are coupled to first and second inputs of the input pair of said second differential pair, and
a second state in which said output signal and said first signal are coupled to said first and second inputs of the input pair of said first differential pair and in which said output signal and said second signal are coupled to said first and second inputs of the input pair of said second differential pair.

21. A differential amplifier comprising:
an output terminal for outputting an output signal; first and second differential pairs, each having an input pair and an output pair, said first and second differential pairs being each driven by a current source associated therewith, respectively;
a load circuit connected to each of the output pairs of said first and second differential pairs;
an amplifier stage for receiving, as an input, a signal of at least one connection node of a connection node pair of said load circuit and the output pairs of said first and second differential pairs, said amplifier stage having an output connected to said output terminal; and
a connection switching circuit for controlling the switching between
a first connection state in which first and second inputs of the input pair of said first differential pair receives a first signal and said output signal, respectively, and in which first and second inputs of the input pair of said second differential pair receive a second signal and said output signal, respectively, and
a second connection state in which said first and second inputs of the input pair of said first differential pair receives said output signal and said second signal, respectively, and in which said first and second inputs of the input pair of said second differential pair receive said output signal and said first signal, respectively.

22. A differential amplifier comprising:
an output terminal for outputting an output signal;
first and second differential pairs, each having an input pair and an output pair, said first and second differential pairs being each driven by a current from current sources associated therewith, respectively;
a load circuit connected to each of the output pairs of said first and second differential pairs;
an amplifier stage for receiving, as an input, a signal of at least one connection node of a connection node pair of said load circuit and the output pairs of said first and second differential pairs, said amplifier stage having an output connected to said output terminal; and
a connection switching circuit for controlling the switching between
a first connection state in which first and second inputs of the input pair of said first differential pair receive a first signal and said output signal, respectively, and in which first and second inputs of the input pair of said second differential pair receive a second signal and said output signal, respectively, and
a second connection state in which said first and second inputs of the input pair of said first differential pair receive said output signal and said first signal, respectively, and in which said first and second inputs of the input pair of said second differential pair receive said output signal and said second signal, respectively.

* * * * *